United States Patent
Augusto

(10) Patent No.: US 9,917,155 B2
(45) Date of Patent: Mar. 13, 2018

(54) SUPERLATTICE MATERIALS AND APPLICATIONS

(71) Applicant: Quantum Semiconductor LLC, San Jose, CA (US)

(72) Inventor: Carlos Jorge R. P. Augusto, San Jose, CA (US)

(73) Assignee: Quantum Semiconductors LLC, San Jose, CA (US)

( * ) Notice: Subject to any disclaimer, the term of this patent is extended or adjusted under 35 U.S.C. 154(b) by 0 days.

(21) Appl. No.: 15/472,229

(22) Filed: Mar. 28, 2017

(65) Prior Publication Data

US 2017/0207304 A1 Jul. 20, 2017

Related U.S. Application Data

(63) Continuation of application No. 15/072,145, filed on Mar. 16, 2016, now Pat. No. 9,640,616, which is a continuation of application No. PCT/US2014/057066, filed on Sep. 23, 2014.

(60) Provisional application No. 61/895,971, filed on Oct. 25, 2013, provisional application No. 61/881,378, filed on Sep. 23, 2013, provisional application No. 62/006,182, filed on Jun. 1, 2014.

(51) Int. Cl.
| | |
|---|---|
| H01L 29/06 | (2006.01) |
| H01L 31/0328 | (2006.01) |
| H01L 21/00 | (2006.01) |
| H01L 29/15 | (2006.01) |
| H01L 29/165 | (2006.01) |
| H01L 29/04 | (2006.01) |
| H01L 27/12 | (2006.01) |

(52) U.S. Cl.
CPC ........ *H01L 29/155* (2013.01); *H01L 27/1203* (2013.01); *H01L 29/045* (2013.01); *H01L 29/165* (2013.01)

(58) Field of Classification Search
CPC ......... H01L 21/02378; H01L 21/02507; H01L 31/035236; H01L 33/04; H01L 33/06; H01L 33/34; H01S 5/3216; H01S 5/34
See application file for complete search history.

(56) References Cited

U.S. PATENT DOCUMENTS

| | | |
|---|---|---|
| 5,073,893 A | 12/1991 | Kondou |
| 8,120,079 B2 | 2/2012 | Augusto |

(Continued)

OTHER PUBLICATIONS

Baharlou, Simin, International Preliminary Report on Patentability and Written Opinion, PCT/US2014/057066, The International Bureau of WIPO, dated Apr. 7, 2016.

(Continued)

*Primary Examiner* — Hsien Ming Lee
(74) *Attorney, Agent, or Firm* — Gavrilovich, Dodd & Lindsey, LLP

(57) ABSTRACT

A superlattice cell that includes Group IV elements is repeated multiple times so as to form the superlattice. Each superlattice cell has multiple ordered atomic planes that are parallel to one another. At least two of the atomic planes in the superlattice cell have different chemical compositions. One or more of the atomic planes in the superlattice cell one or more components selected from the group consisting of carbon, tin, and lead. These superlattices make a variety of applications including, but not limited to, transistors, light sensors, and light sources.

20 Claims, 47 Drawing Sheets

(56) References Cited

U.S. PATENT DOCUMENTS

| | | |
|---|---|---|
| 8,791,450 B2 | 7/2014 | Shur et al. |
| 8,816,366 B2 | 8/2014 | Takizawa et al. |
| 9,012,891 B2 * | 4/2015 | Sung .................. H01L 51/0003 257/40 |
| 2008/0001139 A1 | 1/2008 | Augusto |
| 2012/0090672 A1 | 4/2012 | Lebby et al. |
| 2015/0069327 A1 | 3/2015 | Cheng et al. |

OTHER PUBLICATIONS

Eberl et al., "Pseudomorphic Si1—yCy and Si1—x—yGexCy alloy layers on Si," Thin Solid Films, pp. 98-104, vol. 294, 1997.
Thomas, Shane, International Search Report and Written Opinion, PCT/US2014/057066, United States Patent and Trademark Office, dated Mar. 3, 2015.

* cited by examiner

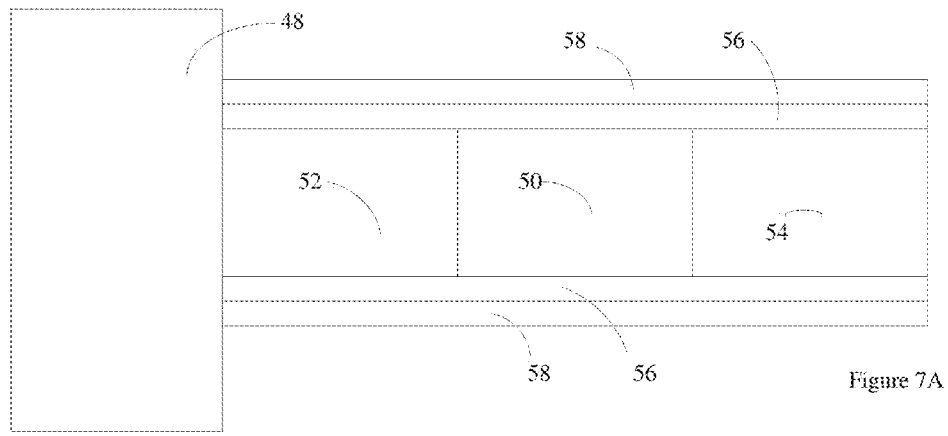
Figure 7A
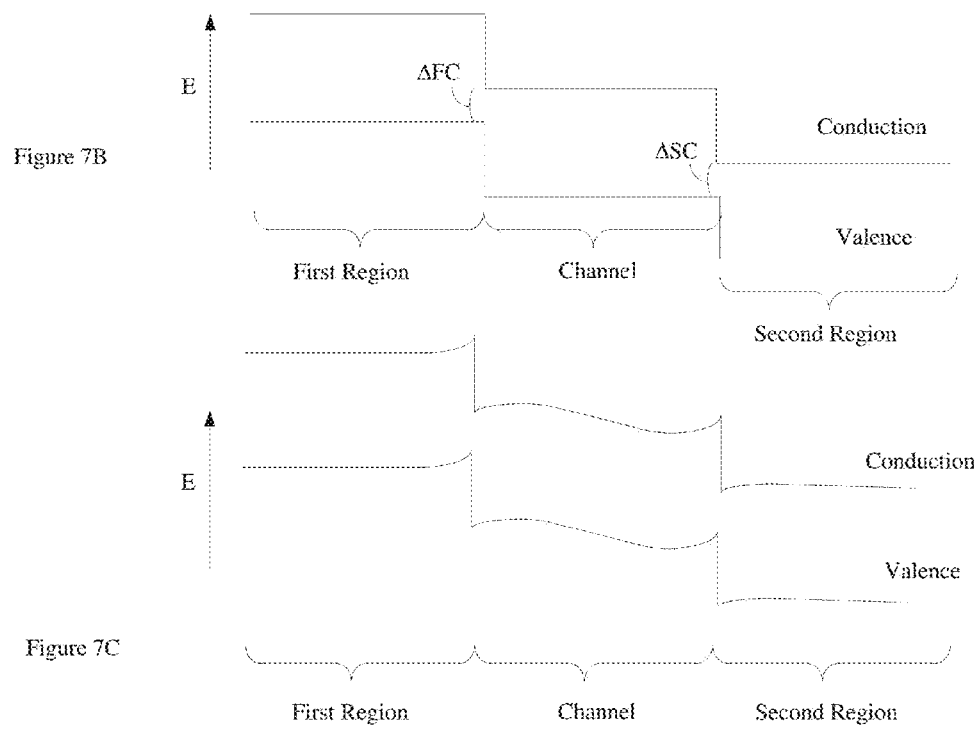
Figure 7B
Figure 7C

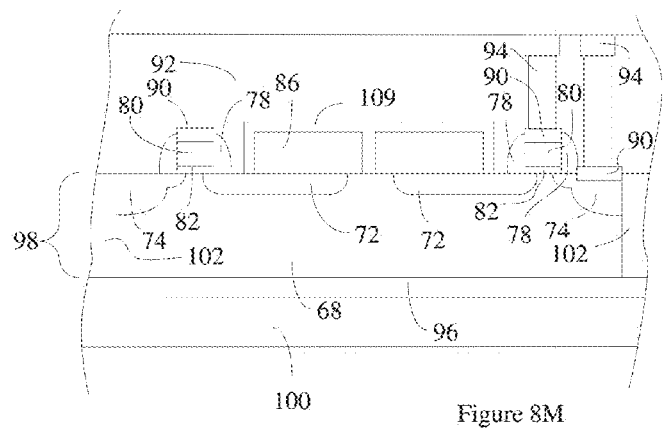
Figure 8M
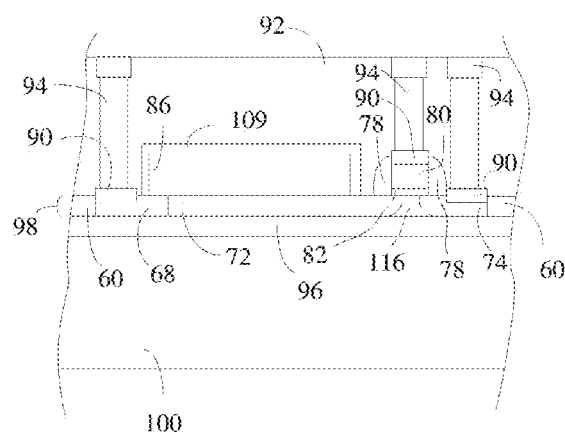
Figure 8N
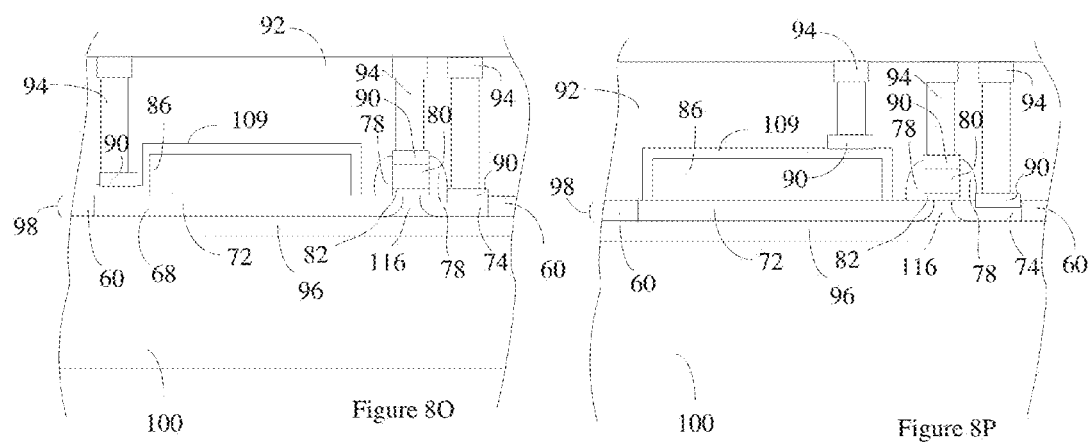
Figure 8O
Figure 8P

SUPERLATTICE MATERIALS AND APPLICATIONS

RELATED APPLICATIONS

This Application is a continuation of U.S. patent application Ser. No. 15/072,145, filed on Mar. 16, 2016, and entitled "Superlattice Materials and Applications;" U.S. patent application Ser. No. 15/072,145 is a continuation of International Application PCT/US2014/057066, with an international filing date of Sep. 23, 2014, entitled "Superlattice Materials and Applications;" International Application PCT/US2014/057066 claims the benefit of U.S. Provisional Patent application Ser. No. 61/881,378, filed on Sep. 23, 2013, entitled "Superlattice Materials;" and International Application PCT/US2014/057066 also claims the benefit of U.S. Provisional Patent Application Ser. No. 61/895,971, filed on Oct. 25, 2013, entitled "Superlattice Materials and Applications;" and International Application PCT/US2014/057066 also claims the benefit of U.S. Provisional Patent Application Ser. No. 62/006,182, filed on Jun. 1, 2014, entitled "Superlattice Materials and Applications;" each of which is incorporated herein in its entirety.

FIELD

The present invention relates to semiconductors, and more particularly, to superlattices.

BACKGROUND

Semiconductors are used in variety of applications such as transistors, the gain medium of semiconductor lasers, and the light-absorbing medium of light sensors. The bandgap of these semiconductors often affects the performance of these applications. For instance, the wavelength output by a semiconductor laser is a function of the bandgap of the gain medium. The wavelength detected by light sensors can be a function of the bandgap of the light-absorbing medium. A variety of transistor characteristics such as speed can be a function of semiconductor band structures. The limited number of semiconductors that are available results in a limited number of band structures for use in these applications. The performance and versatility of these applications can be enhanced by increasing the number of band structure options that are available to these applications.

SUMMARY

In some instances, a superlattice cell is repeated multiple times so as to form the superlattice. Each superlattice cell has multiple ordered atomic planes that are parallel to one another. At least two of the atomic planes in the superlattice cell have different chemical compositions. One or more of the atomic planes in the superlattice cell includes carbon.

In some instances, a superlattice cell is repeated multiple times so as to form the superlattice. Each superlattice cell has multiple atomic planes that are parallel to one another. At least two of the atomic planes in the superlattice cell have different chemical compositions and one or more of the atomic planes in the superlattice cell include carbon. One or more of the one or more atomic planes that include carbon each also includes 10% or more of substitutional carbon.

In some instances, a superlattice cell is repeated multiple times so as to form the superlattice. Each superlattice cell has multiple atomic planes that are parallel to one another. At least two of the atomic planes in the superlattice cell have different chemical compositions. One or more of the atomic planes in the superlattice cell includes carbon. The superlattice cell including a total number of atomic planes that is less than or equal to 40.

In some instances, a superlattice cell is repeated multiple times so as to form the superlattice. Each superlattice cell has multiple atomic planes that are parallel to one another. At least two of the atomic planes in the superlattice cell have different chemical compositions. One or more of the atomic planes in the superlattice cell include tin.

In some instances, a superlattice cell is repeated multiple times so as to form the superlattice. Each superlattice cell has multiple atomic planes that are parallel to one another. At least two of the atomic planes in the superlattice cell have different chemical compositions. One or more of the atomic planes in the superlattice cell include lead.

In some instances, a superlattice cell is repeated multiple times so as to form a superlattice. Each superlattice cell has multiple atomic planes that are parallel to one another. At least one of the atomic planes has the chemical composition for a material that has a valence band maximum at the Z point (and/or its equivalent Y) of the Brillouin Zone. For instance, at least one of the atomic planes has the chemical composition for a material that has a valence band maximum at a point of the Brillouin Zone selected from the group consisting of the Z point and the Y point. In one example, the at least one atomic plane has a chemical composition represented by $Si_2Sn_2C$.

In some instances, a superlattice cell is repeated multiple times so as to form a superlattice. Each superlattice cell has multiple atomic planes that are parallel to one another. The superlattice has a conduction band minimum at the K or K' point of the Brillouin Zone. In some instances, the superlattice is represented by $(Si_5)_4$—$(Si_4C)_4$.

In some instances, one or more atomic planes included in the superlattice is an ordered atomic plane that has a chemical composition selected from a group consisting of $Si_4C$, $Ge_4C$, $Sn_4C$, $Si_4Ge$, $Ge_4Si$, $Si_6C_2$, $Ge_6C_2$, $Sn_6C_2$, $SiGe_3C$, $Si_2Ge_2C$, $Si_3GeC$, $SiSn_3C$, $Si_2Sn_2C$, $Si_3SnC$, $GeSn_3C$, $Ge_2Sn_2C$ and $Ge_3SnC$. In some instances, one or more atomic planes included in the superlattice is not ordered and has a chemical composition selected from a group consisting of $Si_{1-x}Ge_x$ where x is greater than or equal to 0 and/or less than or equal to 1, $Si_{1-y}C_y$ where y is greater than or equal to 0 or 0.1 and/or less than or equal to 0.25, $Si_{1-x-y}Ge_xC_y$ where x is greater than or equal to 0 or 0.1 and/or less than or equal to 1 and y is greater than or equal to 0 or 0.01 and/or less than or equal to 0.25, $Si_{1-z}Sn_z$ where z is greater than or equal to 0 or 0.01 and/or less than or equal to 0.1, $Ge_{1-z}Sn_z$ where z is greater than or equal to 0 or 0.01 and/or less than or equal to 0.05, $C_{1-z}Sn_z$ where z is greater than or equal to zero and/or less than 1 and in one example z is 0.20 or 0.25, $Si_{1-x-z}Ge_xSn_z$ where x is greater than or equal to 0 or 0.1 and/or less than or equal to 1 and z is greater than or equal to 0 or 0.01 and/or less than or equal to 0.1, $Si_{1-y-z}C_ySn_z$ where y is greater than or equal to 0 or 0.01 and/or less than or equal to 0.25 and z is greater than or equal to 0 or 0.01 and/or less than or equal to 0.25, $Ge_{1-y-z}C_ySn_z$ where y is greater than or equal to 0 or 0.01 and/or less than or equal to 0.25 and z is greater than or equal to 0 or 0.01 and/or less than or equal to 0.25, $Si_{1-x-y-z}Ge_xC_ySn_z$ where x is greater than or equal to 0 or 0.1 and/or less than or equal to 1 and y is greater than or equal to 0 or 0.01 and/or less than or equal to 0.25 and z is greater than or equal to 0 or 0.01 and/or less than or equal to 0.25, $Si_{1-x}Pb_x$ where x is greater than or equal to 0.001 or 0.01 and/or less than or equal to 0.1, $Si_{1-x-y}Pb_xC_y$ where x is greater than or equal to 0.001 or 0.01 and/or less than or equal to 0.1 and y is greater than or equal to 0.001 or 0.01 and/or less than or equal to 0.25, $Si_{1-x-y-z}Pb_xC_yGe_z$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95, $Si_{1-x-y-z-t}Pb_xC_yGe_zSn_t$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95 and t is greater than or equal to 0.001 or 0.01 and/or less than or equal to 0.25, $Ge_{1-x}Pb_x$ where x is greater than or equal to 0.001 or 0.01 and/or less than or equal to 0.1, $Ge_{1-x-y}Pb_xC_y$ where x is greater than or equal to 0.001 or 0.01 and/or less than or equal to 0.1 and y is greater than or equal to 0.001 or 0.01 and/or less than or equal to 0.25, $Ge_{1-x-y-z}Pb_xC_ySn_z$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.25.

In some instances, one or more of the one or more atomic planes that include carbon is ordered and has a chemical composition selected from a group consisting of $Si_4C$, $Ge_4C$, $Sn_4C$, $Si_6C_2$, $Ge_6C_2$, $Sn_6C_2$, $SiGe_3C$, $Si_2Ge_2C$, $Si_3GeC$, $SiSn_3C$, $Si_2Sn_2C$, $Si_3SnC$, $GeSn_3C$, $Ge_2Sn_2C$ and $Ge_3SnC$. In some instances, one or more atomic planes that include carbon is not ordered and has a chemical composition selected from a group consisting of $Si_{1-y}C_y$ where y is greater than 0 or 0.1 and/or less than or equal to 0.25, $Si_{1-x-y}Ge_xC_y$ where x is greater than or equal to 0 or 0.1 and/or less than or equal to 1 and y is greater than 0 or 0.01 and/or less than or equal to 0.25, $C_{1-z}Sn_z$ where z is greater than or equal to zero and less than 1 and in one example z is 0.20 or 0.25, $Si_{1-y-z}C_ySn_z$ where y is greater than 0 or 0.01 and/or less than or equal to 0.25 and z is greater than or equal to 0 or 0.01 and/or less than or equal to 0.25, $Ge_{1-y-z}C_ySn_z$ where y is greater than 0 or 0.01 and/or less than or equal to 0.25 and z is greater than or equal to 0 or 0.01 and/or less than or equal to 0.25, and $Si_{1-x-y-z}Ge_xC_ySn_z$ where x is greater than or equal to 0 or 0.1 and/or less than or equal to 1 and y is greater than or equal to 0 or 0.01 and/or less than or equal to 0.25 and z is greater than or equal to 0 or 0.01 and/or less than or equal to 0.25, $Si_{1-x-y}Pb_xC_y$ where x is greater than or equal to 0.001 or 0.01 and/or less than or equal to 0.1 and y is greater than or equal to 0.001 or 0.01 and/or less than or equal to 0.25, $Si_{1-x-y-z}Pb_xC_yGe_z$ where x is greater than or equal to 0.001 or 0.01 and/or less than or equal to 0.1 and y is greater than 0 or greater than or equal to 0.001 or 0.01 and/or less than or equal to 0.25 and z is greater than or equal to 0.001 or 0.01 and/or less than or equal to 0.85 or 0.95, $Si_{1-x-y-z-t}Pb_xC_yGe_zSn_t$ where x is greater than or equal to 0.001 or 0.01 and/or less than or equal to 0.1 and y is greater than 0 or greater than or equal to 0.001 or 0.01 and/or less than or equal to 0.25 and z is greater than or equal to 0.001 or 0.01 and/or less than or equal to 0.85 or 0.95 and t is greater than or equal to 0.001 or 0.01 and/or less than or equal to 0.25, $Ge_{1-x-y}Pb_xC_y$ where x is greater than or equal to 0.001 or 0.01 and/or less than or equal to 0.1 and y is greater than or equal to 0.001 or 0.01 and/or less than or equal to 0.25, $Ge_{1-x-y-z}Pb_xC_ySn_z$ where x is greater than or equal to 0.001 or 0.01 and/or less than or equal to 0.1 and y is greater than 0 or greater than or equal to 0.001 or 0.01 and/or less than or equal to 0.25 and z is greater than or equal to 0.001 or 0.01 and/or less than or equal to 0.25.

In some instances, one or more of the one or more atomic planes that include tin each is ordered and has a chemical composition selected from a group consisting of $Sn_4C$, $Sn_6C_2$, $SiSn_3C$, $Si_2Sn_2C$, $Si_3SnC$, $GeSn_3C$, $Ge_2Sn_2C$, and $Ge_3SnC$. In some instances, one or more of the one or more atomic planes that include tin is not ordered and has a chemical composition selected from a group consisting of $Si_{1-z}Sn_z$ where z is greater than 0 or 0.01 and/or less than or equal to 0.1, $Ge_{1-z}Sn_z$ where z is greater than 0 or 0.01 and/or less than or equal to 0.05, $C_{1-z}Sn_z$ where z is greater than zero and/or less than 1 and in one example z is 0.20 or 0.25, $Si_{1-x-z}Ge_xSn_z$ where x is greater than or equal to 0 or 0.1 and/or less than or equal to 1 and z is greater than 0 or 0.01 and/or less than or equal to 0.1, $Si_{1-y-z}C_ySn_z$ where y is greater than or equal to 0 or 0.01 and/or less than or equal to 0.25 and z is greater than 0 or 0.01 and/or less than or equal to 0.25, $Ge_{1-y-z}C_ySn_z$ where y is greater than or equal to 0 or 0.01 and/or less than or equal to 0.25 and z is greater than 0 or 0.01 and/or less than or equal to 0.25, $Si_{1-x-y-z}Ge_xC_ySn_z$ where x is greater than or equal to 0 or 0.1 and/or less than or equal to 1 and y is greater than or equal to 0 or 0.01 and/or less than or equal to 0.25 and z is greater than 0 or 0.01 and/or less than or equal to 0.25, $Si_{1-x-y-z-t}Pb_xC_yGe_zSn_t$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95 and t is greater than 0 or greater than or equal to 0.001 or 0.01 and/or less than or equal to 0.25, and $Si_{1-x-y-z-t}Pb_xC_yGe_zSn_t$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95 and t is greater than 0 or greater than or equal to 0.001 or 0.01 and/or less than or equal to 0.25, and $Ge_{1-x-y-z}Pb_xC_ySn_z$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.25.

In some instances, one or more of the one or more atomic planes that include lead is not ordered and has a chemical composition selected from a group consisting of $Si_{1-x}Pb_x$ where x is greater than 0 or greater than or equal to 0.001 or 0.01 and/or less than or equal to 0.1, $Si_{1-x-y}Pb_xC_y$ where x is greater than 0 or greater than or equal to 0.001 or 0.01 and/or less than or equal to 0.1 and y is greater than or equal to 0.001 or 0.01 and/or less than or equal to 0.25, $Si_{1-x-y-z}Pb_xC_yGe_z$ where x is greater 0 or greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95, $Si_{1-x-y-z-t}Pb_xC_yGe_zSn_t$ where x is greater than 0 or greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95 and t is greater than or equal to 0.001 or 0.01 and/or less than or equal to 0.25, $Ge_{1-x}Pb_x$ where x is greater than 0 or greater than or equal to 0.001 or 0.01 and/or less than or equal to 0.1, $Ge_{1-x-y}Pb_xC_y$ where x is greater than 0 or greater than or equal to 0.001 or 0.01 and/or less than or equal to 0.1 and y is greater than or equal to 0.001 or 0.01 and/or less than or equal to 0.25, $Ge_{1-x-y-z}Pb_xC_ySn_z$ where x is greater than 0 or greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.25.

In some instances, a method of forming a superlattice system includes providing a substrate having different crystal faces on a surface. The method can also include concurrently growing multiple different superlattices on the substrate such that different superlattices are on different crystal faces but the different superlattices have the same chemical composition. The superlattices and/or superlattice systems can be included in a variety of devices. For instance, a device includes a transistor having a collector, emitter and a base arranged such that charges flow between the collector and the emitter through the base during operation of the transistor. The base includes or consists of one or more of the superlattice.

Another device includes a transistor having regions that include a source, drain, and channel arranged such that charges flow between the source and drain through the channel. One or more of the regions each includes or consists of one or more of the disclosed superlattices.

Another device includes a Complementary Unipolar Tunneling Transistor that can be operated either as an n-type tunneling transistor or as a p-type tunneling transistor depending on a bias applied to the Complementary Unipolar Tunnel Transistor. The Complementary Unipolar Tunneling Transistor has components that include a channel, first region, and second region arranged such that charges flow between the first region and the second region through the channel. One or more of the components each includes or consists of one or more of the disclosed superlattices.

Another device includes a light sensor having a light-absorbing layer. The light-absorbing layer includes or consists of one or more of the disclosed superlattices.

Another device includes a light source having an active layer in which light signals are generated. The active layer includes or consists of one or more of the disclosed superlattices.

BRIEF DESCRIPTION OF THE FIGURES

FIG. 7A is a cross section of a Complementary Unipolar Tunnel MOSFET (CUTMOS).

FIG. 7B illustrates qualitative band alignments for the CUTMOS of FIG. 7A.

FIG. 7C illustrates qualitative band alignments for the CUTMOS of FIG. 7A where Fermi levels are evident.

FIG. 7H shows the band alignments for the bias conditions at which VDS (voltage of drain minus voltage of source) for T-NMOS is <0, and VDS for T-PMOS>0 and the electronics do not apply electrical energy to the gate electrode.

FIG. 7I shows the band alignments for the bias conditions at which VDS for T-NMOS is >0, and VDS for T-PMOS<0 and the electronics do not apply electrical energy to the gate electrode.

FIG. 7J shows the band alignments for the bias conditions at which VDS for T-NMOS is >0 and VGS (voltage at gate minus voltage at source) for T-NMOS is >0.

FIG. 7K shows the band alignments for the bias conditions at which VDS for T-NMOS is =0, and VGS for T-NMOS is >0.

FIG. 7L shows the band alignments for the bias conditions at which VDS for T-PMOS is <0, and VGS for T-PMOS is also <0.

FIG. 7M shows the band alignments for the CUT-MOS for the bias conditions at which VDS for T-PMOS is =0, and VGS for T-PMOS is <0.

FIG. 7Q shows the band alignment for a system according to FIG. 7N or FIG. 7O where electronics have biased the inverter such that the second CUTMOS transistor is OFF and the first CUTMOS transistor 61 is ON.

FIG. 8M shows the device of FIG. 8H built on a Silicon-On-Insulator (SOI) wafer.

FIG. 8N through FIG. 8R illustrate the devices of FIG. 8D through FIG. 8M constructed on a Thin-Film SOI platform. FIG. 8N illustrates the device of FIG. 8D or FIG. 8J built on a thin-film platforms or on an ultra-thin-film platform.

FIG. 8O shows a modification of the device of FIG. 8N.

FIG. 8P illustrates the device of FIG. 8E or FIG. 8K built on a Thin-Film SOI platform or on an Ultra-Thin-Film SOI platform.

FIG. 8Q illustrates the device of FIG. 8F and FIG. 8G or the device of FIG. 8L built on the Thin-Film SOI platform or on an Ultra-Thin-Film SOI platform.

FIG. 8R is a cross section of an optoelectronic device that includes a pinned photodiode electrically connected to the source or drain of an NMOS transistor that surrounds the photodiode.

DESCRIPTION

The inventors have found that particular materials can be used to form superlattices that have bandgaps, some of them direct, in ranges that are suitable for use in applications such as optics, electronics, and optoelectronics. It is generally desirable to grow these superlattices on materials such as silicon due to its common use in CMOS technology and/or due to the low defect levels present in silicon. When superlattices are grown on a surface with defects, these defects often propagate into the superlattice itself. However, the performance level of superlattices generally declines as the defect level increases. When prior superlattices were grown on silicon substrates, relaxed buffer layers, with lattice constants larger than the lattice constant for silicon, were generally needed between the substrate and the superlattice in order to achieve direct bandgaps and to achieve at least partial strain-compensation. These buffer layers are an additional source of defects. Many of the disclosed superlattice materials do not require these buffer layers when grown on substrates such as silicon. Accordingly these superlattices are more likely to have reduced defect levels. Further, the simulation results indicate that the disclosed superlattice materials can be used to engineer superlattices having particular bandgap features.

The inventors have surprisingly found that one or more planes of the disclosed superlattices can be a material that has a valence band maximum at the Z point (and/or its equivalent Y) of the Brillouin Zone. In some instances, these materials are direct bandgap materials. The inclusion of these materials in the disclosed superlattices can provide vertical transitions (in k-space) in regions of the Brillouin Zone other than the gamma point and vertical transitions in (k-space) across heterojunctions, in which one material has the conduction band minimum at the Z point (and/or its equivalent Y) and other has the valence band maximum also Z point (and/or its equivalent Y), but in which neither of these materials is necessarily a direct bandgap material.

Figure 1A:
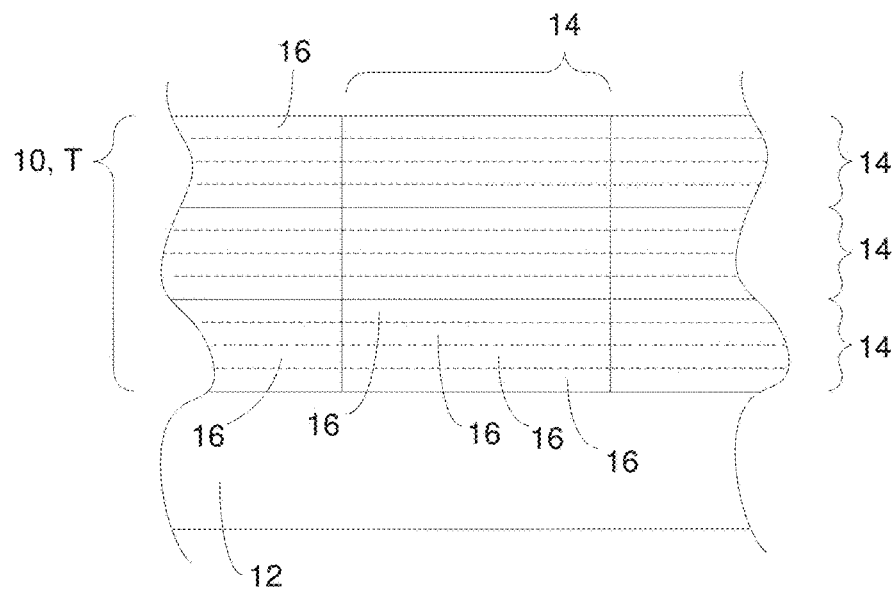
FIG. 1A is a cross section of a superlattice system having a superlattice positioned on a substrate.

FIG. 1A is a cross section of a superlattice system. The superlattice system includes a superlattice 10 positioned on a substrate 12. The superlattice 10 includes a variety of superlattice cells 14. Each superlattice cell 14 is the smallest unit that can be repeated in order to create the superlattice 10. Each of the cells 14 includes atoms arranged in multiple atomic planes 16 that are each parallel or substantially parallel to a surface of the substrate 12 on which the superlattice 10 is positioned and parallel or substantially parallel to each other.

The composition of a superlattice cell 14 can be expressed using the following notation $(CC_1)_{ap1}$—$(CC_2)_{ap2}$ . . . —$(CC_n)_{apn}$ where $CC_n$ represents the chemical composition of atomic plane n and apn represents the number of atomic planes 16 having the chemical composition represented by $CC_n$. When apn is greater than 1, the associated atomic planes 16 are immediately adjacent to one another in the superlattice cell 14. For instance, when apn is greater than 1, the associated atomic planes 16 can be covalently bonded to one another. At least two of the atomic planes 16 in the superlattice cell 14 have different chemical compositions.

Figure 1B:
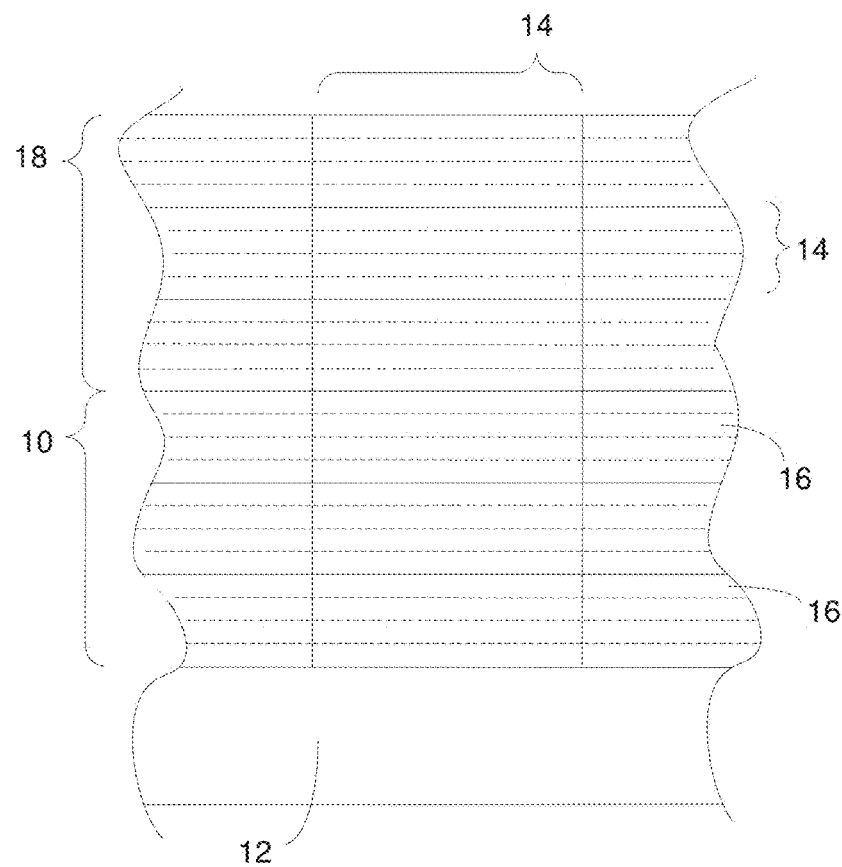
FIG. 1B is a cross section of a superlattice system having a first superlattice between a second superlattice and a substrate.

The superlattice system can include more than one superlattice stacked on the substrate 12. FIG. 1B is a cross section of a superlattice system having the superlattice 10 between a second superlattice 18 and the substrate 12. The second superlattice 18 can be constructed of different superlattice cells 14 than the superlattice 10. For instance, the formula $(CC_1)_{ap1}$ . . . —$(CC_n)_{apn}$ for the second superlattice 18 can be different from the superlattice 10.

Figure 1C:
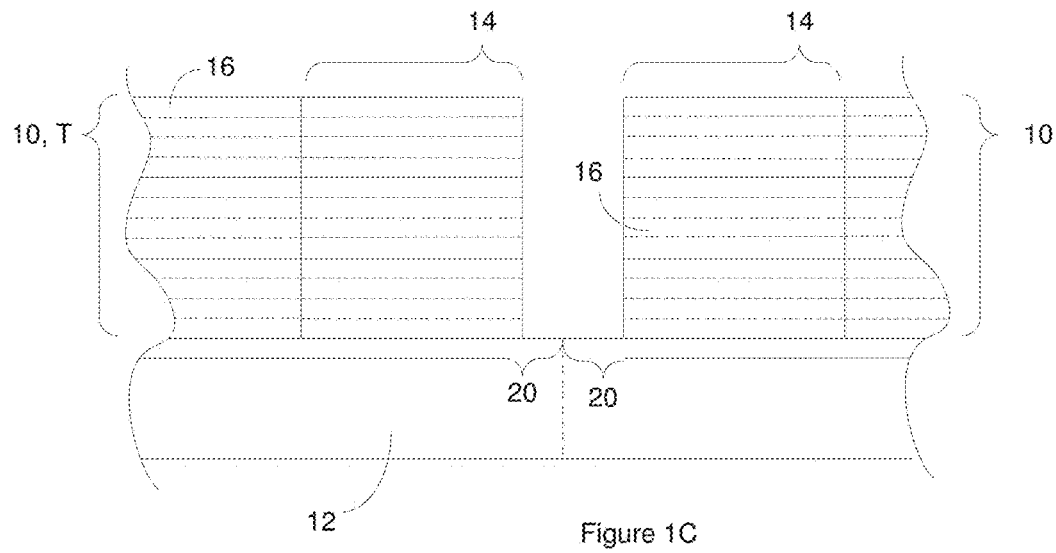
FIG. 1C is a cross section of a superlattice system having a substrate with multiple crystal faces positioned on a surface and superlattices on each of the different crystal faces.

The substrate 12 can include two or more crystal faces 20 positioned on a surface. FIG. 1C is a cross section of a superlattice system having a substrate 12 with multiple crystal faces 20 positioned on a surface and different superlattices 10 on each of the different faces. As a result, a single surface of the substrate 12 can include two or more superlattices 10. Different superlattices 10 can be the same or different from one another. For instance, the number of cells in the thickness of different superlattices 10 can be the same or different. As another example, the chemical composition of the superlattices or superlattice cells 14 may be the same for two or more of the superlattices 10 on the substrate 12 or can be different for each of the superlattices 10 on the substrate 12. For instance, the formula $(CC_1)_{ap1}$ . . . —$(CC_n)_{apn}$ may be the same for two or more of the superlattices 10 on the substrate 12 or can be different for each of the superlattices 10 on the substrate 12.

Even when two superlattices 10 on the same substrate 12 are constructed from superlattice cells 14 having the same chemical composition and thickness, the superlattices 10 have different band structures and bandgaps. This difference is a result of the different superlattices being on different crystal faces 20. For instance, the elements included in a superlattice can have minimum energy ellipsoids whose main axis of symmetry are oriented along different directions. As an example, a superlattice can include Si and Ge. For Si, the main axis is along the [100] direction and its equivalents, and for Ge the main axis is along the [111] direction and its equivalents. Consequently, straining these elements, and a superlattice incorporating them, to surfaces with different crystalline orientations results in different deformations of those ellipsoids. It also results in the lifting of degeneracies, i.e., crystalline directions and the corresponding directions in reciprocal space, that were equivalent in terms of the ellipsoids of minimum energy, are no longer equivalent. Accordingly, the same superlattice composition strained to different crystal faces have different band structures and different bandgaps. As a result, different superlattices on a continuous substrate can have different band structures and different bandgaps even though the superlattice cells of the different superlattices have the same composition.

The physical gap between the superlattices shown in FIG. 1C is optional. In some instances, the gap is greater than 2 nm, 10 nm, 100 nm, or 1,000 nm, and/or less than 100 μm, 10 μm, or 1 μm. Although the ambient atmosphere in which the superlattice system is positioned is shown in the gap, a gas, solid, or liquid can be positioned in the gap between different superlattices. The dashed line in FIG. 1C illustrates the interface between different crystal orientations on the substrate. Although the interface is shown as extending into the substrate for the entire depth of the substrate, the interface can extend only part way into the substrate.

The presence of different superlattices on the same substrate is useful for providing different band structures, with different bandgaps and different band alignments with respect to other semiconductor materials, such as Si, SiGe random alloys, SiGeC random alloys, etc., which are useful for applications such as bandgap engineering for device design, and in particular for devices such as diodes, photodiodes, LASERS, transistors (Tunnel-FETs, HBTs, etc.), Resonant Tunneling Devices, Electron (Hole) Transfer Devices, etc. . . .

Although FIG. 1C does not illustrate multiple superlattices arranged vertically as shown in FIG. 1B, one or more of the different faces on a substrate 12 such as FIG. 1C can include superlattices arranged vertically as shown in FIG. 1B.

Figure 2:
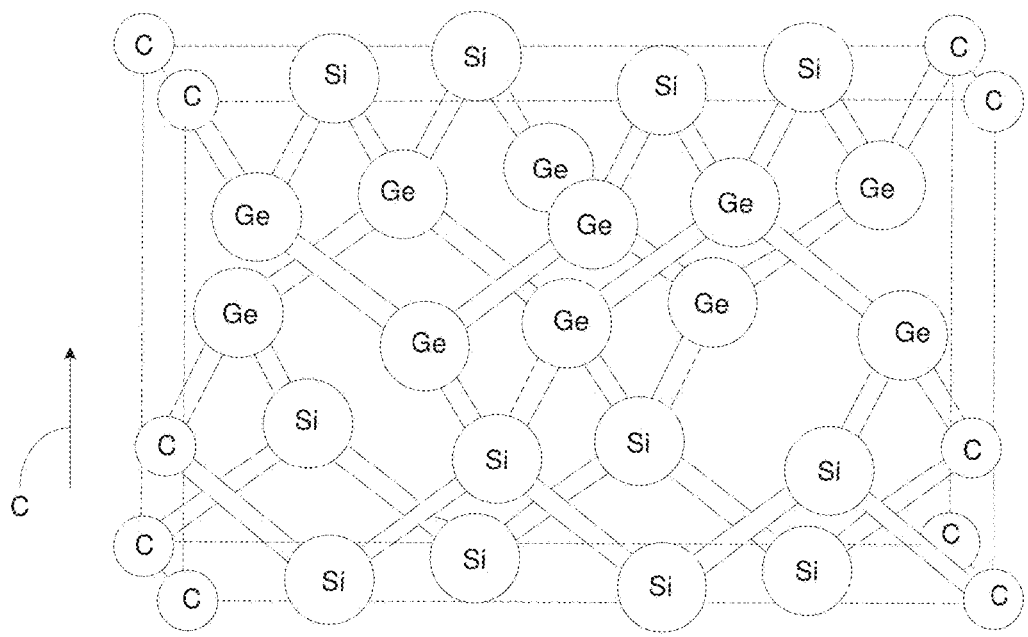
FIG. 2 illustrates a superlattice cell represented by $(Si_4C)_2$—$(Ge_5)_2$.

FIG. 2 provides an example of how the superlattice cell notation $(CC_1)_{ap1}$—$(CC_2)_{ap2}$ . . . —$(CC_n)_{apn}$ relates to the structure of the superlattice cell. The dashed lines in FIG. 2 represent the physical limits of the superlattice cell. As is most evident from the corners, the illustration in FIG. 2 shows portions of atoms that are located outside of the superlattice cell. The superlattice cell shown in FIG. 2 can be written as $(Si_4C)_2$—$(Ge_5)_2$. The superlattice cell of FIG. 2 shows 2 layers of $Si_4C$ immediately adjacent to one another and two layers of $Ge_5$ that are immediately adjacent to one another.

The minimum number of atoms needed to describe the chemical composition of an atomic plane can be different for different atomic planes. For instance, for an ordered alloy of silicon-carbon with 20% carbon, i.e., $Si_4C$, the minimum number of atoms, five, is given by the addition of the four atoms of silicon and one atom of carbon. Accordingly, five atoms is the minimum number of atoms that can describe the chemical composition of that atomic plane. In contrast, the chemical composition of an atomic plane that consists only of germanium can be described with a single atom. If the minimum number of atoms needed to describe the composition of an atomic plane is abbreviated as $atom_{min}$, then $atom_{min}$ for $Si_4C$ is 5 and is 1 for pure Ge. In the superlattice cell notation $(CC_1)_{ap1}$—$(CC_2)_{ap2}$ . . . —$(CC_n)_{apn}$, each of the atomic planes is treated as having the same number of atoms. The lowest common multiplier derived from the $atom_{min}$ for each of the different atomic planes sets the number of atoms in each of the other atomic planes. Accordingly, in the superlattice $(Si_4C)_2$—$(Ge_5)_2$, the notation uses 5 atoms in each atomic plane because 5 is the lowest common multiplier for $atom_{min}=5$ and $atom_{min}=1$. As a result, the chemical composition of the atomic planes that include pure germanium are written as $Ge_5$ even though the chemical composition of these atomic planes can be written with fewer atoms.

Depending on the surface orientation on which the superlattice is formed, the number of atomic planes may coincide with the number of lattice planes. That is the case for superlattices formed on the (100) surfaces of centered cubic (FCC) lattices. However, for superlattices formed on the (111) surfaces of the FCC lattice, one lattice plane comprises two atomic planes. Accordingly, one lattice plane can include one or more atomic planes.

As is evident from FIG. 1A through FIG. 1C, the superlattice is generally positioned on a substrate 12. The atomic plane represented by $(CC_1)_1$ is the atomic plane that is closest to the substrate. For instance, in the superlattice cell represented by $(Si_4C)_2$—$(Ge_5)_2$, the atomic plane $(Si_4C)_1$ is the atomic plane closest to the substrate. In the one or more superlattice cells closest to the substrate, all or a portion of the atoms in the atomic plane closest to the substrate can be bonded to the substrate. Accordingly, in the one or more superlattice cells closest to the substrate in FIG. 2, each of the carbon and silicon atoms in each atomic plane $(Si_4C)_1$ can be bonded to the upper surface of the substrate.

The substrate can be a single layer of material as shown in FIG. 1A through FIG. 1C. For instance, the substrate can be bulk silicon, bulk germanium, or bulk silicon-germanium. Although FIG. 1A through FIG. 1C illustrate the substrate as being a single layer of material, the substrate can include multiple layers of material. Suitable substrates include, but are not limited to, Thick-Film Silicon-on-Insulator (SOI), Thin-Film SOI, UltraThinFilm (UTF)-SOI, Thin-Film Germanium on Insulator (GOI), and UltraThin-Film (UTF)-GOI, Thin-Film Silicon-Germanium on Insulator, and UltraThinFilm (UTF)-Silicon-Germanium on Insulator.

The superlattice can be grown on a surface of the substrate. The direction of growth is labeled C in FIG. 2. The surface upon which the superlattice is grown can have a lattice constant that is different from the lattice constant of the superlattice. As noted above, the inventors have found that the amount of strain placed on the superlattice as a result of lattice mismatch between the surface of the substrate and the attached superlattice affects the bandgap of the superlattice. The inventors have also found that the impact of strain, on multiple materials used as components of superlattices, and on multiple superlattice compositions, varies according to surface orientation. Accordingly, the bandgap of the superlattice can be a function of the surface of the substrate on which the superlattice is formed. Examples of suitable substrate surfaces for growing the disclosed superlattices include the (100) surface of a face centered cubic lattice, the (110) surface of a face centered cubic lattice, the (111) surface of a face centered cubic lattice, the (311) surface of a face centered cubic lattice, or the (511) surface of a face centered cubic lattice. Suitable surfaces include the (100) surface of silicon, the (110) surface of silicon, the (111) surface of silicon, the (311) surface of silicon, the (511) surface of silicon, and (100) surface of germanium, the (110) surface of germanium, the (111) surface of germanium, the (311) surface of germanium, the (511) surface of germanium.

Although the above discussion is directed toward growth of one or more superlattices on a substrate, one or more superlattices could also be grown on substrate materials with variable lattice parameters such as when the surfaces on which the superlattices are pseudomorphically grown have varying lateral distances between the atoms on that surface. For instance, one or more superlattices can be grown on the side wall of a Mesa or Fin (of a Fin-MOSFET), or channel of a MOSFET. When the pseudomorphic growth of a superlattice is done on the sidewall of a material that has a variable distance between atomic planes, the superlattice is then under biaxial strain. An example of such scenario would be a superlattice pseudomorphically grown on the side wall of a SiGe epitaxial layer strained to Si, in which the Ge content varies along the vertical direction (direction of the epitaxial growth of the SiGe layer). In this scenario the superlattice would be strained to a crystalline surface having a fixed distance between atomic planes in the direction of perpendicular to the direction of epitaxial growth of the SiGe layer, and a variable distance between atomic planes in the direction of epitaxial growth of the SiGe layer.

When the number of atomic planes in a cell becomes low enough that the superlattice becomes a short-period superlattice, quantum effects cause the bandgap characteristics for the superlattice to become different from the bandgap characteristics of a long-period superlattice. For instance two superlattices with the same overall ratio of constituent materials, such as $Si_4C$ and Ge, can have very different bandgaps, as it is the case with $(Si_4C)_1$—$(Ge_5)_1$, $(Si_4C)_2$—$(Ge_5)_2$, $(Si_4C)_3$—$(Ge_5)_3$, $(Si_4C)_4$—$(Ge_5)_4$, $(Si_4C)_5$—$(Ge_5)_5$, all strained to the (111) surface of Si, where the first has a bandgap of 0.967 eV, the second a bandgap of 0.595 eV, and the third a bandgap of 0.312 eV, and the fourth a bandgap of 0.795, and the fifth a bandgap of 0.218 eV. In order to take advantage of the bandgap characteristics of the short-period superlattices, the superlattice cells can have less than 5, 10, 20, 30, or 40 atomic planes. Additionally or alternately, the superlattice cells and/or the superlattice can have thickness (labeled T in FIG. 1A) less than 5, 10, 20, 30, 40, or 50 angstroms.

The chemical composition of the superlattice cell can be a crystalline ordered alloy material or a crystalline random alloy material. When the chemical composition of the superlattice cell is an ordered alloy material, each of the corresponding lattice points in different superlattice cells is occupied by an atom of the same element. When the chemical composition of the superlattice cell is a random alloy material, corresponding lattice points in different superlattice cells may not occupied by an atom of the same element. The atomic planes of ordered materials are ordered atomic planes and the atomic planes of random materials are random atomic planes. The inventors have found that the band structures of superlattices that include ordered materials are different from the band structures for superlattices that include random materials even when the elements and relative ratios of the elements are the same in the random and ordered material.

Examples of suitable chemical compositions for one or more of the random atomic planes include, but are not limited to, random alloys such as $Si_{1-x}Ge_x$ where x is greater than or equal to 0 and/or less than or equal to 1, $Si_{1-y}C_y$ where y is greater than or equal to 0 or 0.1 and/or less than or equal to 0.25, $Si_{1-x-y}Ge_xC_y$ where x is greater than or equal to 0 or 0.1 and/or less than or equal to 1 and y is greater than or equal to 0 or 0.01 and/or less than or equal to 0.25, $Si_{1-z}Sn_z$ where z is greater than or equal to 0 or 0.01 and/or less than or equal to 0.1, $Ge_{1-z}Sn_z$ where z is greater than or equal to 0 or 0.01 and/or less than or equal to 0.05, $C_{1-z}Sn_z$ where z is greater than or equal to zero and/or less than 1 and in one example z is 0.20 or 0.25, $Si_{1-x-z}Ge_xSn_z$ where x is greater than or equal to 0 or 0.1 and/or less than or equal to 1 and z is greater than or equal to 0 or 0.01 and/or less than or equal to 0.1, $Si_{1-y-z}C_ySn_z$ where y is greater than or equal to 0 or 0.01 and/or less than or equal to 0.25 and z is greater than or equal to 0 or 0.01 and/or less than or equal to 0.25, $Ge_{1-y-z}C_ySn_z$ where y is greater than or equal to 0 or 0.01 and/or less than or equal to 0.25 and z is greater than or equal to 0 or 0.01 and/or less than or equal to 0.25, and $Si_{1-x-y-z}Ge_xC_ySn_z$ where x is greater than or equal to 0 or 0.1 and/or less than or equal to 1 and y is greater than or equal to 0 or 0.01 and/or less than or equal to 0.25 and z is greater than or equal to 0 or 0.01 and/or less than or equal to 0.25, $Si_{1-x}Pb_x$ where x is greater than or equal to 0.001 or 0.01 and/or less than or equal to 0.1, $Si_{1-x-y}Pb_xC_y$ where x is greater than or equal to 0.001 or 0.01 and/or less than or equal to 0.1 and y is greater than or equal to 0.001 or 0.01 and/or less than or equal to 0.25, $Si_{1-x-y-z}Pb_xC_yGe_z$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95, $Si_{1-x-y-z-t}Pb_xC_yGe_zSn_t$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95 and t is greater than or equal to 0.001 or 0.01 and/or less than or equal to 0.25, $Ge_{1-x}Pb_x$ where x is greater than or equal to 0.001 or 0.01 and/or less than or equal to 0.1, $Ge_{1-x-y}Pb_xC_y$ where x is greater than or equal to 0.001 or 0.01 and/or less than or equal to 0.1 and y is greater than or equal to 0.001 or 0.01 and/or less than or equal to 0.25, $Ge_{1-x-y-z}Pb_xC_ySn_z$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.25. When an atomic plane is random, the corresponding atomic planes in different cells can have different ratios of the different elements that make up the chemical composition of the atomic plane. For instance, the lowest atomic plane in one cell can have 4 carbon atoms while the lowest plane in another cell have 3 carbon atoms. As a result, the chemical composition of a random atomic plane is averaged across planes. For instance, an atomic plane having a chemistry of $Si_{0.5}Ge_{0.5}$ has a chemical composition where multiple corresponding atomic planes are averaged across multiple cells even though the atomic plane in a individual cells may a slightly different chemical composition.

Examples of suitable chemical compositions for one or more of the atomic planes include, but are not limited to, ordered alloys such as $Si_4C$, $Ge_4C$, $Sn_4C$, $Si_4Ge$, $Ge_4Si$, $Si_6C_2$, $Ge_6C_2$, $Sn_6C_2$, $SiGe_3C$, $Si_2Ge_2C$, $Si_3GeC$, $SiSn_3C$, $Si_2Sn_2C$, $Si_3SnC$, $GeSn_3C$, $Ge_2Sn_2C$ and $Ge_3SnC$. Other examples of suitable a chemical composition for one or more of the atomic planes include, but are not limited to, elements, such as Si, Ge, C, Sn and Pb. The superlattice cells can include one, more than one, more than two, or more than three atomic planes that each have one of the above chemical compositions. The superlattice cells can include one, more than one, more than two, or more than three atomic planes that each has one of the above chemical compositions and at least one of the atomic planes in the superlattice includes carbon. In some instances, the superlattice cells consist of atomic planes that each has one of the above chemical compositions. In some instances, the superlattice cells consist of atomic planes that each has one of the above chemical compositions and at least one of the atomic planes includes carbon.

In some instances, the atomic planes in the superlattice cell are ordered or random and all or a portion of the atomic planes include carbon. In some instances, the superlattice cell is ordered or random and includes or consists of atomic planes that consist of a group IV element and atomic planes of compounds that each includes or consists of group IV elements. One, more than one, or all of the atomic planes in the superlattice cells can be ordered or random and can include or consist of carbon and one or more group IV elements. As an example, one, more than one, or all of the atomic planes in the superlattice cells can be ordered or random and can include or consist of carbon and one or more other elements selected from a group consisting of silicon, germanium, tin and lead. In some instances, one, more than one, or all of the atomic planes in the superlattice cells are ordered or random and include or consist of carbon and one or more other elements selected from a group consisting of silicon, germanium, tin and lead where the superlattice cell has a number of atomic planes less than or equal to 15, 25, 35, or 40. In some instances, one, more than one, or all of the atomic planes in the superlattice cells are ordered or random and include or consist of carbon and one or more other elements selected from a group consisting of silicon, germanium, tin and lead where the percentage of substitutional carbon atoms in the one, more than one, or all of the atomic planes is more than 10%, 20% or 30%. In some instances, one, more than one, or all of the atomic planes in the superlattice cells are ordered or random and include or consist of carbon and one or more other elements selected from a group consisting of silicon, germanium, tin and lead; the superlattice cell has a number of atomic planes less than or equal to 10, 15, 25, 35, or 40; and where the percentage of substitutional carbon atoms in the one, more than one, or all of the atomic planes is more than 10%, 20% or 30%.

In some instances, the atomic planes in the superlattice cell are ordered or random and all or a portion of atomic planes include tin. For instance, one, more than one, or all of the atomic planes in the superlattice cells can be ordered or random and can include or consist of tin and one or more other group IV elements. As an example, one, more than one, or all of the atomic planes in the superlattice cells can be ordered or random and can include or consist of tin and one or more other elements selected from a group consisting of silicon, germanium, lead and carbon. In some instances, one, more than one, or all of the atomic planes in the superlattice cells are ordered or random and include or consist of tin and one or more other elements selected from a group consisting of silicon, germanium, lead and carbon where the superlattice cell has a total number of atomic planes less than or equal to 10, 15, 25, 35, or 40. In some instances, one, more than one, or all of the atomic planes in the superlattice cells are ordered or random and include or consist of tin and carbon where the percentage of substitutional carbon atoms in the one, more than one, or all of the atomic planes is more than 15%, 25% or 35%. In some instances, one, more than one, or all of the atomic planes in the superlattice cells are ordered or random and include or consist of tin and one or more other elements selected from a group consisting of silicon, germanium, lead and carbon; the superlattice cell has a number of atomic planes less than or equal to 10, 15, 25, 35, or 40; and when the one or more other elements includes carbon, the percentage of substitutional carbon atoms in the one, more than one, or all of the atomic planes is more than 15%, 25% or 35%.

In some instances, the atomic planes in the superlattice cell are ordered or random and all or a portion of the atomic planes include lead. For instance, one, more than one, or all of the atomic planes in the superlattice cells can be ordered or random and can include or consist of lead and one or more other group IV elements. As an example, one, more than one, or all of the atomic planes in the superlattice cells can be ordered or random and can include or consist of lead and one or more other elements selected from a group consisting of silicon, germanium, tin and carbon. In some instances, one, more than one, or all of the atomic planes in the superlattice cells are ordered or random and include or consist of lead and one or more other elements selected from a group consisting of silicon, germanium, tin and carbon where the superlattice cell has a total number of atomic planes less than or equal to 10, 15, 25, 35, or 40. In some instances, one, more than one, or all of the atomic planes in the superlattice cells are ordered or random and include or consist of lead and carbon where the percentage of substitutional carbon atoms in the one, more than one, or all of the atomic planes is more than 15%, 25% or 35%. In some instances, one, more than one, or all of the atomic planes in the superlattice cells are ordered or random and include or consist of lead and one or more other elements selected from a group consisting of silicon, germanium, tin and carbon; the superlattice cell has a number of atomic planes less than or equal to 10, 15, 25, 35, or 40; and when the one or more other elements includes carbon, the percentage of substitutional carbon atoms in the one, more than one, or all of the atomic planes is more than 15%, 25% or 35%.

Examples of suitable superlattice cells that include ordered alloys having one or more atomic planes that include carbon include, but are not limited to, $(Si_4C)_2$—$(Ge_5)_2$, $(Si_4C)_4$—$(Ge_5)_3$, $(Ge_4C)_5$—$(Ge_5)_5$, $(Ge_4C)_4$—$(Si_5)_2$, $(Ge_4C)_2$—$(Ge_5)_3$, $(Ge_4C)_3$—$(Ge_5)_2$, $(Ge_4C)_3$—$(Ge_5)_4$, $(Ge_4C)_3$—$(Ge_5)_5$, $(Ge_4C)_4$—$(Ge_5)_3$, $(Ge_4C)_4$—$(Ge_5)_2$, $(Ge_4C)_5$—$(Ge_5)_2$, $(Ge_4C)_5$—$(Ge_5)_3$, $(Ge_4C)_6$—$(Ge_5)_2$, $(Ge_4C)_6$—$(Ge_5)_4$, $(Ge_4C)_7$—$(Ge_5)_3$, $(Ge_4C)_8$—$(Ge_5)_2$, $(Si_4C)_2$—$(Ge_5)_3$, $(Si_4C)_3$—$(Ge_5)_2$, $(Si_4C)_3$—$(Ge_5)_3$, and $(Si_5)_4$—$(Si_4C)_4$. Examples of superlattice systems that include a superlattice having ordered alloys include, but are not limited to, $(Si_4C)_2$—$(Ge_5)_2$ on the (100) surface of silicon, $(Si_4C)_4$—$(Ge_5)_3$ on the (100) surface of silicon, $(Ge_4C)_5$—$(Ge_5)_5$ on the (100) surface of silicon, $(Ge_4C)_4$—$(Si_5)_2$ on the (100) surface of silicon, $(Si_5)_4$—$(Si_4C)_4$ on the (110) surface of silicon, $(Ge_4C)_2$—$(Ge_5)_3$ on the (111) surface of silicon, $(Ge_4C)_3$—$(Ge_5)_2$ on the (111) surface of silicon, $(Ge_4C)_3$—$(Ge_5)_4$ on the (111) surface of silicon, $(Ge_4C)_3$—$(Ge_5)_5$ on the (111) surface of silicon, $(Ge_4C)_4$—$(Ge_5)_3$ on the (111) surface of silicon, $(Ge_4C)_4$—$(Ge_5)_2$ on the (111) surface of silicon, $(Ge_4C)_5$—$(Ge_5)_2$ on the (111) surface of silicon, $(Ge_4C)_5$—$(Ge_5)_3$ on the (111) surface of silicon, $(Ge_4C)_6$—$(Ge_5)_2$ on the (111) surface of silicon, $(Ge_4C)_6$—$(Ge_5)_4$ on the (111) surface of silicon, $(Ge_4C)_7$—$(Ge_5)_3$ on the (111) surface of silicon, $(Ge_4C)_8$—$(Ge_5)_2$ on the (111) surface of silicon, $(Si_4C)_2$—$(Ge_5)_3$ on the (111) surface of silicon, $(Si_4C)_3$—$(Ge_5)_2$ on the (111) surface of silicon, $(Si_4C)_3$—$(Ge_5)_3$ on the (111) surface of silicon.

Examples of suitable ordered superlattice cells having one or more atomic planes that include tin include, but are not limited to, $(Si_4C)_m$—$(Sn_4C)_n$, where m is greater than or equal to 1 and/or less than or equal to 12 and n is greater than or equal to 1 and/or less than or equal to 12. Examples of suitable ordered superlattice cells having one or more atomic planes that include lead include, but are not limited to, $(Si_4C)_m$—$(Pb_4C)_n$, where m is greater than or equal to 1 and/or less than or equal to 12 and n is greater than or equal to 1 and/or less than or equal to 12.

The following Table 1 sets forth the bandgaps for many of the above superlattice cell systems.

TABLE 1

Figure 13:
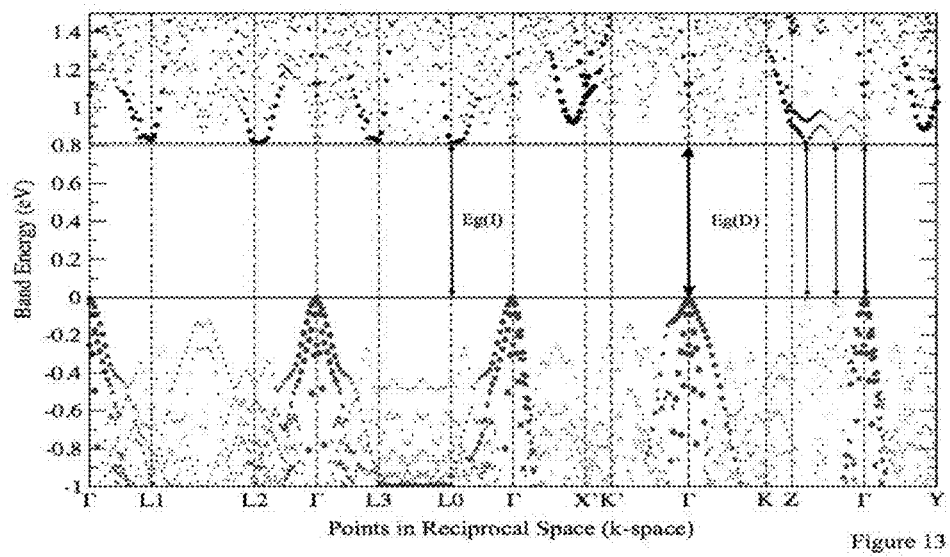
FIG. 13 is the simulated band structure for the superlattice cell represented by $(Ge_4C)_5$—$(Ge_5)_5$ grown on the (100) face of silicon.
Figure 14:
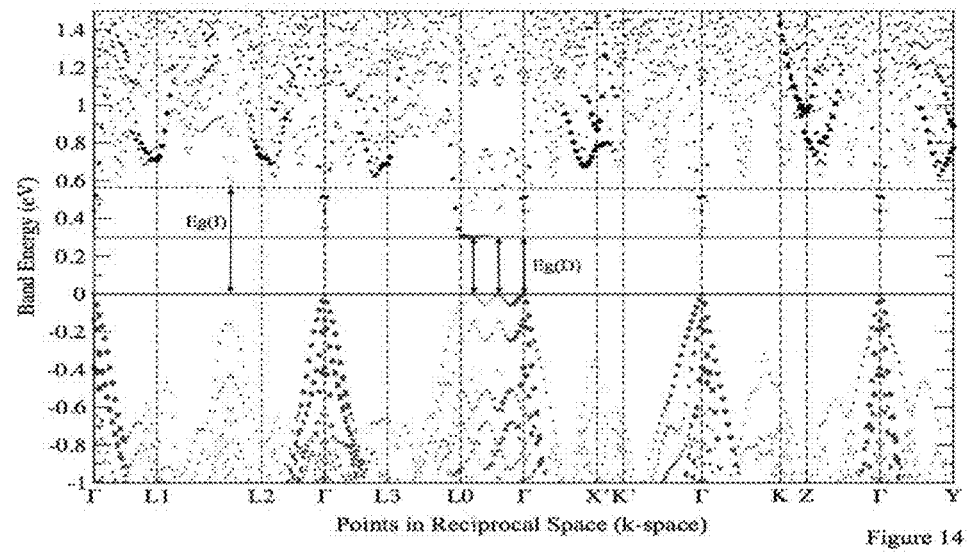
FIG. 14 is the simulated band structure for the superlattice cell represented by $(Ge_4C)_5$—$(Ge_5)_5$ grown on the (111) face of silicon.
Figure 18:
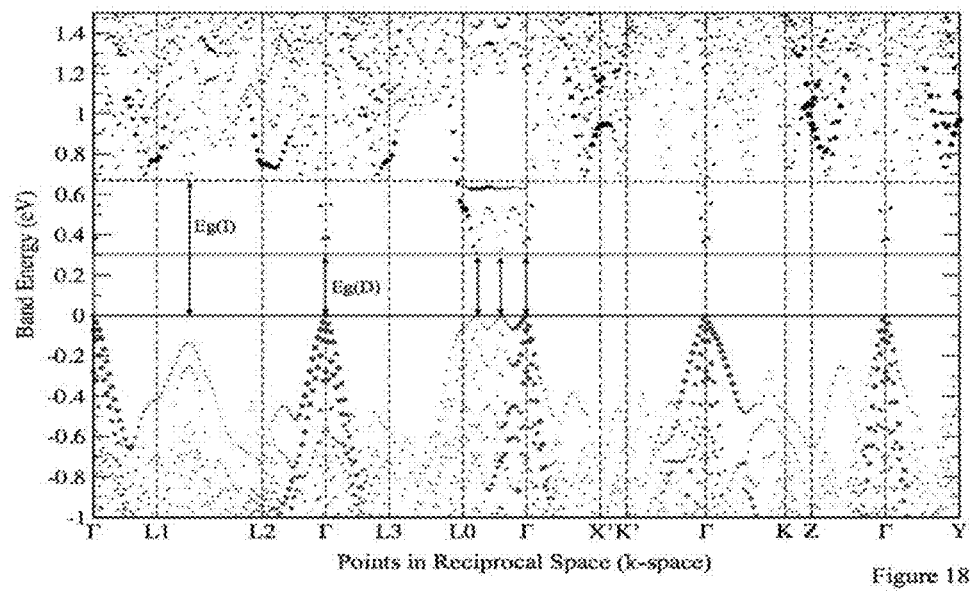
FIG. 18 is the simulated band structure for the superlattice cell represented by $(Ge_4C)_3$—$(Ge_5)_2$ grown on the (111) face of silicon.
Figure 19:
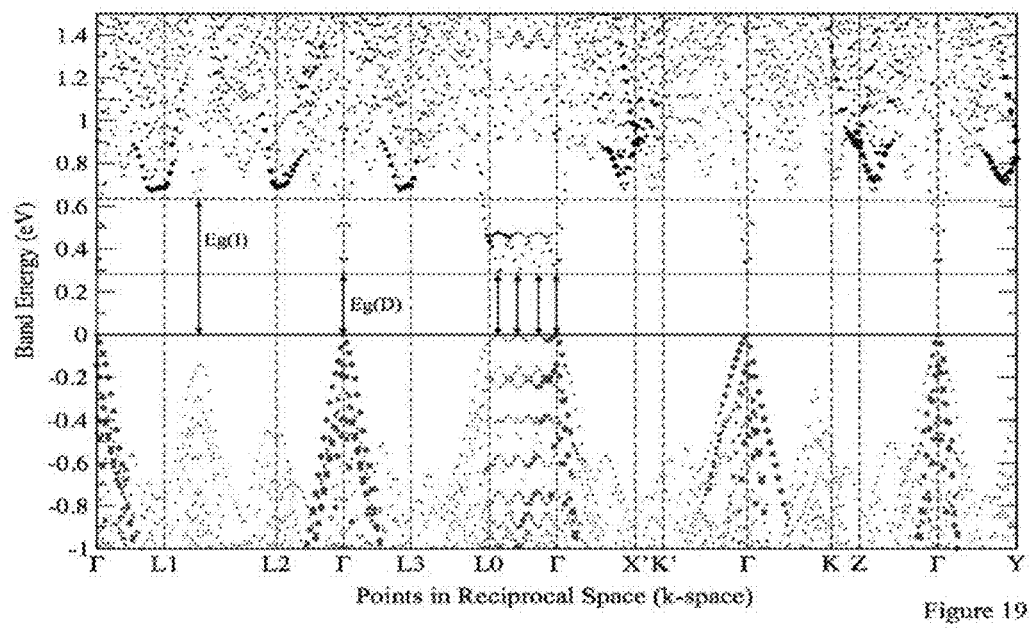
FIG. 19 is the simulated band structure for the superlattice cell represented by $(Ge_4C)_3$—$(Ge_5)_4$ grown on the (111) face of silicon.
Figure 20:
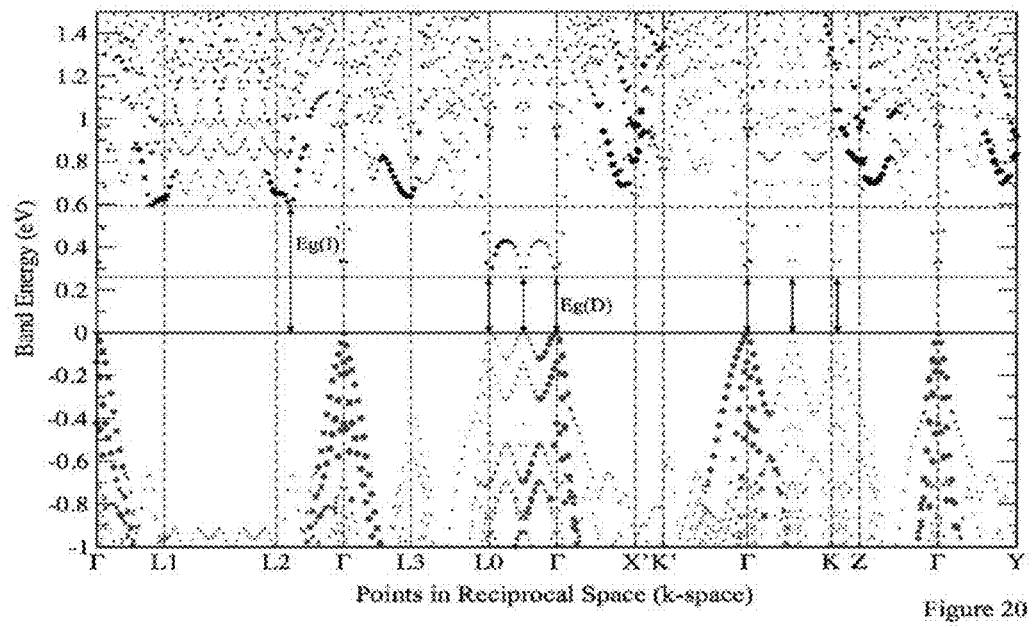
FIG. 20 is the simulated band structure for the superlattice cell represented by $(Ge_4C)_3$—$(Ge_5)_5$ grown on the (111) face of silicon.
Figure 21:
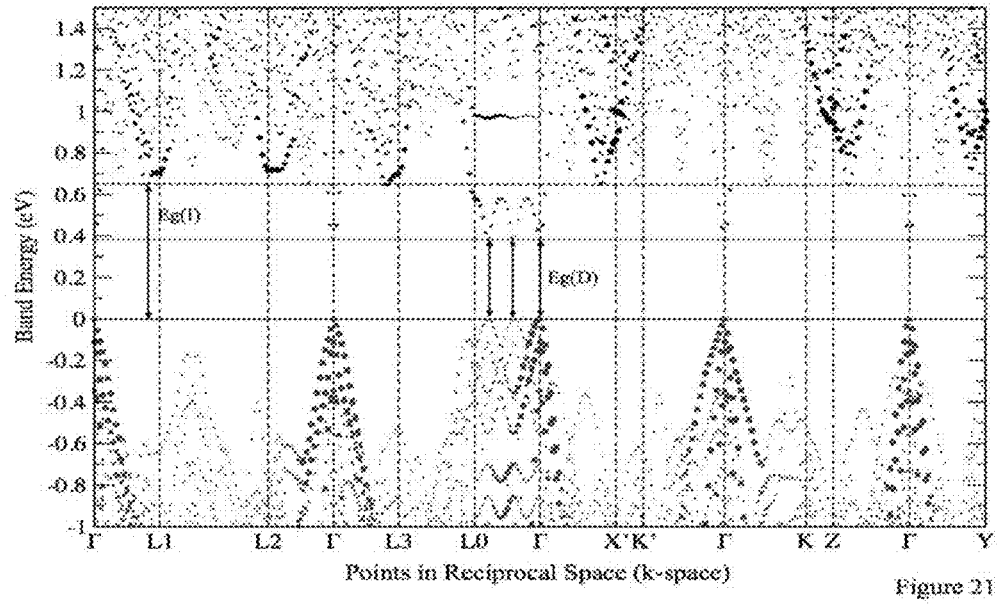
FIG. 21 is the simulated band structure for the superlattice cell represented by $(Ge_4C)_2$—$(Ge_5)_3$ grown on the (111) face of silicon.
Figure 22:
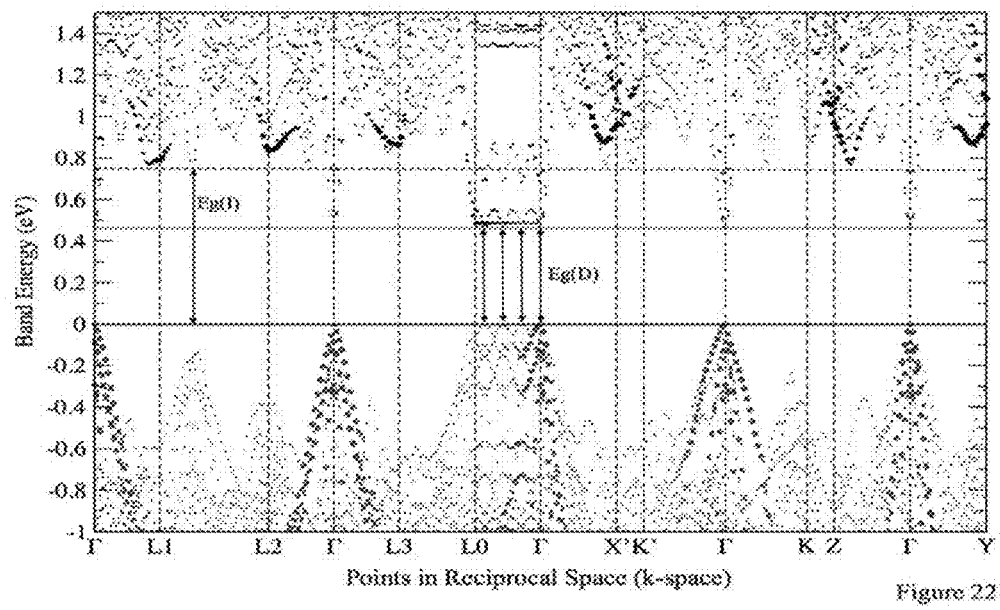
FIG. 22 is the simulated band structure for the superlattice cell represented by $(Ge_4C)_4$—$(Ge_5)_3$ grown on the (111) face of silicon.
Figure 25:
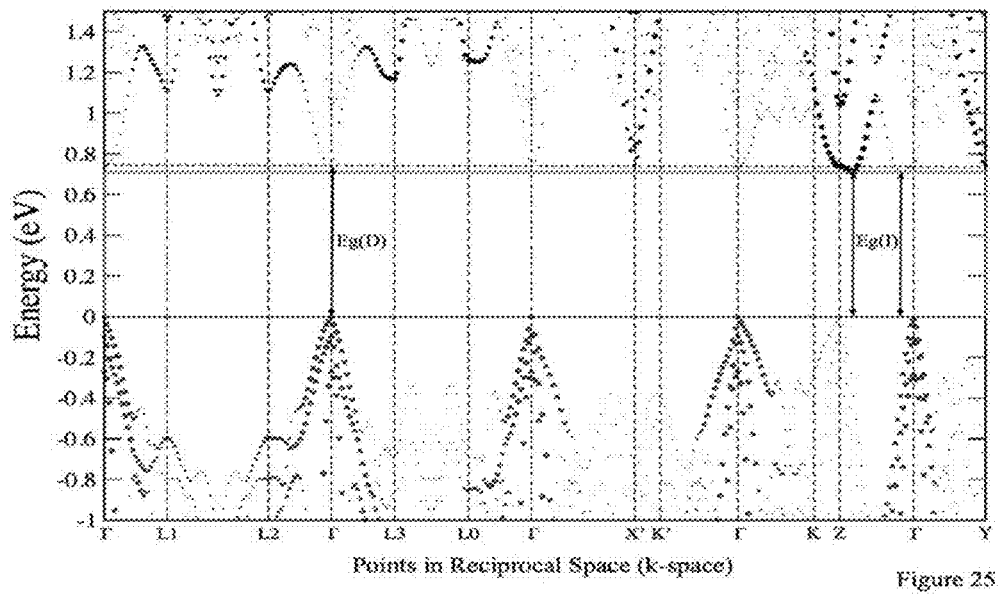
FIG. 25 is the simulated band structure for the superlattice cell represented by $(Si_4C)_2$—$(Ge_5)_2$ grown on the (100) face of silicon.
Figure 26:
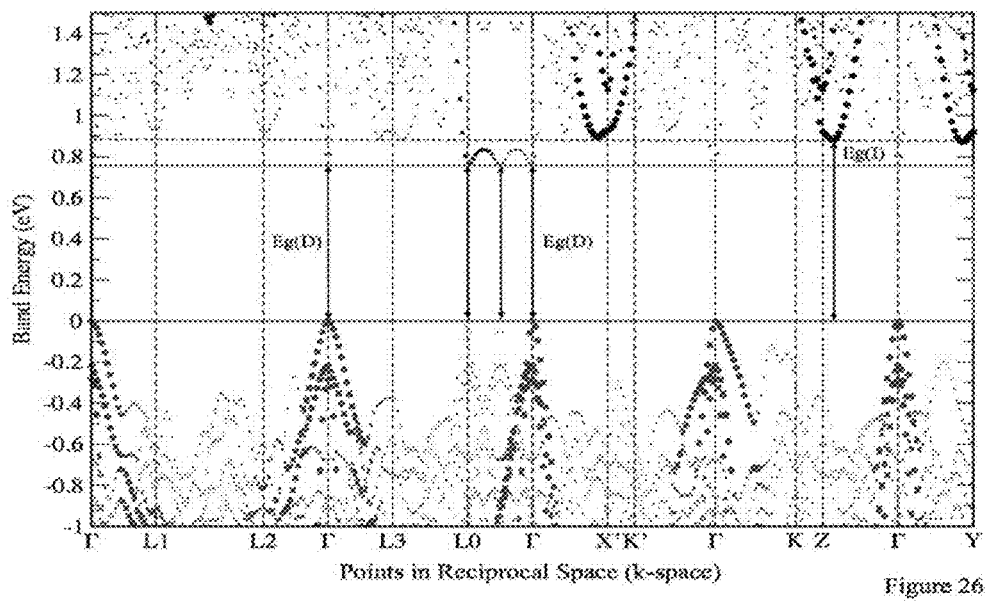
FIG. 26 is the simulated band structure for the superlattice cell represented by $(Ge_4C)_3$—$(Si_5)_5$ on the (111) surface of silicon.
Figure 27:
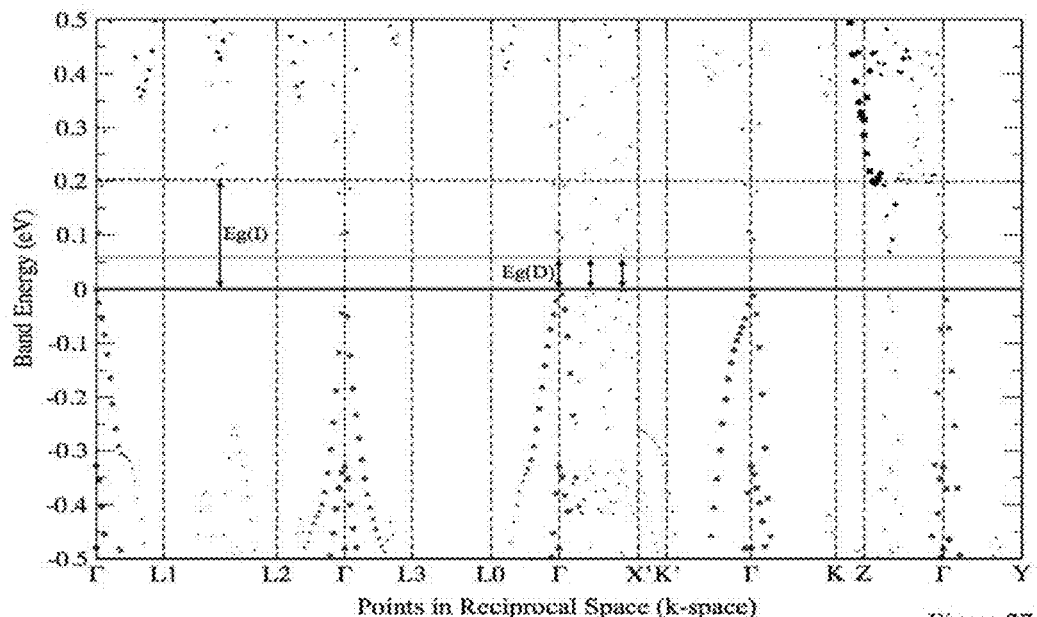
FIG. 27 is the simulated band structure for the superlattice cell represented by $(Ge_4C)_4$—$(Si_5)_2$ on the (100) face of silicon.
Figure 28:
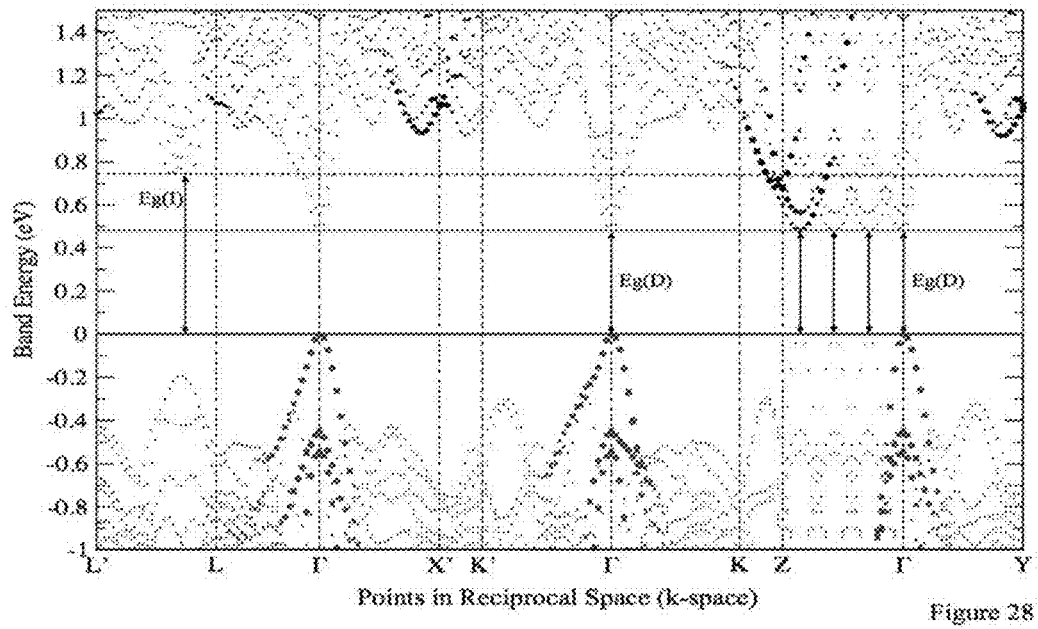
FIG. 28 is the simulated band structure for the superlattice cell represented by $(Ge_4C)_4$—$(Si_5)_3$ grown on the (100) face of silicon.
Figure 29:
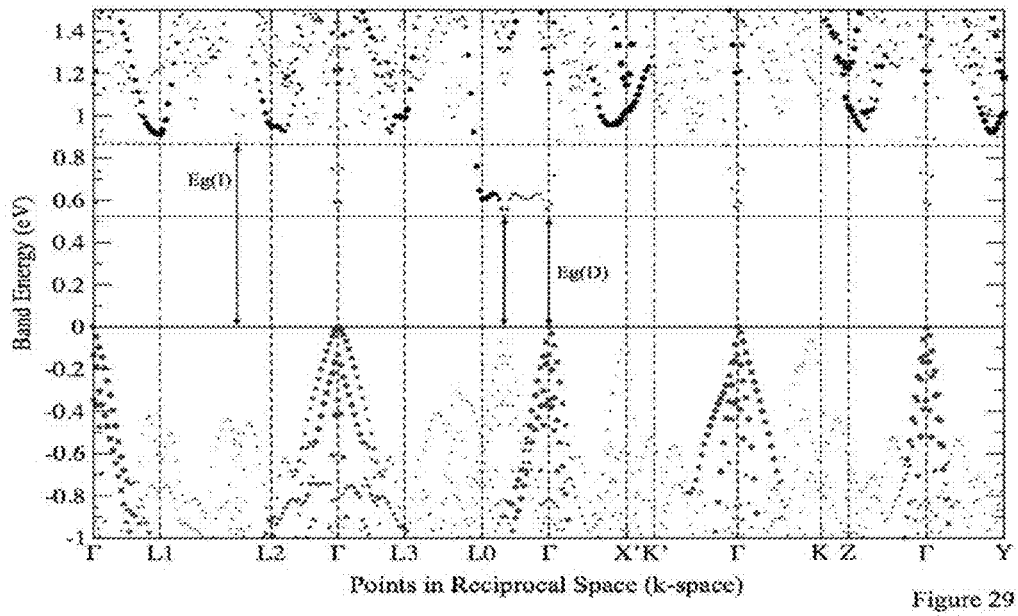
FIG. 29 is the simulated band structure for the superlattice cell represented by $(Ge_4C)_4$—$(Ge_5)_2$ grown on the (111) face of silicon.
Figure 30:
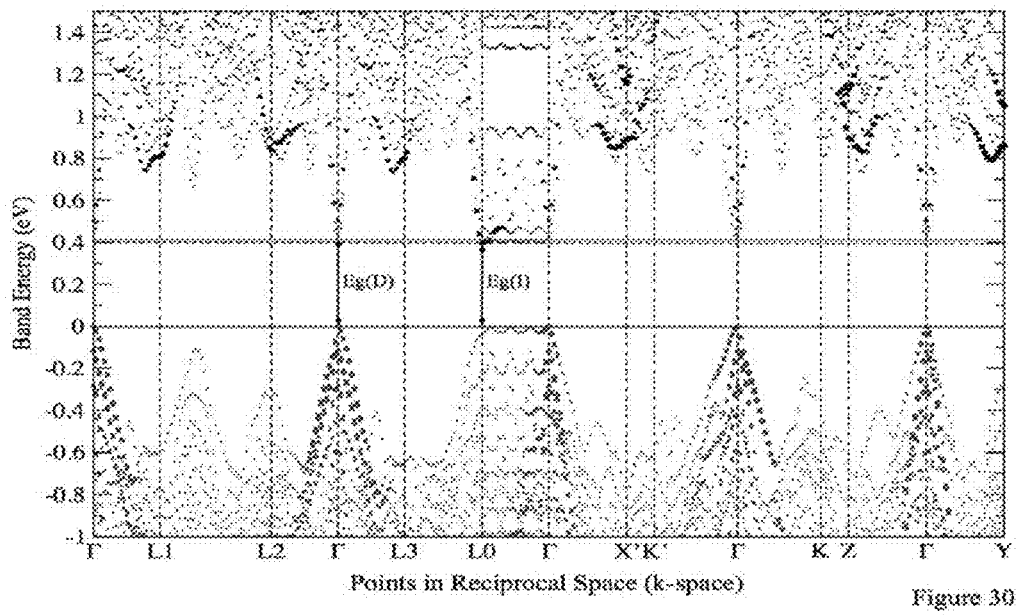
FIG. 30 is the simulated band structure for the superlattice cell represented by $(Ge_4C)_5$—$(Ge_5)_2$ grown on the (111) face of silicon.
Figure 31:
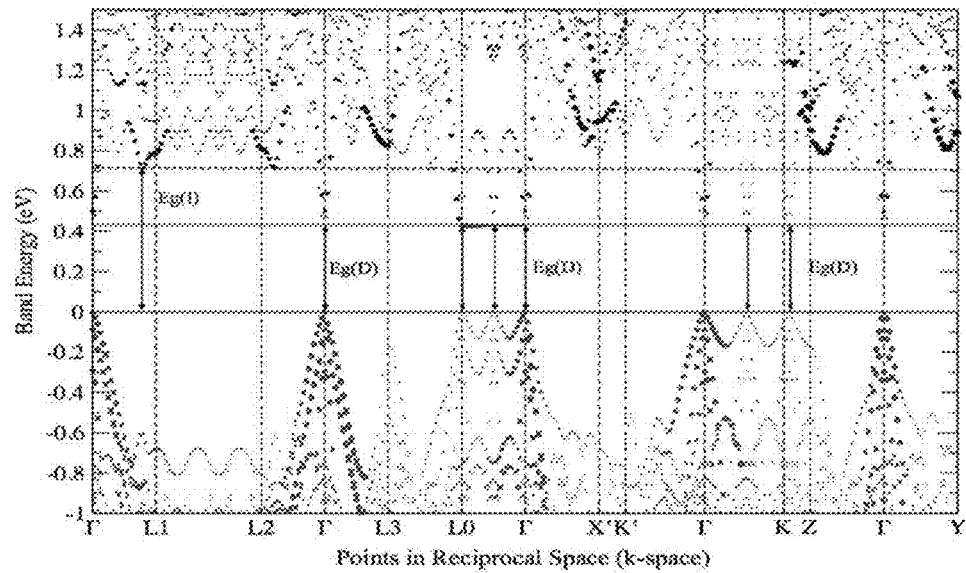
FIG. 31 is the simulated band structure for the superlattice cell represented by $(Ge_4C)_5$—$(Ge_5)_3$ grown on the (111) face of silicon.
Figure 32:
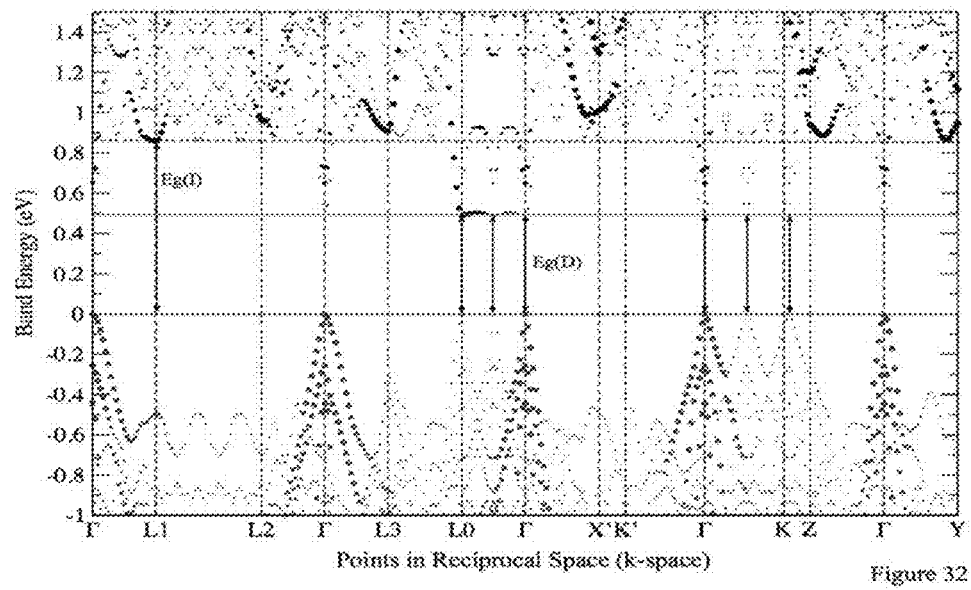
FIG. 32 is the simulated band structure for the superlattice cell represented by $(Ge_4C)_6$—$(Ge_5)_2$ grown on the (111) face of silicon.
Figure 33:
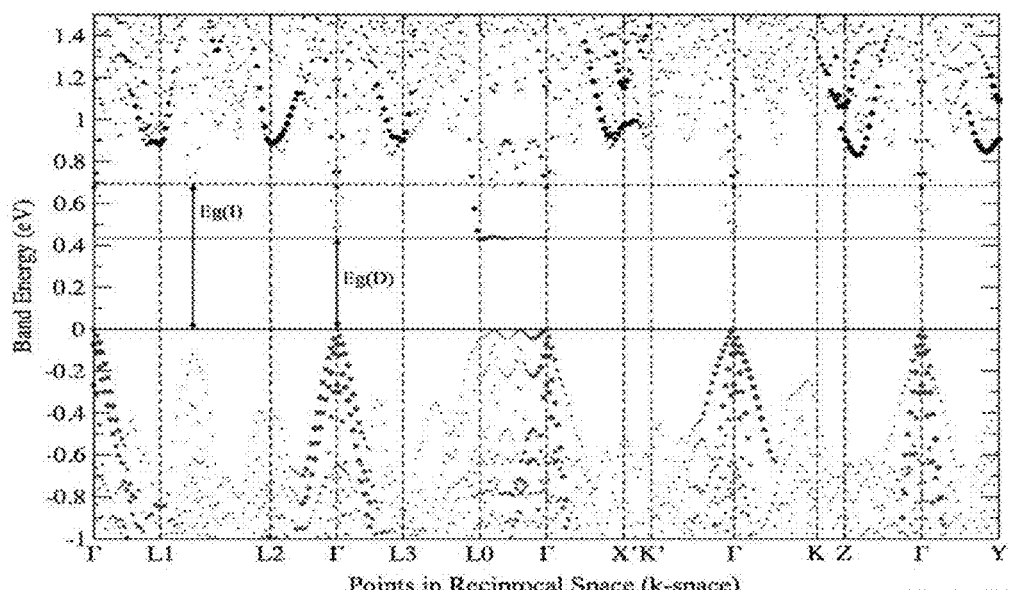
FIG. 33 is the simulated band structure for the superlattice cell represented by $(Ge_4C)_6$—$(Ge_5)_4$ grown on the (111) face of silicon.
Figure 34:
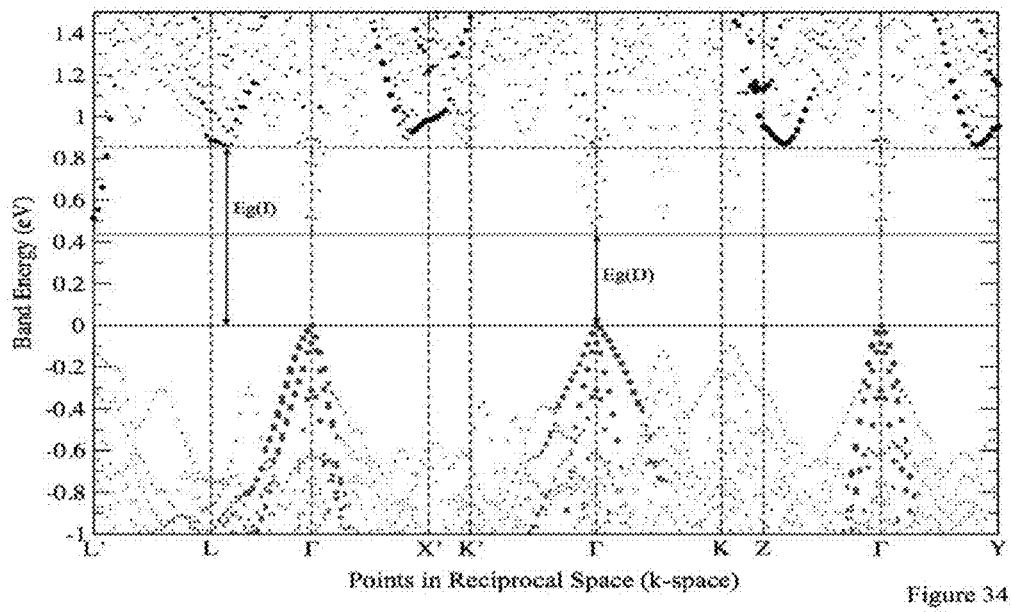
FIG. 34 is the simulated band structure for the superlattice cell represented by $(Ge_4C)_7$—$(Ge_5)_3$ grown on the (111) face of silicon.
Figure 35:
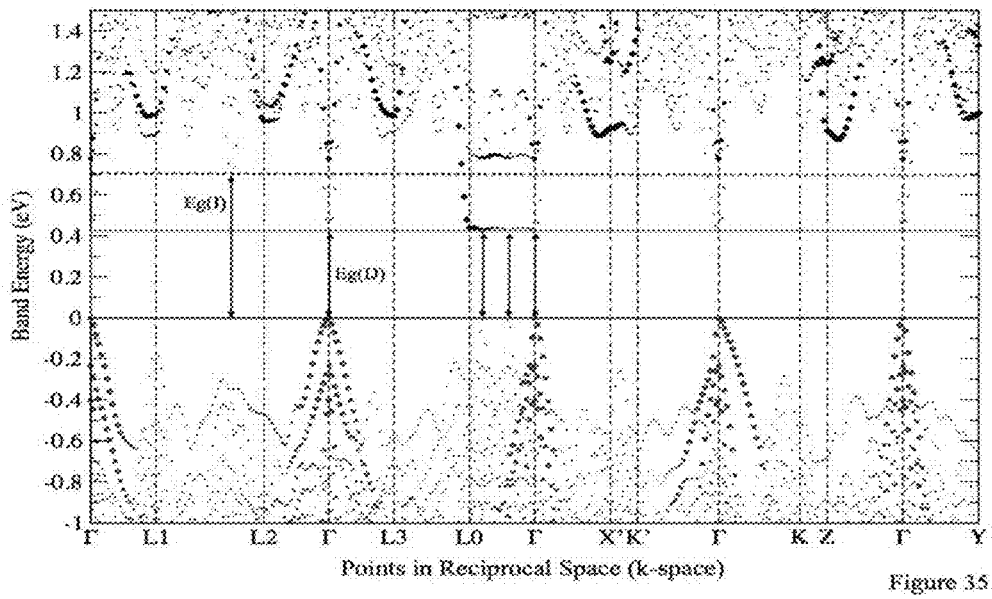
FIG. 35 is the simulated band structure for the superlattice cell represented by $(Ge_4C)_8$—$(Ge_5)_2$ grown on the (111) face of silicon.
Figure 36:
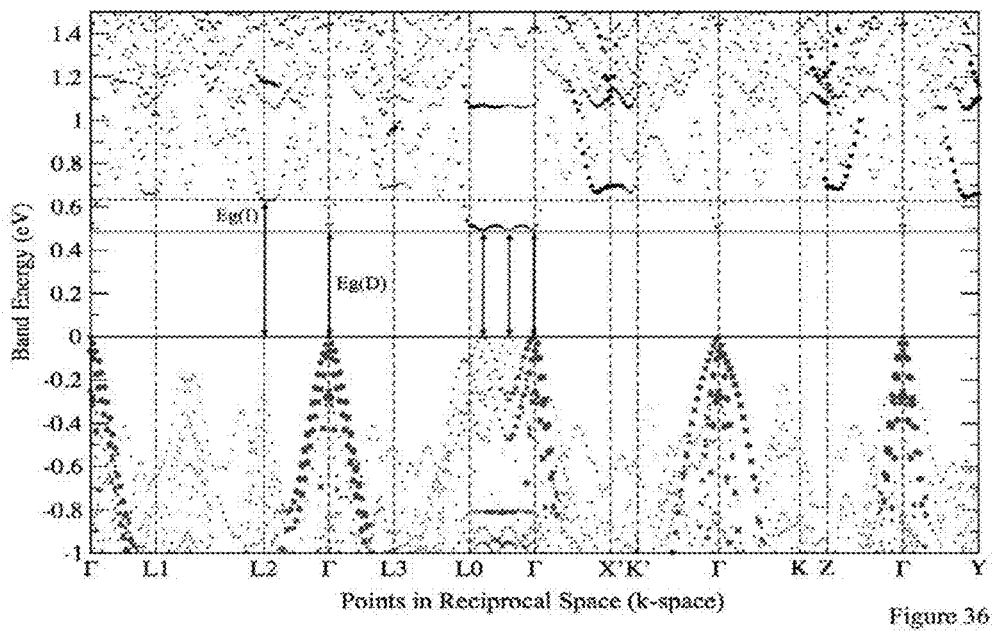
FIG. 36 is the simulated band structure for the superlattice cell represented by $(Si_4C)_2$—$(Ge_5)_3$ grown on the (111) face of silicon.
Figure 37:
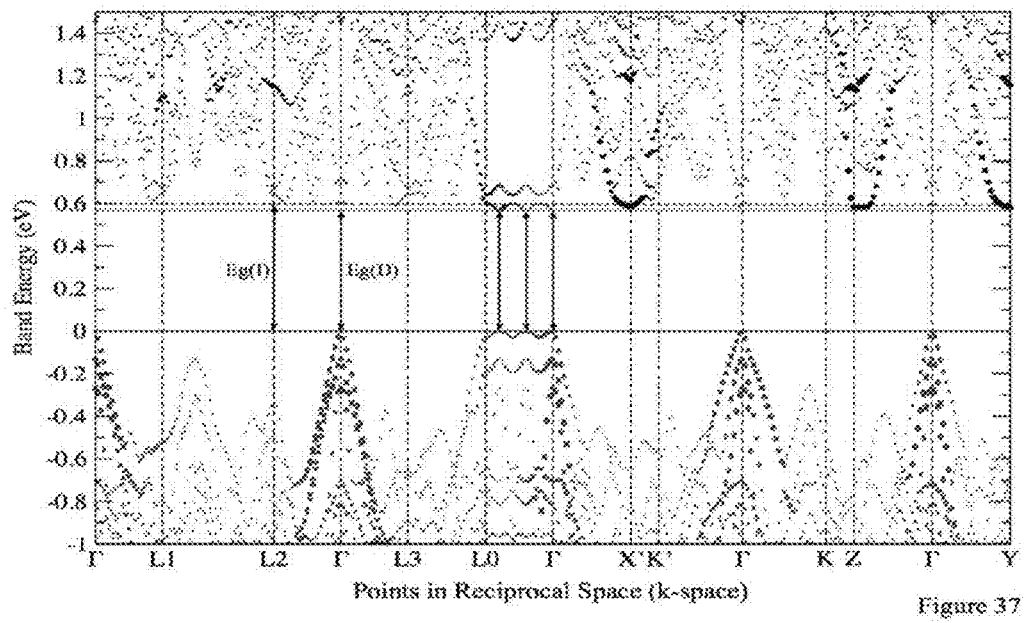
FIG. 37 is the simulated band structure for the superlattice cell represented by $(Si_4C)_3$—$(Ge_5)_2$ grown on the (111) face of silicon.
Figure 38:
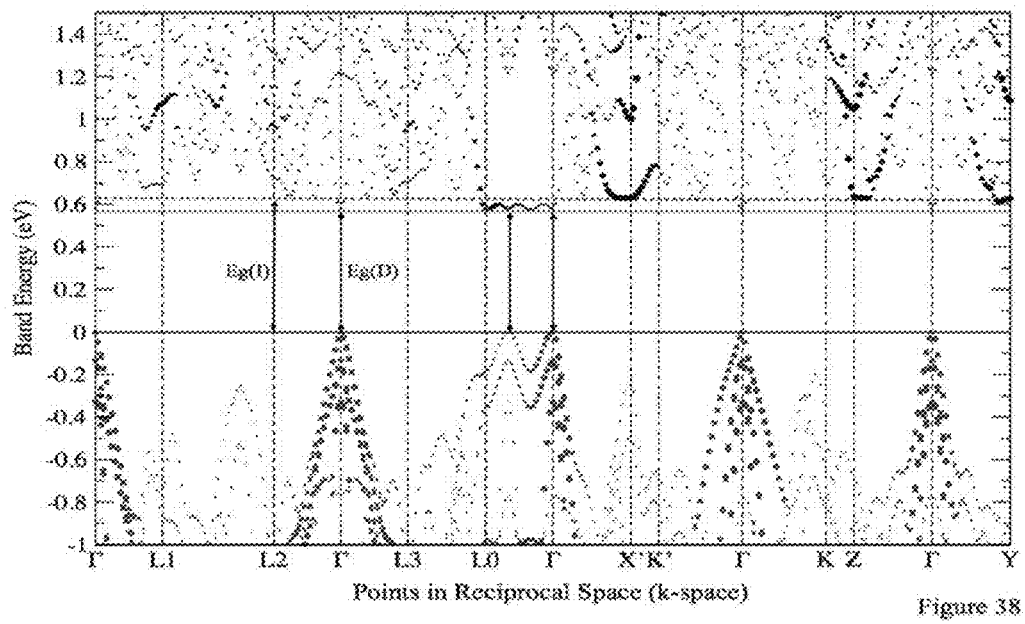
FIG. 38 is the simulated band structure for the superlattice cell represented by $(Si_4C)_3$—$(Ge_5)_3$ grown on the (111) face of silicon.
Figure 39:
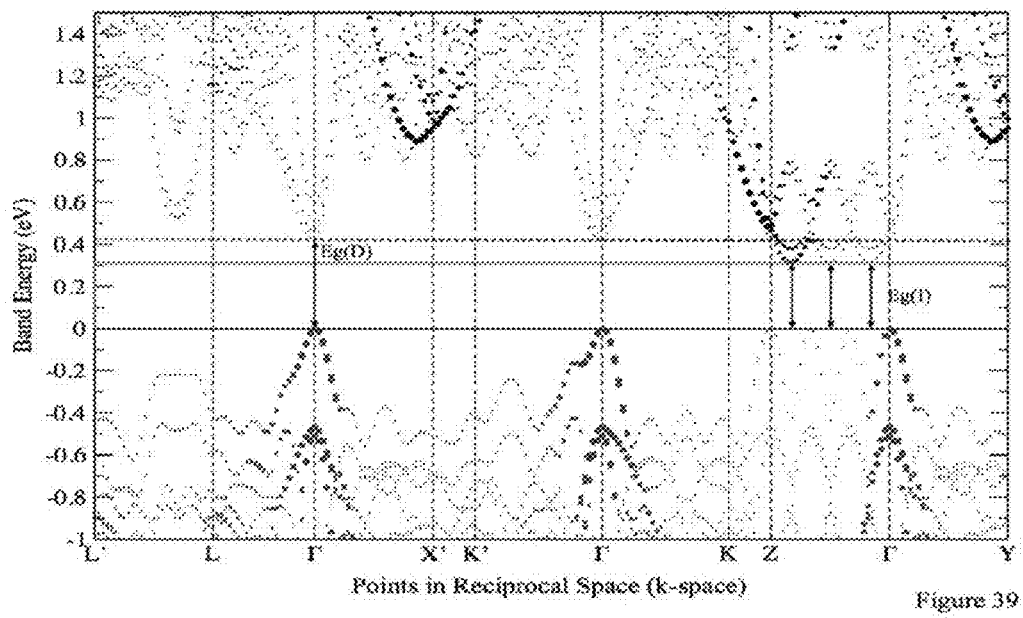
FIG. 39 is the simulated band structure for the superlattice cell represented by $(Si_4C)_5$—$(Ge_5)_1$—$(Si_5)_5$—$(Ge_5)_1$ grown on the (100) face of silicon.
Figure 40:
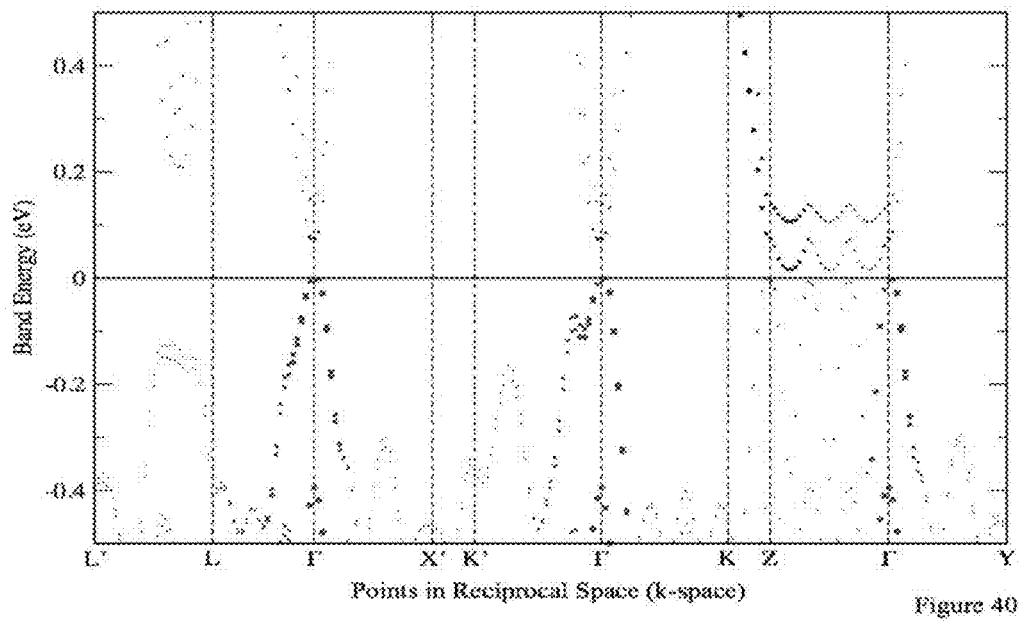
FIG. 40 is the simulated band structure for the superlattice cell represented by $(Si_4C)_5$—$(Si_5)_5$—$(Ge_5)_2$ grown on the (100) face of silicon.
Figure 41:
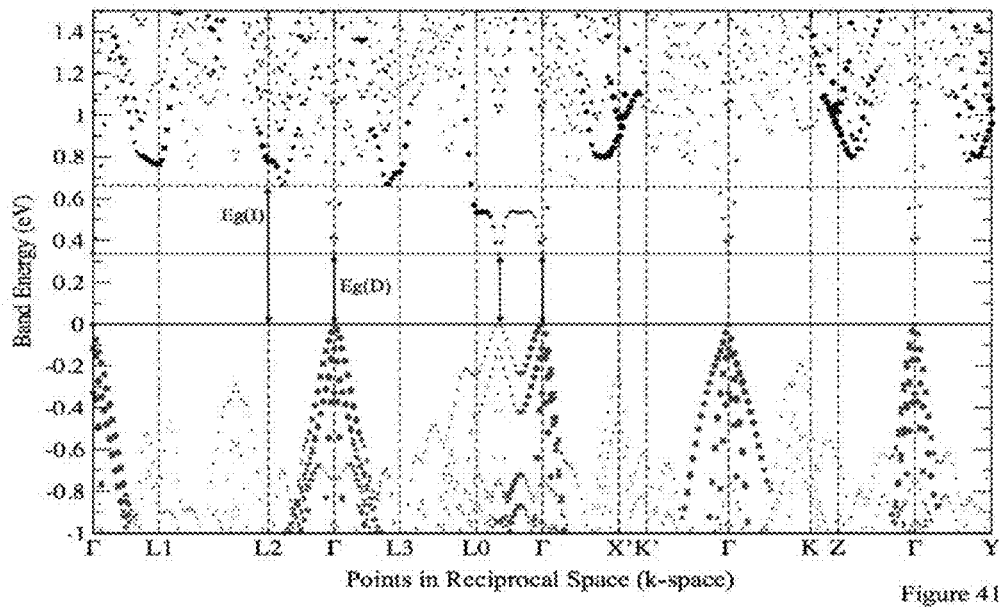
FIG. 41 is the simulated band structure for the superlattice cell represented by $(Ge_4C)_3$—$(Ge_5)_3$ grown on the (111) face of silicon.

| Superlattice Cell | Surface orientation of silicon | Bandgap Type and Magnitude [eV] | Band structure plot |
|---|---|---|---|
| $(Si_4C)_2$—$(Ge_5)_2$ | (100) | Eg(I) = 0.710<br>Eg(D) = 0.740 | FIG. 25 |
| $(Si_4C)_4$—$(Ge_5)_3$ | (100) | Eg(D) = 0.277<br>(Eg): 0.295 | FIG. 26 |
| $(Ge_4C)_5$—$(Ge_5)_5$ | (100) | Eg(D) = 0.815<br>Eg(I) = 0.817 | FIG. 13 |
| $(Ge_4C)_2$—$(Ge_5)_3$ | (111) | Eg(D) = 0.385<br>Eg(I) = 0.648 | FIG. 21 |
| $(Ge_4C)_3$—$(Ge_5)_2$ | (111) | Eg(D) = 0.304<br>Eg(I) = 0.700 | FIG. 18 |
| $(Ge_4C)_3$—$(Ge_5)_4$ | (111) | Eg(D) = 0.286<br>Eg(I) = 0.633 | FIG. 19 |
| $(Ge_4C)_3$—$(Ge_5)_5$ | (111) | Eg(D) = 0.262<br>Eg(I) = 0.595 | FIG. 20 |
| $(Ge_4C)_4$—$(Ge_5)_3$ | (111) | Eg(D) = 0.467<br>Eg(I) = 0.770 | FIG. 22 |
| $(Ge_4C)_4$—$(Ge_5)_2$ | (111) | Eg(D) = 0.523<br>Eg(I) = 0.913 | FIG. 29 |
| $(Ge_4C)_5$—$(Ge_5)_2$ | (111) | Eg(D) = 0.413<br>Eg(I) = 0.667 | FIG. 30 |
| $(Ge_4C)_5$—$(Ge_5)_3$ | (111) | Eg(D) = 0.432<br>Eg(I) = 0.714 | FIG. 31 |
| $(Ge_4C)_6$—$(Ge_5)_2$ | (111) | Eg(D) = 0.493<br>Eg(I) = 0.860 | FIG. 32 |
| $(Ge_4C)_6$—$(Ge_5)_4$ | (111) | Eg(D) = 0.442<br>Eg(I) = 0.831 | FIG. 33 |
| $(Ge_4C)_7$—$(Ge_5)_3$ | (111) | Eg(D) = 0.451<br>Eg(I) = 0.515 | FIG. 34 |
| $(Ge_4C)_8$—$(Ge_5)_2$ | (111) | Eg(D) = 0.427<br>Eg(I) = 0.890 | FIG. 35 |
| $(Si_4C)_2$—$(Ge_5)_3$ | (111) | Eg(D) = 0.489<br>Eg(I) = 0.630 | FIG. 36 |
| $(Si_4C)_3$—$(Ge_5)_2$ | (111) | Eg(D) = 0.568<br>Eg(I) = 0.580 | FIG. 37 |
| $(Si_4C)_3$—$(Ge_5)_3$ | (111) | Eg(D) = 0.578<br>Eg(I) = 0.631 | FIG. 38 |

Figure 3:
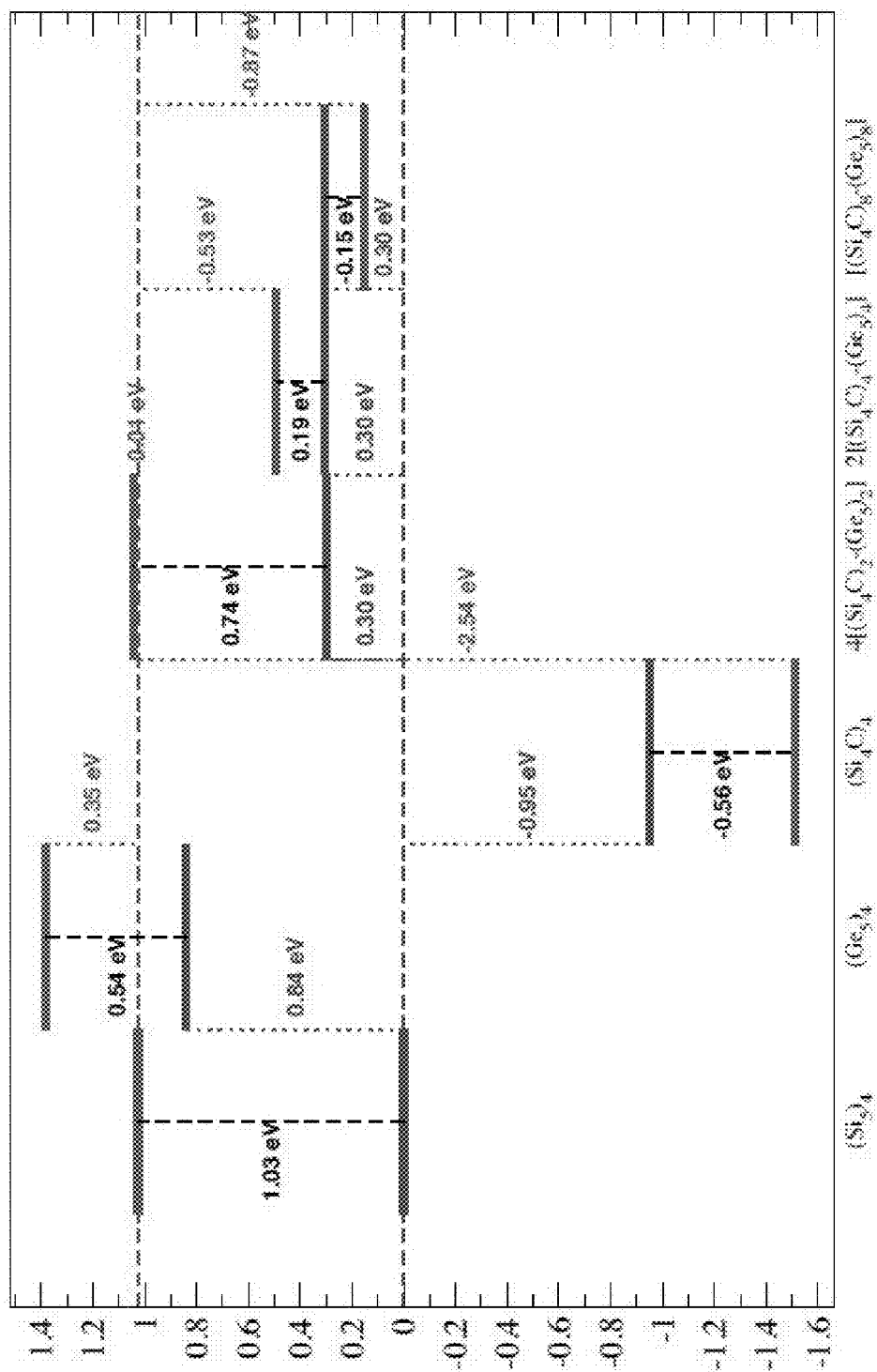
FIG. 3 shows ab-initio simulation results for the valence and conduction band offsets for several superlattice cells and the valence and conduction band offsets for the atomic planes in those cells.

It may be possible to use the above materials to engineer a superlattice with a particular bandgap. FIG. 3 compares simulation results for the valence and conduction bands for three of the above superlattice cells to the valence and conduction bands for the individual atomic planes. For instance, FIG. 3 shows the valence and conduction bands for Ge, using a $(Ge_5)_4$ cell, and for $Si_4C$ using a $(Si_4C)_4$ cell, relative to Si, using a $(Si_5)_4$ cell. $Ge_5$ and $Si_4C$ are the chemical compositions for each of the atomic planes used to construct the superlattices $4[(Si_4C)_2$—$(Ge_5)_2]$, $2[(Si_4C)_4$—$(Ge_5)_4]$, and $(Si_4C)_8$—$(Ge_5)_8$. In FIG. 3, the $Si_5$, $Ge_5$, $Si_4C$, $4[(Si_4C)_2$—$(Ge_5)_2]$, $2[(Si_4C)_4$—$(Ge_5)_4]$, and $(Si_4C)_8$—$(Ge_5)_8$ are grown on the (100) surface of silicon. The numbers preceding the superlattice cell notation indicate the number of cells used for the calculation of the band alignments. For instance, $4[(Si_4C)_2$—$(Ge_5)_2]$ indicates that a "supercell" that is 4 superlattice cells thick where each cell is represented by $(Si_4C)_2$—$(Ge_5)_2$.

There are several surprising results evident in FIG. 3. For instance, prior research indicates that superlattices that alternate layers of silicon and germanium strained to silicon (100) surfaces could not produce a bandgap smaller than the bandgap of pure germanium. However, $2[(Si_4C)_4$—$(Ge_5)_4]$ shows a bandgap lower than the bandgap of pure germanium. Additionally, $Si_4C$, strained to silicon (100) surfaces, has a negative bandgap and is accordingly a semimetal in its bulk form, but when its thickness is just a few atomic planes it becomes a positive bandgap semiconductor, due to quantization effects. However, the superlattices that include $Si_4C$ atomic planes can have positive bandgaps as shown in the case of $4[(Si_4C)_2$—$(Ge_5)_2]$, and $2[(Si_4C)_4$—$(Ge_5)_4]$. The band structures for other superlattices that include $Si_4C$ are presented below also have positive bandgaps. Accordingly, the superlattices can include one or more lattice planes having a chemical composition associated with negative bandgaps. For instance, the superlattice can include one or more atomic planes that individually have negative bandgaps when grown on the same substrate.

The three different superlattice cells used to generate FIG. 3 each had the same surface orientation and the same atomic planes but have different numbers of atomic planes. Varying the number of atomic planes in a superlattice cell produces vastly different bandgaps as a result of quantum effects. However, a closer look at the results provides another surprising result, the valence band at a level between the valence band of $(Ge_5)_4$ and $(Si_4C)_4$. The valence band remains at a constant level despite the number of atomic planes for both $(Ge_5)_4$ and $(Si_4C)_4$ being increased in the superlattice cell. Surprisingly, this result is in contrast to the results for the conduction band. As the number of atomic planes is increased, the conduction band begins to drop toward the conduction band of the $Si_4C$. This result indicates that the $(Si_4C)$ atomic planes dominate the level of the conduction band in the superlattice and that the conduction band of the superlattice approaches the conduction band of $(Si_4C)_4$ as the number of $(Si_4C)$ atomic planes increases. These results indicate that it may be possible to design the superlattice cells so as to achieve particular bandgaps and/or conduction band alignments by changing the number of atomic planes in the superlattice cell.

The above atomic planes can be grown on the substrate surface using techniques such as epitaxial growth techniques including epitaxial pseudomorphic growth. In some instances, epitaxial pseudomorphic growth is achieved through the use of chemical vapor deposition (CVD). As noted above, the use of carbon in the atomic planes can cause the atomic planes to have a lattice constant that is closer to the lattice constant of desirable substrates such as silicon. The proximity of these lattice constants allows these atomic planes to be grown directly on the substrate surface.

In CVD, the substrate surface is exposed to one or more volatile precursors, which react and/or decompose on the substrate surface to produce the desired material. CVD techniques can grow random atomic planes on a substrate surface. In order to achieve the ordered atomic planes disclosed above, the precursors can include all or a portion of the chemical bonds that are desired for the atomic plane. For instance, suitable precursors for forming an atomic plane of $Si_4C$ on a silicon surface include, but are not limited to $C(SiH_3)_4$, $C(SiD_3)_4$, $(SiH_3)_2CH_2$, and $(SiD_3)_2CD_2$, where "D" stands for Deuterium. Suitable precursors for forming an atomic plane of $Ge_4C$ on a silicon surface include, but are not limited to, $C(GeH_3)_4$, $C(GeD_3)_4$, $(GeH_3)_2CH_2$, and $(GeD_3)_2CD_2$. Suitable precursors for forming an atomic plane of $Sn_4C$ on a silicon surface include, but are not limited to $C(SnH_3)_4$, $C(SnD_3)_4$, $(SnH_3)_2CH_2$, and $(SnD_3)_2CD_2$. Suitable precursors for forming an atomic plane of $Si_6C_2$ on a silicon surface include, but are not limited to $C_2(SiH_3)_6$, $C_2(SiD_3)_6$, $(SiH_3)_4C_2H_2$, and $(SiD_3)_4C_2D_2$. Suitable precursors for forming an atomic plane of $Ge_6C_2$ on a silicon surface include, but are not limited to, $C_2(GeH_3)_6$, $C_2(GeD_3)_6$, $(GeH_3)_4C_2H_2$, and $(GeD_3)_4C_2D_2$. Suitable precursors for forming an atomic plane of $Sn_6C_2$ on a silicon surface include, but are not limited to, $C_2(SnH_3)_6$, $C_2(SnD_3)_6$, $(Sn—H_3)_4C_2H_2$, and $(SnD_3)_4C_2D_2$. Suitable precursors for forming $SiGe_3C$ on a silicon surface include, but are not limited to $C(SiH_3)(GeH_3)_3$ and $C(SiD_3)(GeD_3)_3$. Suitable precursors for forming $Si_3GeC$ on a silicon surface include, but are not limited to $C(SiH_3)_3(GeH_3)$ and $C(SiD_3)_3(GeD_3)$. Suitable precursors for forming $SiSn_3C$ on a silicon surface include, but are not limited to $C(SiH_3)(SnH_3)_3$ and $C(SiD_3)(SnD_3)_3$. Suitable precursors for forming $Si_3SnC$ on a silicon surface include, but are not limited to $C(SiH_3)_3(SnH_3)$ and $C(SiD_3)_3(SnD_3)$. Suitable precursors for forming $GeSn_3C$ on a silicon surface include, but are not limited to $C(GeH_3)(SnH_3)_3$ and $C(GeD_3)(SnD_3)_3$. Suitable precursors for forming $Ge_3SnC$ on a silicon surface include, but are not limited to $C(GeH_3)_3(SnH_3)$ and $C(GeD_3)_3(SnD_3)$. Suitable precursors for forming $Si_2Ge_2C$ on a silicon surface include, but are not limited to $C(SiH_3)_2(GeH_3)_2$ and $C(SiD_3)_2(GeD_3)_2$. Suitable precursors for forming $Si_2Sn_2C$ on a silicon surface include, but are not limited to $C(SiH_3)_2(SnH_3)_2$ and $C(SiD_3)_2(SnD_3)_2$. Suitable precursors for forming $Si_2Ge_2C$ on a silicon surface include, but are not limited to $C(SiH_3)_2(GeH_3)_2$ and $C(SiD_3)_2(GeD_3)_2$. Suitable precursors for forming $Ge_2Sn_2C$ on a silicon surface include, but are not limited to $C(GeH_3)_2(SnH_3)_2$ and $C(GeD_3)_2(SnD_3)_2$. Suitable precursors for forming ordered alloys with $Si_{0.5}Ge_{0.5}$ stoichiometry on a silicon surface include, but are not limited to $SiH_3GeH_3$, $SiD_3GeD_3$, $(GeH_3)_2(SiH_2)_2$, $(GeD_3)_2(SiD_2)_2$, $GeH_3(SiH_2)_2GeH_3$, $GeD_3(SiD_2)_2GeD_3$. Suitable precursors for forming ordered alloys with $Si_{0.5}Sn_{0.5}$ stoichiometry on a silicon surface include, but are not limited to $SiH_3SnH_3$, $SiD_3SnD_3$, $(SnH_3)_2(SiH_2)_2$, $(SnD_3)_2(SiD_2)_2$, $SnH_3(SiH_2)_2SnH_3$, $SnD_3(SiD_2)_2SnD_3$. Suitable precursors for forming ordered alloys with $Sn_{0.5}Ge_{0.5}$ stoichiometry on a silicon surface include, but are not limited to $SnH_3GeH_3$, $SnD_3GeD_3$, $(GeH_3)_2(SnH_2)_2$, $(GeD_3)_2(SnD_2)_2$, $GeH_3(SnH_2)_2GeH_3$, $GeD_3(SnD_2)_2GeD_3$. Suitable precursors for forming ordered alloys with $Si_{0.33}Ge_{0.67}$ stoichiometry on a silicon surface include, but are not limited to $(GeH_3)_3SiH$, $(GeD_3)_3SiD$. Suitable precursors for forming ordered alloys with $Si_{0.67}Ge_{0.33}$ stoichiometry on a silicon surface include, but are not limited to $(SiH_3)_3GeH$, $(SiD_3)_3GeD$. Suitable precursors for forming ordered alloys with $Si_{0.33}Sn_{0.67}$ stoichiometry on a silicon surface include, but are not limited to $(SnH_3)_3SiH$, $(SnD_3)_3SiD$. Suitable precursors for forming ordered alloys with $Si_{0.67}Sn_{0.33}$ stoichiometry on a silicon surface include, but are not limited to $(SiH_3)_3SnH$, $(SiD_3)_3SnD$. Suitable precursors for forming ordered alloys with $Ge_{0.67}Sn_{0.33}$ stoichiometry on a silicon surface include, but are not limited to $(GeH_3)_3SnH$, $(GeD_3)_3SnD$. Suitable precursors for forming ordered alloys with $Ge_{0.33}Sn_{0.67}$ stoichiometry on a silicon surface include, but are not limited to $(SnH_3)_3GeH$, $(SnD_3)_3GeD$. Suitable precursors for forming ordered alloys with $Si_{0.25}Ge_{0.75}$ stoichiometry on a silicon surface include, but are not limited to $(GeH_3)_3SiH$, $(GeD_3)_3SiD$. Suitable precursors for forming ordered alloys with $Si_{0.75}Ge_{0.25}$ stoichiometry on a silicon surface include, but are not limited to $(SiH_3)_3GeH$, $(SiD_3)_3GeD$. Suitable precursors for forming ordered alloys with $Si_{0.25}Sn_{0.75}$ stoichiometry on a silicon surface include, but are not limited to $(SnH_3)_3SiH$, $(SnD_3)_3SiD$. Suitable precursors for forming ordered alloys with $Si_{0.75}Sn_{0.25}$ stoichiometry on a silicon surface include, but are not limited to $(SiH_3)_3SnH$, $(SiD_3)_3SnD$. Suitable precursors for forming ordered alloys with $Ge_{0.25}Sn_{0.75}$ stoichiometry on a silicon surface include, but are not limited to $(SnH_3)_3GeH$, $(SnD_3)_3GeD$. Suitable precursors for forming ordered alloys with $Sn_{0.25}Ge_{0.75}$ stoichiometry on a silicon surface include, but are not limited to $(GeH_3)_3SnH$, $(GeD_3)_3SnD$.

As noted above, a superlattice system can include multiple superlattices on a common substrate as disclosed in the context of FIG. 1C. When the different superlattices are to have the same chemical composition, different superlattices can be concurrently grown on the common substrate by using the same epitaxial growth steps. As noted above, the different superlattices will have different band structures even when they have common compositions. The gap between the different superlattices can be created by placing a mask between the different crystal faces prior to the epitaxial growth. Suitable masks include, but are not limited to, hard masks such as oxide and/or nitride masks.

The thickness of the superlattice is labeled T in FIG. 1A. In some instances, the thickness of the superlattice is limited by the lattice constant of the substrate surface and/or the lattice constant of the superlattice components. As is evident from FIG. 1A, the superlattice includes multiple interfaces between different crystals. For instance, there is an interface between the substrate surface and the first atomic plane of the superlattice. There is also an interface between atomic planes having different chemical compositions. There is a difference between the lattice constants at each of these interfaces. Accordingly, each interface is associated with a lattice constant differential. The lattice constant differentials can be summed up across the superlattice. As the sum of the superlattice constant differentials increases, the superlattice becomes more strained. The superlattice can become so strained that the superlattice breaks. The thickness at which breakage occurs is known as the critical thickness. As a result, for certain compositions, the thickness of the superlattice may be limited by the superlattice constant differentials across the total thickness of the superlattice. In some instances, the above superlattices have a thickness that is more than 2, 5, or 10 superlattice cells and/or less than 100, 200, or 400 superlattice cells. Additionally or alternately, the disclosed superlattices can have a thickness that is more than 5 nm or 10 nm and/or less than 50 nm, 100 nm, or 200 nm. A suitable lattice constant for the atomic plane bonded to the substrate includes, but is not limited to, the lattice constant of the substrate+/−5%, 10%, or 15% of the lattice constant of the substrate. On the other hand, for certain superlattice compositions, the combination of chemical composition of each atomic plane and the number of atomic planes for each constituent of the superlattice may result in at least partial strain compensation for the superlattice cell, thereby increasing the critical thickness.

As will become most evident from the examples set forth below, the wide range of band structures and band alignments possible between the disclosed superlattice components as well as the alignments obtainable between the superlattice itself and a single superlattice component provides a large degree of freedom for the applications of the above superlattices. For instance, the above superlattices have a variety of applications in electronics, optics, and optoelectronics. As an example, the above superlattices can be employed as all or a portion of the active medium is lasers such as semiconductor lasers, laser diodes, and other light sources such as light emitting diodes; as all or a portion of the light absorbing medium in light sensors such as photodiodes; and/or as one or more of the components selected from the group consisting of the source, channel, and drain of conventional Metal-Oxide-Semiconductor Field-Effect Transistor (MOSFET), in particular for Tunnel MOSFETs, which are most straightforward to implement as Vertical MOSFETs or Vertical Tunnel MOSFETs, wherein source, channel and drain regions are all epitaxially grown sequentially in the same epitaxial growth run/step.

Figure 4A:
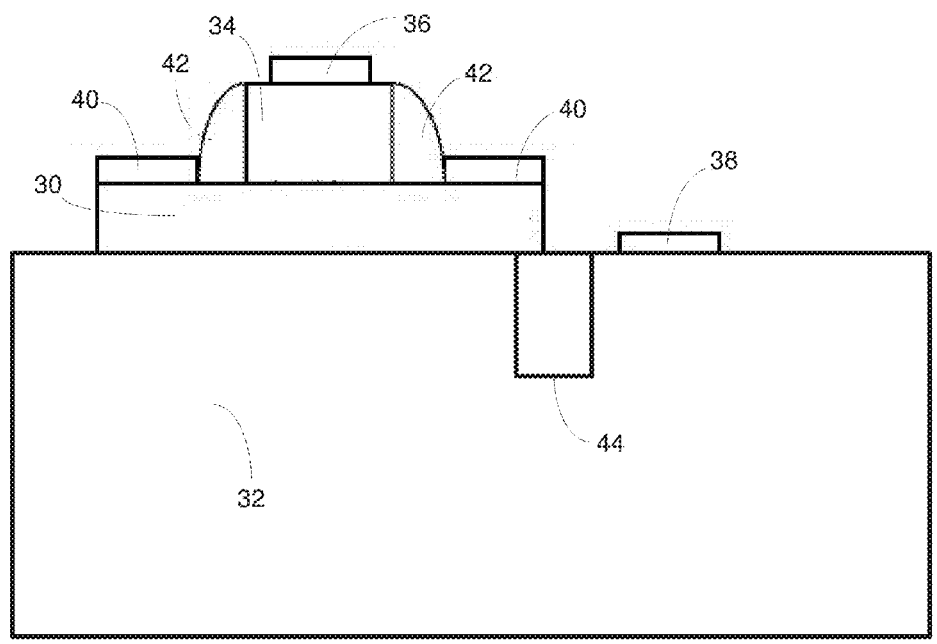
FIG. 4A is a cross section of a heterojunction bipolar transistor (HBT) that includes a superlattice.

An example of an application of the above superlattice is the use of these superlattices in a transistor such as a heterojunction bipolar transistor (HBT). FIG. 4A is a cross section of a heterojunction bipolar transistor (HBT). The heterojunction bipolar transistor (HBT) includes a base 30 positioned between a collector 32 and an emitter 34 such that charges flow between the collector 32 and the emitter 34 through the base 30. The base 30 is in direct physical contact with both the collector 32 and the emitter 34. An emitter electrical contact 36 is in electrical communication with the emitter 34. A collector electrical contact 38 is in electrical communication with the collector 32. Base electrical contacts 40 are in electrical communication with the base 30. An insulating spacer 42 is located between each of the base electrical contacts 40 and the emitter 34 and can provide electrical insulation between the base electrical contacts 40 and the emitter 34. The emitter electrical contact 36, collector electrical contact 38, and base electrical contacts 40 can be used to apply electrical energy to the transistor during operation of the transistor. A shallow trench isolation structure 44 can extend into the collector 32.

Suitable materials for the spacer 42 include, but are not limited to dielectric materials such as silicon oxide. Suitable materials for the shallow trench isolation structure include, but are not limited to, dielectric materials such as silicon oxide. Suitable materials for the collector 32 include, but are not limited to, silicon. Suitable materials for the emitter 34 include, but are not limited to, mono-crystalline silicon, which can be epitaxially grown in the same growth sequence that forms the base layer, and poly-crystalline silicon, typically deposited after the formation of a mono-layer thick silicon-oxide on top of the base layer. The base 30 can include or consist of one or more of the disclosed superlattices and/or one or more of the disclosed superlattice systems. The disclosed superlattices can provide smaller charge carrier masses and higher mobility, leading to higher values of the transit time frequency (Ft) and the maximum oscillation frequency (Fmax) for the transistor. There is also the possibility that the superlattices can lower the strain in the base, when compared to conventional random alloys.

When the transistor of FIG. 4A is a NPN heterojunction bipolar transistor (HBT), the emitter 34 can be doped so as to be an n-type emitter, the base 30 can be doped so as to be a p-type base, and the collector 32 can be doped so as to be an n-type collector. The variety of band alignments possible with the disclosed superlattices opens the possibility of fabricating PNP heterojunction bipolar transistor (HBT). When the transistor of FIG. 4A is a PNP heterojunction bipolar transistor (HBT), the emitter 34 can be can be doped so as to be a p-type emitter, the base 30 can be doped so as to be an n-type base, and the collector 32 can be can be doped so as to be a p-type collector.

When a superlattice is used as the base 30 of a bipolar transistor (HBT), the collector 32 can serve as the substrate for epitaxial growth. For instance, the superlattice can be grown on the collector 32. In some instances, the emitter 34 includes or consists of one or more the disclosed superlattices and/or one or more of the disclosed superlattice systems and/or the base 30 includes or consists of one or more the disclosed superlattices and/or one or more of the disclosed superlattice systems. Accordingly, in some instances, the emitter 34 can be grown on the base 30.

Figure 4B:
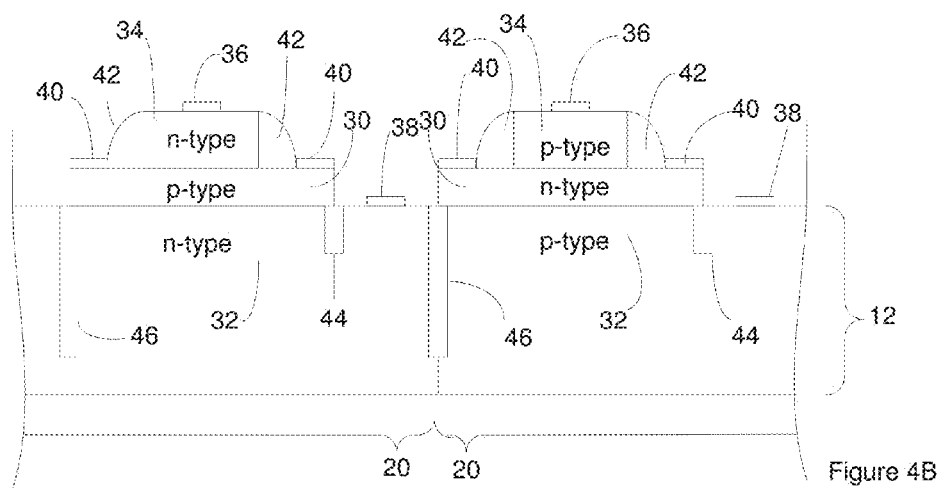
FIG. 4B is a cross section of a system that includes multiple heterojunction bipolar transistors (HBTs) built on the same substrate where different HBTs include different superlattices.

As noted above, a substrate surface can include multiple crystal faces. This feature can be used to integrate both PNP heterojunction bipolar transistors (HBT) and NPN heterojunction bipolar transistors (HBT) onto the same substrate. FIG. 4B is a cross section of a superlattice system that includes multiple heterojunction bipolar transistors (HBTs) built on the same substrate. Deep trench isolation structures 46 can extend into the collector 32 in order to electrically insulate adjacent transistors from one another. Suitable materials for the deep trench isolation structure include, but are not limited to, dielectric materials such as silicon oxide.

The doping pattern illustrate in FIG. 4B shows that one of the HBTs is an NPN HBT and the other HBT is a PNP HBT. The superlattices included in the base 30 of the different HBTs can be the same or different. Even when the cells for the superlattices included in the base 30 of different HBTs have the same formula, the superlattices will be impacted by strain differently, and will accordingly have different band structures. This feature allows the superlattice that is used as the base 30 for different HBTs to be tailored to the band structure that is desired for that HBT. The superlattices included in the base 30 of different HBTs need not be grown on different faces of the surface. In this instance, the superlattices can be different in order to provide the base 30 of the NPN HBT with functionality that is different from the base 30 of the PNP HBT.

Although the transistors disclosed in the context of FIG. 4B employ a substrate with multiple crystal faces, the integration of NPN HBT and the PNP HBT on the same substrate does not require there to be multiple crystal faces, although the presence of multiple crystal faces increase the opportunities for bandgap and band offset engineering.

Figure 5A:
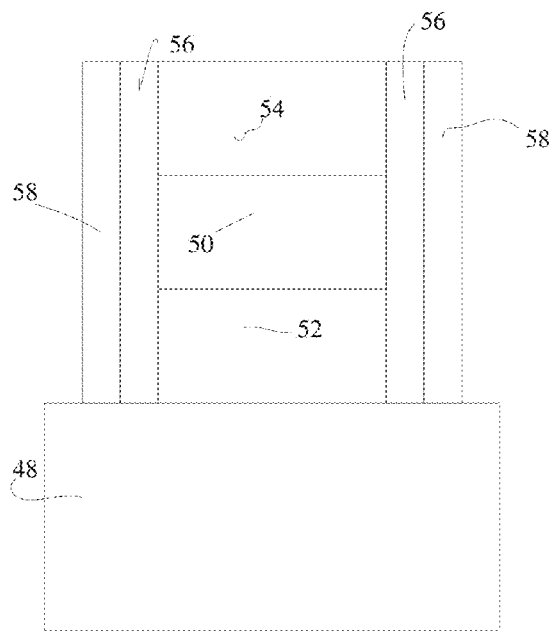
FIG. 5A is a cross section of a vertical MOSFET.

Another example of an application of the above superlattices in a transistor is the use of these superlattices in field effect transistors (FETs) such as such as metal-oxide-semiconductor field-effect transistor (MOSFET). For instance, the above superlattices can serve as one or more of the source, drain, and channel of a MOSFET. FIG. 5A is a cross section of a vertical MOSFET. The MOSFET includes components positioned on a base substrate 48. The components include a channel 50 positioned between a first region 52 and a second region 54 such that during operation of the transistor charges flow between the first region 52 and the second region 54 through the channel 50. The channel 50 can be in direct physical contact with both the first region 52 and the second region 54. The first region 52 can be the drain or source for the transistor. The second region 54 can be the drain or source for the transistor. When the first region 52 is the drain for the transistor, the second region 54 is the source and when the first region 52 is the source for the transistor, the first region 52 is the drain. The first region 52, the second region 54, and the channel 50 can each be different materials.

A gate insulator 56 is positioned between a gate electrode 58 and the channel 50. The gate insulator 56 can also be positioned between the first region 52 and the gate electrode 58 and between the gate electrode 58 and the second region 54. Although not illustrated, the transistor can include a terminal in electrical communication with the gate electrode 58, a terminal in electrical communication with the first region 52, and a terminal in electrical communication with the second region 54. Electronics (not shown) can be in electrical communication with each of the terminals and can be configured to apply electrical energy to the terminals in order to operate the transistor. Suitable materials for a gate insulator 56 include, but are not limited to dielectric materials such as silicon oxide, Si-oxynitride, High-K metal-oxide and metal-oxinitride materials, such as for example, Hf-oxide, Al-oxide, metal-alloy oxides, such as HfAl-oxide, and HfAlZr-oxide. Suitable materials for the gate electrode 58 include, but are not limited to, electrically conducting materials such as highly-doped poly-silicon, metals such as Al, Cu, etc, which can be interfaced directly with the gate insulator, or can be deposited on a barrier metal(s) which is positioned in-between the gate oxide and the gate electrode. "Barrier metal(s)", such as TiN, TiSiN, TaN, WN, and others, can be used to engineer the work-function that strongly impacts the threshold voltage (VT) of the MOSFETs, in addition to providing a physio-chemical barrier to reduce the chance of chemical reactions between a metal gate electrode and the gate insulator. Suitable materials for the base substrate 48 include, but are not limited to, silicon with a surface having one or more crystalline orientations, and germanium with a surface having one or more crystalline orientations.

The disclosed superlattices can serve as any one, any two or all three of the components selected from the group consisting of the first region 52, the second region 54, and the channel 50. For instance, one, two, or three components selected from the first region 52, the second region 54, and the channel 50 can each include or consist of one or more of the disclosed superlattices. In some instances, two or three of the components each includes or consists of one or more of the disclosed superlattices. When a component includes multiple superlattices, the superlattices can be stacked as disclosed in the context of FIG. 1B.

One or two of the components selected from the group consisting of the first region 52, the second region 54, and the channel 50 can include or consist of bulk semiconductor materials. In some instance, three of the components include bulk semiconductor materials and one or more the components include one or more of the disclosed superlattices. In some instances, one of the components includes or consists of one or more of the disclosed superlattices and the other two components each excludes any superlattices or excludes any superlattices that include carbon. In some instances, two of the components includes or consists of one or more of the disclosed superlattices and the remaining component excludes any superlattices or excludes any superlattices that include carbon. In instances where a component excludes any superlattices or excludes any superlattices that include carbon, the component can include or consist of a bulk semiconductor that is a single-element semiconductor or a multi-element semiconductor.

Suitable bulk materials include, but are not limited to, Si, random alloys of $Si_{1-x}Ge_x$ where x is greater than or equal to 0 and/or less than or equal to 1, $Si_{1-y}C_y$ where y is greater than or equal to 0 or 0.1 and/or less than or equal to 0.25, $Si_{1-x-y}Ge_xC_y$ where x is greater than or equal to 0 or 0.1 and/or less than or equal to 1 and y is greater than or equal to 0 or 0.01 and/or less than or equal to 0.25. In one example, a disclosed superlattices serves as the first region 52 and/or the channel 50. In another example, a disclosed superlattices serves as the first region 52 and/or the channel 50 and one or more bulk random alloys serve as the remaining components. The substrate 12 disclosed in the superlattice systems can serve as the base substrate 48. Alternately, the first region 52 or the channel 50 can serve as the substrate of one of the disclosed superlattice systems. As a result, the first region 52, the second region 54, and the channel 50 can all be epitaxially grown on the base substrate 48. For instance, the first region 52 can be epitaxially grown on the base substrate 48, the channel 50 can be epitaxially grown on the first region 52, and the second region can all be epitaxially grown on the channel 50. Other advantages of the disclosed configuration include control of critical dimensions through heterojunction and doping profiles defined with atomic layer precision during the epitaxial growth process, which can be a mono-layer self-limiting growth process, rather than depending on patterning process steps involving lithography and etch. Additionally, the wide variety of bandgap magnitudes and band offsets between superlattices with different compositions, and between superlattices and materials such as silicon and germanium, provide a much larger parameter space for bandgap engineering of the different regions of the MOSFETs.

The transistor of FIG. 5A can be a PMOS transistor or an NMOS transistor. For instance, a PMOS transistor results when the first region 52 is doped so as to be a p-type first region, the channel 50 is doped so as to be an n-type channel, and the second region 54 is doped so as to be a p-type second region. A NMOS transistor results when the first region 52 is doped so as to be an n-type first region, the channel 50 is doped so as to be an p-type channel, and the second region 54 is doped so as to be a n-type second region.

Figure 5B:
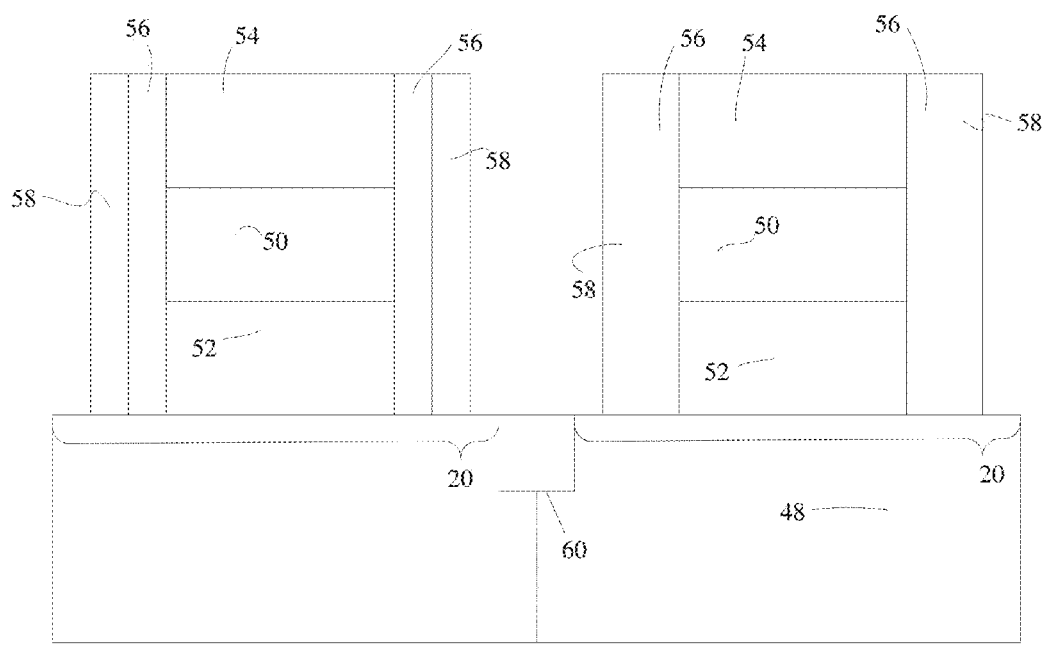
FIG. 5B is a cross section of a superlattice system that includes multiple MOSFETs on the same base.

As noted above, a substrate surface can include multiple crystal faces. This feature can be used to integrate both NMOS and PMOS transistors onto the same base substrate 48 or even to integrate different NMOS transistors onto the same base substrate 48 or to integrate different PMOS transistors onto the same base substrate 48. FIG. 5B is a cross section of a superlattice system that includes multiple MOSFETs on the same base substrate 48. Deep trench isolation structures or shallow trench isolation structures 60 can extend into the base substrate 48 in order to electrically isolate adjacent transistors from one another. The base substrate 48 includes two or more crystal faces 20 positioned on a surface. The crystal faces can be different and the deep trench isolation structures or shallow trench isolation structures 60 can be positioned between different crystal faces. Suitable materials for the deep trench isolation structures or shallow trench isolation structures 60 include, but are not limited to, dielectric materials such as silicon oxide.

One of the MOSFETs shown in FIG. 5B can be a NMOS transistor and the other MOSFET can be a PMOS transistor. Alternately, both of the MOSFETs shown in FIG. 5B can be NMOS transistors or both of the MOSFETs shown in FIG. 5B can be PMOS transistors. The one or more superlattices included in each of the different MOSFET can be the same or different. Even when the cells for the superlattices included in one or more of the components (first region 52, second regions 54, and channel 50) of different transistors have the same formula, the impact of strain on the band structure of the superlattices will be different due to the different crystal orientations of the crystalline surfaces on which they are epitaxially grown. Accordingly, these superlattices will have one, two, three or more than three different features selected from the group consisting of different bandgap types (direct versus indirect), different bandgap magnitudes, different electron and hole effective masses, different oscillator strengths, and different intrinsic carrier concentrations. As a result, the devices incorporating them will have different performance characteristics. Since the same superlattice in the MOSFETs on different crystal faces provides different band structure and/or band alignments, the same epitaxial growth steps can be used to produce MOSFETs with different characteristics and performance levels. Advantages of this include, the possibility of fabricating MOSFETs with key regions having different bandgap magnitudes, and consequently the ability to operate at different operating voltages.

Although FIG. 5A and FIG. 5B show the first region 52 bonded to the base substrate 48, the second region 54 can be bonded to the base substrate 48. For instance, the second region 54 can be grown on the base substrate 48 and the channel 50 can then be grown on the second region 54 and the first region can then be grown on the channel.

Although the transistors disclosed in the context of FIG. 5B employ a substrate with multiple crystal faces, the integration of NMOS transistor and the PMOS transistor on the same substrate does not require there to be multiple crystal faces, although the presence of multiple crystal faces increase the opportunities for bandgap and band offset engineering.

Figure 6A:
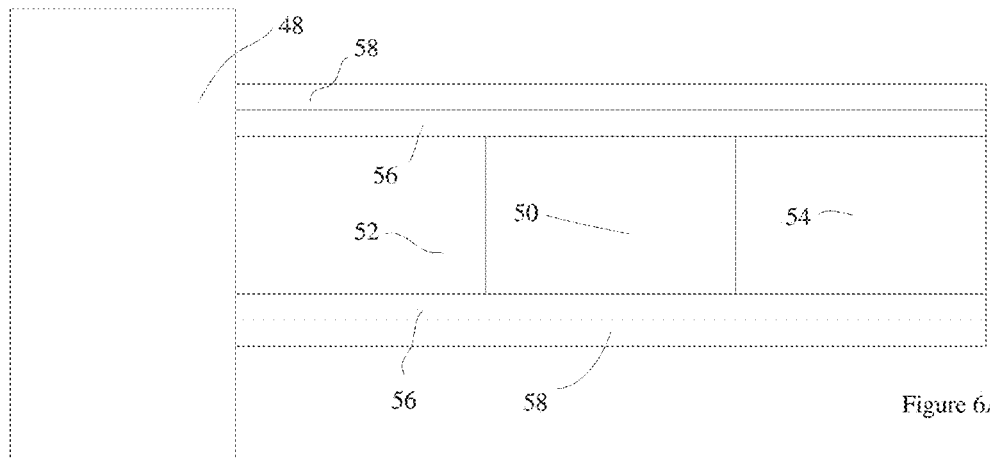
FIG. 6A is a cross section of a Tunnel MOSFET.

Another example of an application of the above superlattices in a transistor is the use of the superlattices in field effect transistors (FETs) such as Tunnel Metal-Oxide-Semiconductor Field-Effect Transistors (TMOSFETs). For instance, the above superlattices can serve as one or more of the source, drain, and channel 50 of a Tunnel MOSFET. FIG. 6A is a cross section of a Tunnel MOSFET. The TMOSFET includes components positioned on a base substrate 48. The components include a channel 50, first region 52 and second region 54 arranged such that during operation of the transistor charges flow between the first region 52 and the second region 54 through the channel 50. The channel 50 is located between the first region 52 and the second region 54. The channel 50 can be in direct physical contact with both the first region 52 and the second region 54. The first region 52 can be the source and the second region 54 can be the drain. The channel 50 and the second region 54 can be the same material or can be different materials. When the channel 50 and the second region 54 are the same material, they can be doped differently. For instance, the channel 50 and the second region 54 can be the same material while the channel 50 is undoped and the second region 54 is doped so as to be a p-type second region or doped so as to be an n-type second region.

A gate insulator 56 is positioned between a gate electrode 58 and the channel 50. The gate insulator 56 can also be positioned between the first region 52 and the gate electrode 58 and between the gate electrode 58 and the second region 54. Although not illustrated, the transistor can include a terminal in electrical communication with the gate electrode 58, a terminal in electrical communication with the first region 52, and a terminal in electrical communication with the second region 54. Electronics (not shown) can be in electrical communication with each of the terminals and can be configured to apply electrical energy to the terminals in order to operate the transistor. Suitable materials for the gate insulator 56 include, but are not limited to dielectric materials such as silicon oxide, Si-oxynitride, High-K metal-oxide and metal-oxinitride materials such as Hf-oxide, Al-oxide, and metal-alloy oxides, such as HfAl-oxide, and HfAlZr-oxide. Suitable materials for the gate electrode include, but are not limited to electrically conducting materials such as highly-doped poly-silicon, metals such as Al, Cu, etc, which can be interfaced directly with the gate insulator, or can be deposited on a barrier metal(s) which is positioned in-between the gate oxide and the gate electrode. "Barrier metal(s)", such as TiN, TiSiN, TaN, WN, and others, can be used to engineer the work-function that strongly impacts the threshold voltage (VT) of the MOSFETs, in addition to providing a physio-chemical barrier to reduce the chance of chemical reactions between the metal gate electrode and the gate insulator. Suitable materials for the base substrate 48 include, but are not limited to, silicon with a surface having one or more crystalline orientations, and germanium with a surface having one or more crystalline orientations.

The disclosed superlattices can serve as any one, any two or all three of the components selected from the group consisting of the first region 52, the second region 54, and the channel 50. For instance, one, two, or three components selected from the first region 52, the second region 54, and the channel 50 can each include or consist of one or more of the disclosed superlattices. In some instances, two or three of the components each includes or consists of one or more of the disclosed superlattices. When a component includes multiple superlattices, the superlattices can be stacked as disclosed in the context of FIG. 1B.

One or two of the components selected from the group consisting of the first region 52, the second region 54, and the channel 50 can include or consist of bulk semiconductor materials. In some instance, three of the components include bulk semiconductor materials and at least one of the components includes one or more of the disclosed superlattices. In some instances, one of the components includes or consists of one or more of the disclosed superlattices and the other two components each excludes any superlattices or excludes any superlattices that include carbon. In some instances, two of the components includes or consists of one or more of the disclosed superlattices and the remaining component excludes any superlattices or excludes any superlattices that include carbon. In instances where a component excludes any superlattices or excludes any superlattices that include carbon, the component can include or consist of one or more bulk semiconductors.

Suitable bulk materials include, but are not limited to, Si, random alloys of $Si_{1-x}Ge_x$ where x is greater than or equal to 0 and/or less than or equal to 1, $Si_{1-y}C_y$ where y is greater than or equal to 0 or 0.1 and/or less than or equal to 0.25, $Si_{1-x-y}Ge_xC_y$ where x is greater than or equal to 0 or 0.1 and/or less than or equal to 1 and y is greater than or equal to 0 or 0.01 and/or less than or equal to 0.25. In one example, a disclosed superlattices serve as the first region 52 and/or the channel 50. In another example, a disclosed superlattice serves as the first region 52 and/or the channel 50 and one or more bulk random alloys serve as the remaining components. The base substrate 48 can serve as the substrate of one of the disclosed superlattice systems. Alternately, the first region 52 or the channel 50 can serve as the substrate of one of the disclosed superlattice systems. As a result, the first region 52, the second region 54, and the channel 50 can all be epitaxially grown on the base substrate 48. Other advantages of the disclosed configuration include control of critical dimensions through heterojunction and doping profiles defined with atomic layer precision during the epitaxial growth process, which can be a mono-layer self-limiting growth process, rather than depending on patterning process steps involving lithography and etch. Additionally, the wide variety of bandgap magnitudes and band offsets between superlattices with different compositions, and between superlattices and materials such as silicon and germanium, provide a much larger parameter space for bandgap engineering of the different regions of the MOSFETs. In particular for Tunnel MOSFETs, the superlattices of the present invention provide the bandgaps and band offsets that are necessary for the engineering of both Tunnel NMOSFETs and Tunnel PMOSFETs, both strained to the same base substrate 48, possibly to different crystal surface orientations, without requiring straining of any region of either device to materials with other lattice constants.

The transistor of FIG. 6A can be a PMOS transistor or an NMOS transistor. For instance, a PMOS transistor results when the first region 52 is doped so as to be a n-type first region, the channel 50 is undoped so as to be an intrinsic channel, and the second region 54 is doped so as to be a p-type second region. An NMOS transistor results when the first region 52 is doped so as to be an p-type first region, the channel 50 is undoped so as to be an intrinsic channel, and the second region 54 is doped so as to be a n-type second region.

Figure 6B:
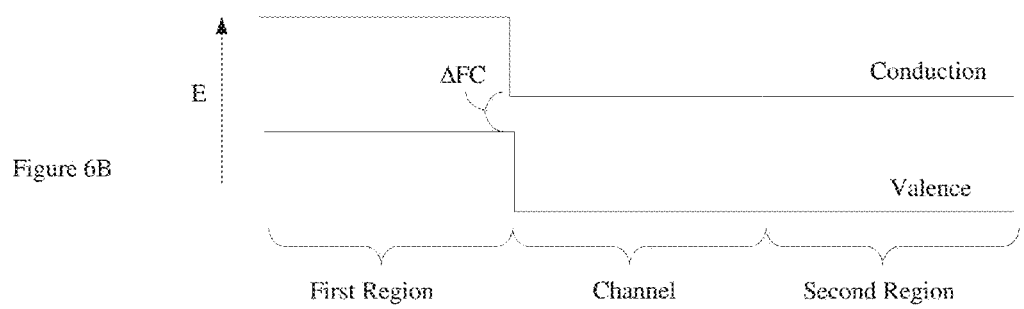
FIG. 6B illustrates qualitative band alignments for the Tunnel MOSFET of FIG. 6A.
Figure 6C:
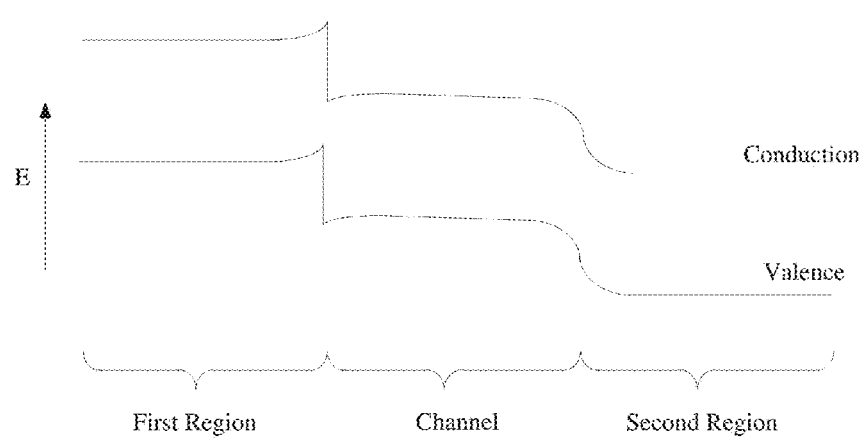
FIG. 6C illustrates qualitative band alignments for the Tunnel MOSFET of FIG. 6A where Fermi levels are evident.

FIG. 6B and FIG. 6C illustrates the relative positions of the valence and conduction bands for an NMOS Tunnel MOSFET when the electronics are not applying electrical energy to the transistor. FIG. 6C is a more realistic version of the valence and conduction bands shown FIG. 6B. The effects of the material interfaces and Fermi levels are evident in FIG. 6C. When an NMOS Tunnel MOSFET is desired, the one or more superlattices included in the transistor are chosen to provide relative conduction and valence bands such as are shown in FIG. 6B and/or FIG. 6C. In particular, the superlattices can be selected such that at the interface between the first region and the channel region, the value of the valence band of the first region minus the value of the conduction band of the channel ($\Delta FC$) is a negative value with an absolute value that provides the desired value for the threshold at which tunneling from the valence band of the first region into the conduction band of the channel region begins to occur. Additionally, the superlattices can be selected such that at the interface between the first region and the channel region, the top of the valence band of the first region and the bottom of the conduction band of the channel region occur at the same k-point of the Brillouin Zone, thereby making the tunneling process "vertical" in k-space. For non-homogeneous channels away from the interface between the first region and the channel region, the top of the valence band of the first region and the bottom of the conduction band of the channel region need not occur at the same k-point of the Brillouin Zone.

Figure 6D:
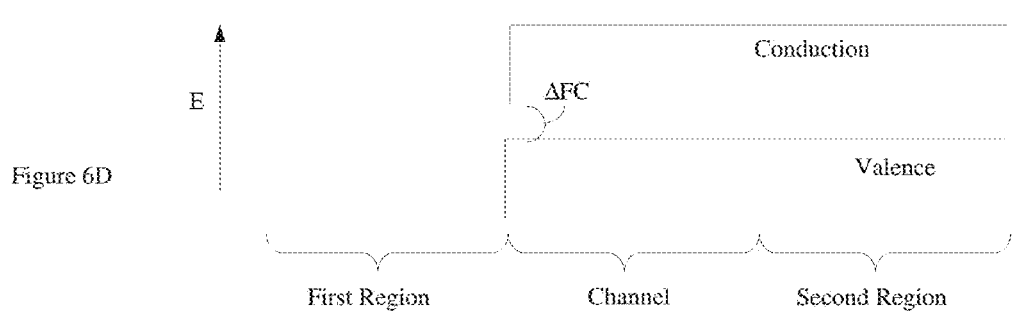
FIG. 6D and FIG. 6E illustrate the relative positions of the valence and conduction bands for a PMOS Tunnel MOSFET when the electronics are not applying electrical energy to the transistor.
Figure 6E:
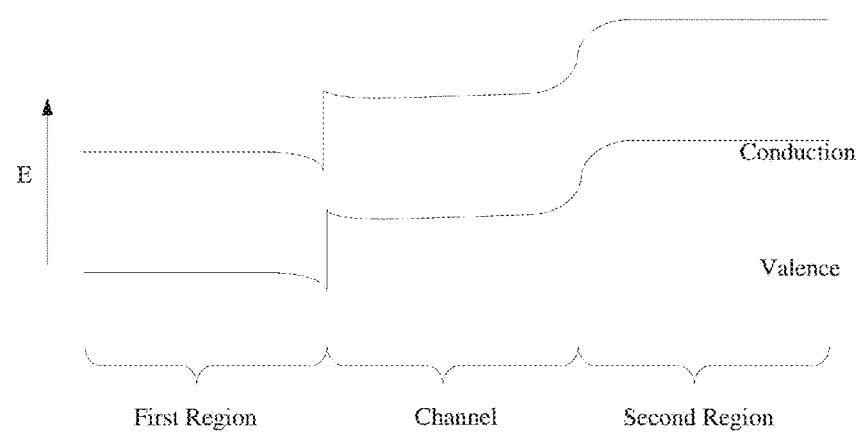

FIG. 6D and FIG. 6E illustrate the relative positions of the valence and conduction bands for a PMOS Tunnel MOSFET when the electronics are not applying electrical energy to the transistor. FIG. 6E is a more realistic version of the valence and conduction bands shown FIG. 6D. The effects of the material interfaces and Fermi levels are evident in FIG. 6E. When a PMOS Tunnel MOSFET is desired, the one or more superlattices included in the transistor are chosen to provide relative conduction and valence bands such as are shown in FIG. 6D and/or FIG. 6E. Although the qualitative band alignments of FIG. 6D and/or FIG. 6E have not been achieved with group-IV materials, the wide range of band structures that can be achieved using the above superlattices makes these qualitative band alignments possible. In particular, the superlattices can be selected such that at the interface between the first region and the channel region the value of the conduction band of the first region minus the value of the valence band of the channel ($\Delta FC$) is a positive value with an absolute value that provides the desired value for the threshold at which tunneling from the conduction band of the first region into the valence band of the channel region begins to occur. Additionally, the superlattices can be selected such that at the interface between the first region and the channel region, the top of the conduction band of the first region and the bottom of the valence band of the channel region occur at the same k-point of the Brillouin Zone, to make the tunneling process "vertical" in k-space. For non-homogeneous channels away from the interface between the first region and the channel region, the top of the conduction band of the first region and the bottom of the valence band of the channel region need not occur at the same k-point of the Brillouin Zone.

A factor that can improve the performance of Tunnel FETs is to increase or maximize the band-to-band tunneling probability. The tunneling probability is enhanced the when interband tunneling is "vertical" in k-space, that is, the top of the valence band and the bottom of the conduction band occur at the same k-point of the BZ. For NMOS this occurs when the top of the Valence Band (VB) of the Source region and the bottom of the Conduction Band (CB) of the channel exist in the same k-point of the BZ. Conversely for PMOS devices, the bottom of the CB of the Source region and the top of the VB of the channel can also be located in the same k-point of the BZ. These requirements can be met when both the regions are made of direct band gap materials having the band extremes at the same point in k-space, typically the center of the BZ (Gamma point), but conceptually it could be at another point, as it is the case with at least one silicon-compatible semiconductor material ($Si_2Sn_2C$ ordered alloy) in which the top of the VB is at point X of the BZ, rather than the more conventional Gamma point at the center of the BZ. Also, the source and channel can each be indirect bandgap materials when the interband transition (tunneling) across the interface between the first region and the channel, and thus between two different materials, is itself direct.

Figure 6F:
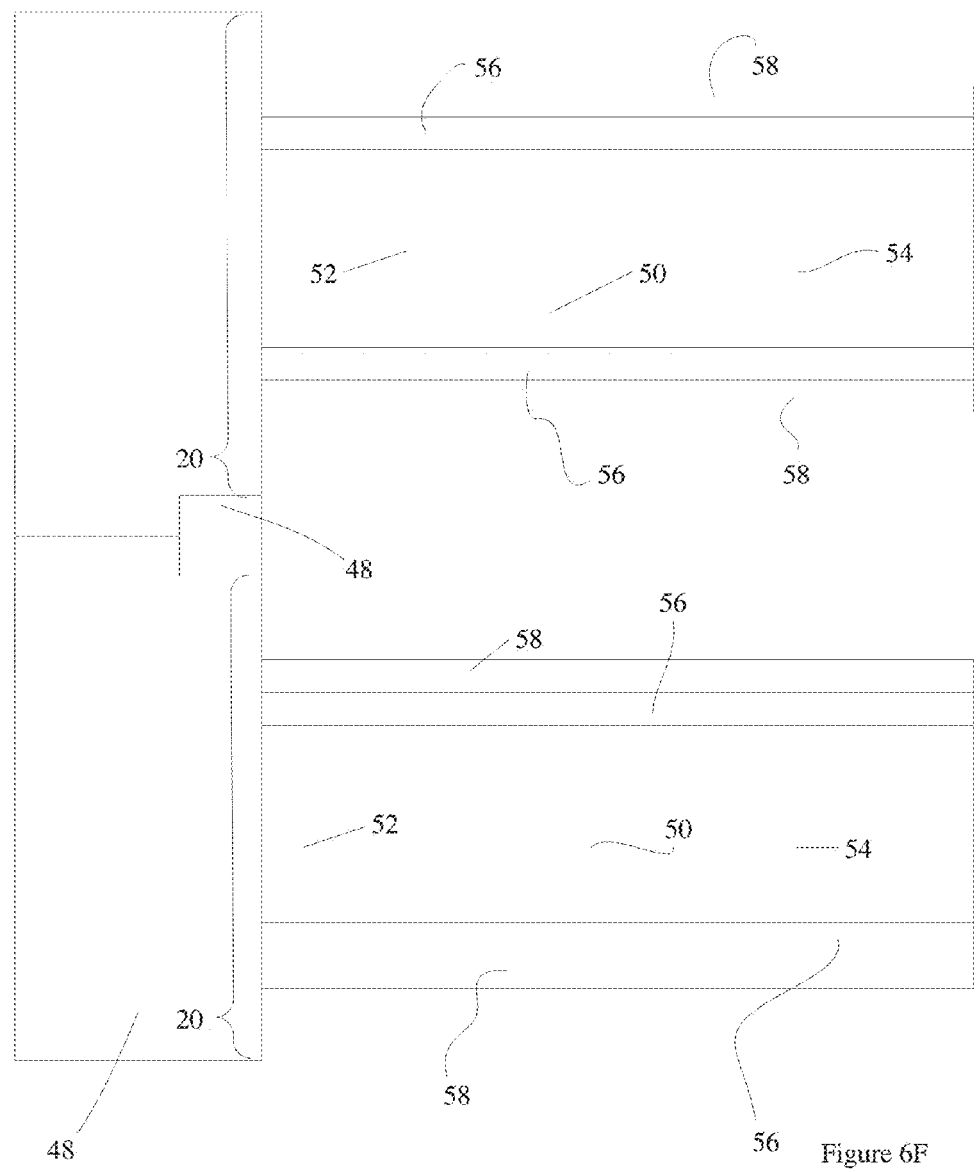
FIG. 6F is a cross section of a superlattice system that includes multiple Tunnel MOSFETs on the same substrate.

As noted above, a substrate surface can include multiple crystal faces. This feature can be used to integrate both Tunnel-NMOS and Tunnel-PMOS transistors onto the same base substrate 48 or even to integrate different Tunnel-NMOS transistors onto the same base substrate 48 or to integrate different Tunnel-PMOS transistors onto the same base substrate 48. FIG. 6F is a cross section of a superlattice system that includes multiple Tunnel MOSFETs on the same base substrate 48. Deep trench isolation structures or shallow trench isolation structures 60 can extend into the base substrate 48 in order to electrically insulate adjacent transistors from one another. Suitable materials for the deep trench isolation structures or shallow trench isolation structures 60 include, but are not limited to, dielectric materials such as silicon oxide.

One of the Tunnel MOSFETs shown in FIG. 6F can be a NMOS transistor and the other MOSFET can be a PMOS transistor. Alternately, both of the Tunnel MOSFETs shown in FIG. 6F can be NMOS transistors or both of the Tunnel MOSFETs shown in FIG. 6F can be PMOS transistors. The one or more superlattices included in each of the different Tunnel MOSFET can be the same or different. Even when the cells for the superlattices included in one or more of the components (first region 52, second regions 54, and channel) of different transistors have the same formula, the impact of strain on the band structure of the superlattices will be different due to the different crystal orientations of the crystalline surfaces on which they are epitaxially grown. Accordingly, these superlattices will have one, two, three or more than three different features selected from the group consisting of different bandgap types (direct versus indirect), different bandgap magnitudes, different electron and hole effective masses, different oscillator strengths, different intrinsic carrier concentrations. As a result, the devices incorporating them will have different performance characteristic. Since the same superlattice in the Tunnel MOSFETs on different crystal faces provides different band structure and/or band alignments, the same epitaxial growth steps can be used to produce Tunnel MOSFETs with different characteristics and performance levels. Advantages of this include, the fabrication Tunnel MOSFETs with key regions having different bandgap magnitudes, and consequently the ability to operate at different operating voltages.

Although FIG. 6A and FIG. 6F show the first region 52 bonded to the base substrate 48, the second region 54 can be bonded to the base substrate 48. For instance, the second region 54 can be grown on the base substrate 48.

Although the transistors disclosed in the context of FIG. 6F employ a substrate with multiple crystal faces, the integration of the Tunnel-NMOS and Tunnel-PMOS on the same substrate does not require there to be multiple crystal faces, although the presence of multiple crystal faces increase the opportunities for bandgap and band offset engineering.

The above superlattices can also be used to generate a Complementary Unipolar Tunnel MOSFET (CUTMOS). A CUTMOS can be operated as an n-type Tunnel MOSFET or as a p-type Tunnel MOSFET depending on the applied bias. FIG. 7A is a cross section of a CUTMOS. The CUTMOS includes components positioned on a base substrate 48. The components include a channel 50, first region 52 and second region 54 arranged such that during operation of the transistor charges flow between the first region 52 and the second region 54 through the channel 50. The channel 50 is located between the first region 52 and the second region 54. The channel 50 is in direct physical contact with both the first region 52 and the second region 54. When operating the CUTMOS as a Tunnel NMOS transistor, the first region functions as the source and the second region functions as the drain. In contrast, when operating the CUTMOS as a Tunnel PMOS transistor, the first region functions as the drain and the second region functions as the source. The first region, the second region and the channel can be different materials. The channel can have a varying composition and/or can be composed of multiple materials.

A gate insulator 56 is positioned between a gate electrode 58 and the channel 50. The gate insulator 56 can also be positioned between the first region 52 and the gate electrode 58 and between the gate electrode 58 and the second region 54. Although not illustrated, the transistor can include a terminal in electrical communication with the gate electrode 58, a terminal in electrical communication with the first region 52, and a terminal in electrical communication with the second region 54. Electronics (not shown) can be in electrical communication with each of the terminals and can be configured to apply electrical energy to the terminals in order to operate the transistor. Suitable materials for the gate insulator 56 include, but are not limited to dielectric materials such as silicon oxide, Si-oxynitride, High-K metal-oxide and metal-oxinitride materials such as Hf-oxide and Al-oxide, and metal-alloy oxides such as HfAl-oxide and HfAlZr-oxide. Suitable materials for the gate electrode 58 include, but are not limited to electrically conducting such as silicon oxide, dielectric materials such as highly-doped poly-silicon, metals such as Al, Cu, etc, which can be interfaced directly with the gate insulator, or can be deposited on a barrier metal(s) which is positioned in-between the gate oxide and the gate electrode. "Barrier metal(s)" such as TiN, TiSiN, TaN, WN, and others, can be used to engineer the work-function that strongly impacts the threshold voltage (VT) of the MOSFETs, in addition to providing a physio-chemical barrier to avoid any chance of chemical reactions between a metal gate electrode and the gate insulator. Suitable materials for the base substrate 48 include, but are not limited to, silicon and germanium.

The disclosed superlattices can serve as any one, any two or all three of the components selected from the group consisting of the first region 52, the second region 54, and the channel 50. For instance, one, two, or three components selected from the first region 52, the second region 54, and the channel 50 can each include or consist of one or more of the disclosed superlattices. In some instances, two or three of the components each includes or consists of one or more of the disclosed superlattices. When a component includes multiple superlattices, the superlattices can be stacked as disclosed in the context of FIG. 1B.

One or two of the components selected from the group consisting of the first region 52, the second region 54, and the channel 50 can include or consist of bulk semiconductor materials. In some instance, three of the components include bulk semiconductor materials and one or more the components includes one or more of the disclosed superlattices. In some instances, one of the components includes or consists of one or more of the disclosed superlattices and the other two components each excludes any superlattices or excludes any superlattices that include carbon. In some instances, two of the components includes or consists of one or more of the disclosed superlattices and the remaining component excludes any superlattices or excludes any superlattices that include carbon. In instances where a component excludes any superlattices or excludes any superlattices that include carbon, the component can include or consist of one or more bulk semiconductors.

Suitable bulk materials include, but are not limited to, Si, random alloys of $Si_{1-x}Ge_x$ where x is greater than or equal to 0 and/or less than or equal to 1, $Si_{1-y}C_y$, where y is greater than or equal to 0 or 0.1 and/or less than or equal to 0.25, $Si_{1-x-y}Ge_xC_y$, where x is greater than or equal to 0 or 0.1 and/or less than or equal to 1 and y is greater than or equal to 0 or 0.01 and/or less than or equal to 0.25. In one example, a disclosed superlattices serves as the first region 52 and/or the channel 50. In another example, a disclosed superlattices serves as the first region 52 and/or the channel 50 and one or more bulk random alloys serve as the remaining components. The base substrate 48 can serve as the substrate of one of the disclosed superlattice systems. Alternately, the first region 52 or the channel 50 can serve as the substrate of one of the disclosed superlattice systems. As a result, the first region 52, the second region 54, and the channel 50 can all be epitaxially grown on the base substrate 48. Other advantages of the disclosed configuration include the ability to have complementary Tunnel MOSFETs, in a single device structure, whose operation as a Tunnel NMOS or as a Tunnel PMOS, is controlled by the voltages applied to the same device structure, and therefore can be dynamically reconfigured. Because complementary operation can be accomplished with a single structure, the fabrication flow is significantly simplified, with the benefits of lower manufacturing costs and higher yields.

The first region 52 is doped so as to be a p-type first region, the channel 50 is undoped so as to be an intrinsic channel, and the second region 54 is doped so as to be a n-type second region. The first region 52 acts as source when the device operates as Tunnel NMOS, injecting electrons into the channel 50 when electronics apply a suitable gate voltage (i.e. VGS>0 where VGS is voltage at gate minus voltage at source). When the electronics apply the opposite polarity (i.e. VGS<0), the first region 52 collects holes and acts as the drain of a Tunnel PMOS. The second region 54 acts as source when the device operates as Tunnel PMOS, injecting holes into the channel 50 when electronics apply a suitable gate voltage (i.e. VGS<0). When the electronics apply the opposite polarity (i.e. VGS>0), the first region 52 collects electrons and acts as the drain of a NMOS.

The ability of the CUTMOS to operate as a Tunnel NMOS transistor or as a Tunnel PMOS transistor is a result of selecting the components so as to achieve a qualitative band alignment such as the qualitative band alignments of FIG. 7B or FIG. 7C. FIG. 7B and FIG. 7C illustrates the relative positions of the valence and conduction bands for a CUTMOS when the electronics are not applying electrical energy to the transistor. FIG. 7C is a more realistic version of the valence and conduction bands shown FIG. 7B because the effects of the material interfaces and Fermi levels are evident in FIG. 7C. Although, the qualitative band alignments of FIG. 7B and FIG. 7C have not been achieved with traditional transistor materials, the wide range of band structures that can be achieved using the above superlattices makes these qualitative band alignments possible. The superlattices are selected such that the energy of the second region conduction band is less than the energy of the channel conduction band which is less than the energy of the first region conduction band, and the energy of the second region valence band is less than the energy of the channel valence band which is less than the energy of the first region valence band. Additionally, the superlattices are selected such that at the interface between the first region and the channel region, the value of the valence band of the first region minus the value of the conduction band of the channel (ΔFC) is a negative value with an absolute value that provides the desired value for the threshold at which tunneling from the valence band of the first region into the conduction band of the channel region begins to occur. Additionally, the superlattices are selected such that at the interface between the second region and the channel region, the value of the conduction band of the second region minus the value of the valence band of the channel (ΔSC) is a positive value with an absolute value that provides the desired value for the threshold at which tunneling from the conduction band of the second region into the valence band of the channel region begins to occur. Additionally, the superlattices can be selected such that at the interface between the first region and the channel region, the top of the valence band of the first region and the bottom of the conduction band of the channel region occur at the same k-point of the Brillouin Zone making the tunneling process "vertical" in k-space. For non-homogeneous channels away from the interface between the first region and the channel region, the top of the valence band of the first region and the bottom of the conduction band of the channel region need not occur at the same k-point of the Brillouin Zone. Additionally, at the interface between the second region and the channel region, the bottom of the conduction band of the second region and the top of the valence band of the channel region occur at the same k-point of the Brillouin Zone making the tunneling process to be "vertical" in k-space. For non-homogeneous channels away from the interface between the second region and the channel region, the bottom of the conduction band of the second region and the top of the valence band of the channel region need not occur at the same k-point of the Brillouin Zone.

Figure 7D:
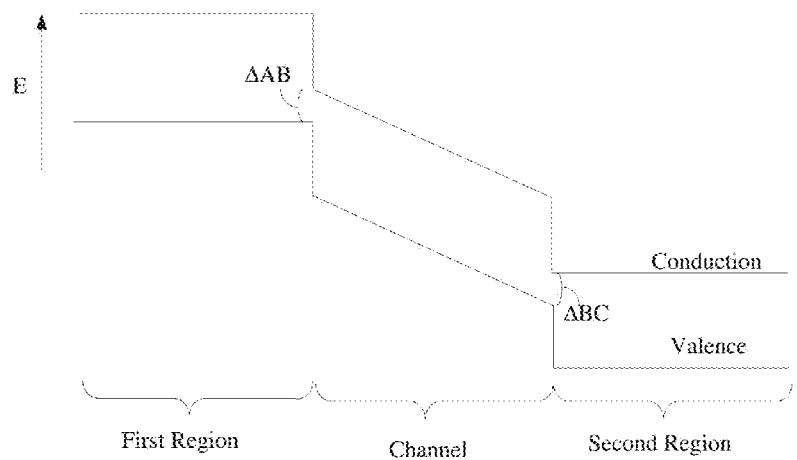
FIG. 7D illustrates qualitative band alignment for the CUTMOS of FIG. 7A where the channel region is constructed to have a gradient in the valence and conduction bands.
Figure 7E:
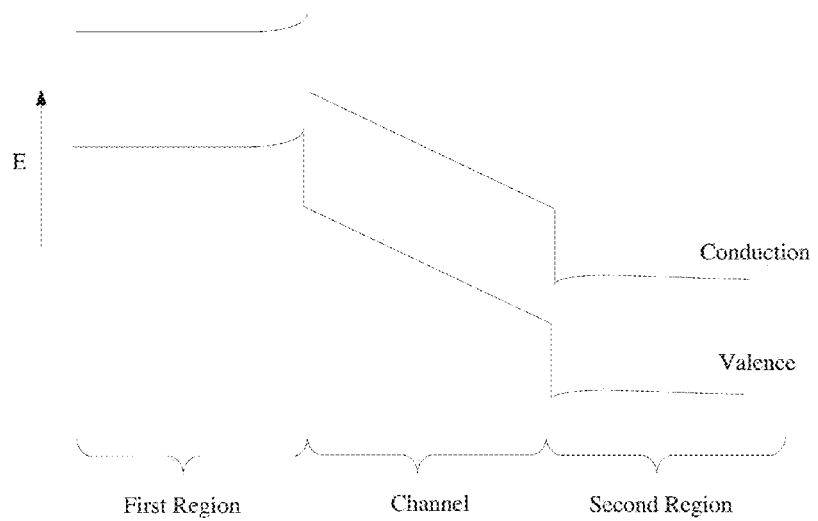
FIG. 7E illustrates qualitative band alignments for the CUTMOS of FIG. 7D where Fermi levels are evident.

The upward bending of the conduction band on the right side of the channel shown in FIG. 7C is undesirable because as an electron in the conduction band of the channel 50 approaches the second region 54, the upward bend acts as a barrier to further movement of the electron. This difficulty can be addressed by constructing the components of the CUTMOS to achieve qualitative band alignments such as FIG. 7D or FIG. 7E. FIG. 7D and FIG. 7E illustrates the relative positions of the valence and conduction bands for CUTMOS when the electronics are not applying electrical energy to the transistor. FIG. 7E is a more realistic version of the valence and conduction bands shown FIG. 7D because the effects of the material interfaces and Fermi levels are evident in FIG. 7E. The energy of the channel conduction band and channel valence band have gradients selected such that the energy level drops as the channel 50 approaches the second region 54. In particular, the gradient of the channel conduction band drops such that the energy of the channel conduction band at the interface of the channel 50 and the second region 54 is below the energy of the channel conduction band at the interface of the channel 50 and the first region 52. In some instance, the energy of the channel conduction band at the interface of the channel 50 and the second region 54 is 0.5 eV, 0.25 eV or 0.1 eV less than the energy of the channel conduction band at the interface of the channel 50 and the first region 52. Further, the gradient of the channel valence band drops such that the energy of the channel valence band at the interface of the channel 50 and the second region 54 is below the energy of the channel valence band at the interface of the channel 50 and the first region 52. In some instance, the energy of the channel valence band at the interface of the channel 50 and the second region 54 is 0.5 eV, 0.25 eV or 0.1 eV less than the energy of the channel valence band at the interface of the channel 50 and the first region 52. In one example, the energy of the channel conduction band at the interface of the channel and the second region is 0.5 eV, 0.25 eV or 0.1 eV less than the energy of the channel conduction band at the interface of the channel and the first region, and the energy of the channel valence band at the interface of the channel and the second region is 0.5 eV, 0.25 eV or 0.1 eV less than the energy of the channel valence band at the interface of the channel and the first region.

Figure 7F:
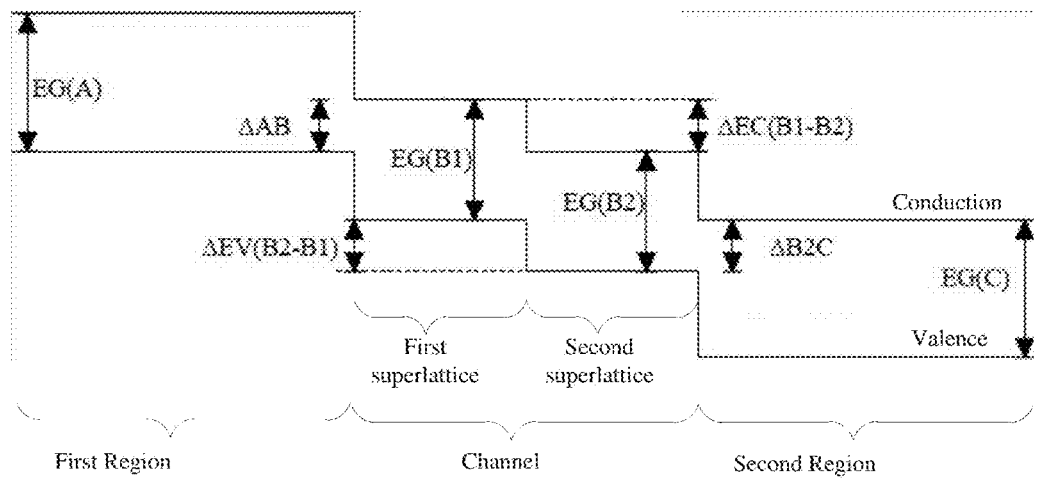
FIG. 7F illustrates qualitative band alignment for the CUTMOS of FIG. 7A where the channel region includes or consists of two or more superlattices.
Figure 7G:
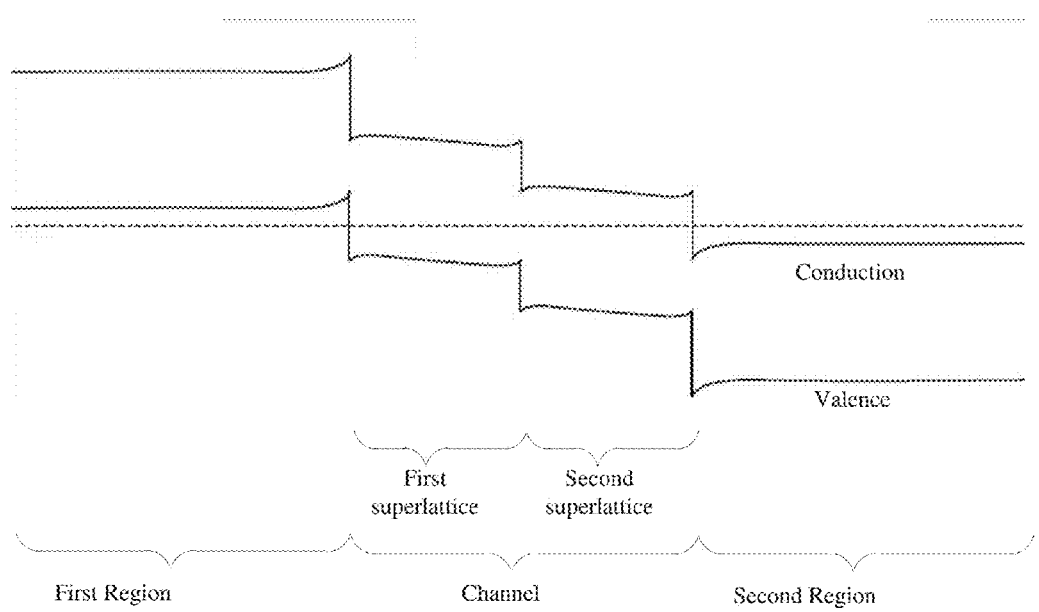
FIG. 7G illustrates qualitative band alignments for the CUTMOS of FIG. 7F where Fermi levels are evident.

The gradient in the energy of the conduction and valence bands in the channel 50 can be created by changing the materials of the channel 50 across the channel. For instance, the channel can include two or more superlattices arranged in accordance with FIG. 1B and the cells of the different superlattices can have different chemical compositions. The superlattices included in the channel can be selected to have conduction and valence bands that combine to approximate the gradient in the conduction and valence bands in the channel 50 of FIG. 7D and FIG. 7E. For instance, FIG. 7F and FIG. 7G illustrates the relative positions of the valence and conduction bands for a CUTMOS where the channel includes a first superlattice and a second superlattice and the electronics are not applying electrical energy to the transistor. FIG. 7G is a more realistic version of the valence and conduction bands shown FIG. 7F because the effects of the material interfaces and Fermi levels are evident in FIG. 7G. The first superlattice and the second superlattice are selected such that the conduction band for the first superlattice and the second superlattice is between the conduction band of the first region and the conduction band of the second region and such that the conduction band of the second superlattice is between the conduction band of the first superlattice and the second region. As a result, the first superlattice and the second superlattice provide steps down from the conduction band of the first region to the conduction band of the second region. Additionally, the first superlattice and the second superlattice are selected such that the valence band for the first superlattice and the second superlattice is between the valence band of the first region and the valence band of the second region and such that the valence band of the second superlattice is between the valence band of the first superlattice and the second region. As a result, the first superlattice and the second superlattice provide steps down from the valence band of the first region to the valence band of the second region. When the channel includes more than two channel superlattices, the channel superlattices are selected such that the conduction bands of the channel superlattices are each between the conduction band of the first region and the conduction band of the second region and provide a series of steps down from the conduction band of the first region to the conduction band of the second region without any steps upward. Accordingly, in some instances, the conduction band of each channel superlattice is between the conduction bands of the two contacting materials where the contacting materials for a channel superlattice are materials that are contacted by the channel superlattice and are included in the channel, the first region, or the second region. Additionally, when the channel includes more than two channel superlattices, the channel superlattices are selected such that the valence bands of the channel superlattices are each between the valence band of the first region and the valence band of the second region and provide a series of steps down from the valence band of the first region to the valence band of the second region without any steps upward. Accordingly, in some instances, the valence band of each channel superlattice is between the valence bands of the two contacting materials where the contacting materials for a channel superlattice are materials that are connected by the channel superlattice and are included in the channel, the first region, or the second region. These arrangements provide additional degrees of freedom for engineering the source/channel interfaces and fine-tune the band offsets for TNMOS and TPMOS separately for each device type. Additionally, the downward steps in potential energy for both electrons and holes, along the respective paths from the respective source regions to the respective drain regions, can be used and engineered to enable avalanche multiplication by impact ionization, thereby significantly increasing the on-state drain current ($I_{ON}$) for both the TNMOS and the TPMOS devices.

The qualitative band alignments shown in FIG. 7B through FIG. 7G show symmetric bandgaps and barrier heights to better illustrate the possibility of reversing the operation from NMOS to PMOS and vice versa. For example the bandgaps of the materials for the first region 52 and the second region 54 are identical, and so are the band offsets that control injection of electrons and holes into the channel, $\Delta AB$, and $\Delta BC$, respectively. However, the injections of electrons and holes into the channel 50 is impacted by other parameters such as the electron and holes masses in the first region, the channel, and the second region. The injections of electrons and holes into the channel 50 can also be impacted by tunneling probability as a function of the k-point in the BZ. As a result, these barrier heights (labeled $\Delta AB$, $\Delta BC$, $\Delta B2C$ in FIG. 7C, FIG. 7E, and FIG. 7G) become variables that can be controlled to better balance the ON and OFF currents of the same structure for operation as Tunnel NMOS and Tunnel PMOS. Accordingly, the one or more superlattices included in the components can have finely tuned Density of States (DOS) and electron and hole masses, in which case, these properties are likely to be strongly anisotropic, with very different values along the axis of the superlattice, and in the plane perpendicular to the axis of the superlattice. This is also quite relevant for the properties of the MOS interface of the gates. The Density of States (DOS) and electron and hole masses can be tuned by one or more actions selected from a group consisting of altering the chemical composition of each atomic plane in a superlattice, altering the number of atomic planes for one or more of the constituents of a superlattice cell, and altering the selection of the crystallographic orientation of the surface on which the superlattice layers are epitaxially grown.

During operation of the CUTMOS, the region that functions as the source for the T-NMOS is also simultaneously the region that functions as the drain for the T-PMOS. Conversely, the region that functions as the drain for the T-NMOS is also simultaneously the region that functions as the source for the T-PMOS. As a result, when a potential is applied to the source of the T-NMOS a potential is simultaneously applied to the drain of the T-PMOS. Additionally, when a potential is applied to the drain for the T-NMOS a potential is simultaneously applied to the source for the T-PMOS. Consequently, when there is a difference in potential between the source and drain of the T-NMOS, it means that the same difference in potential exists between the source and drain of the T-PMOS but with the opposite polarity.

Figure 7H:
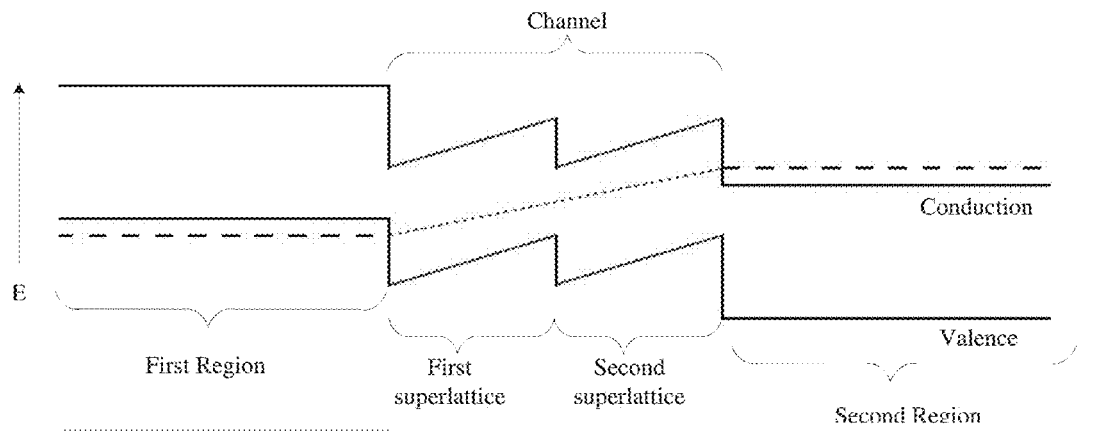
FIG. 7H through FIG. 7M show qualitative band alignments for a CUT-MOS device having band alignments according to of FIG. 7F through FIG. 7G during operation of the CUT-MOS.
Figure 7I:
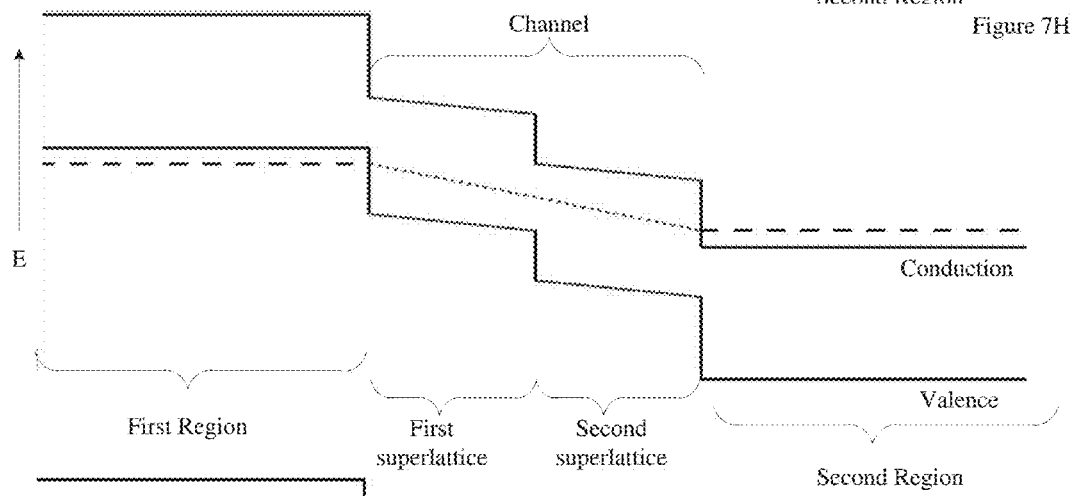
Figure 7J:
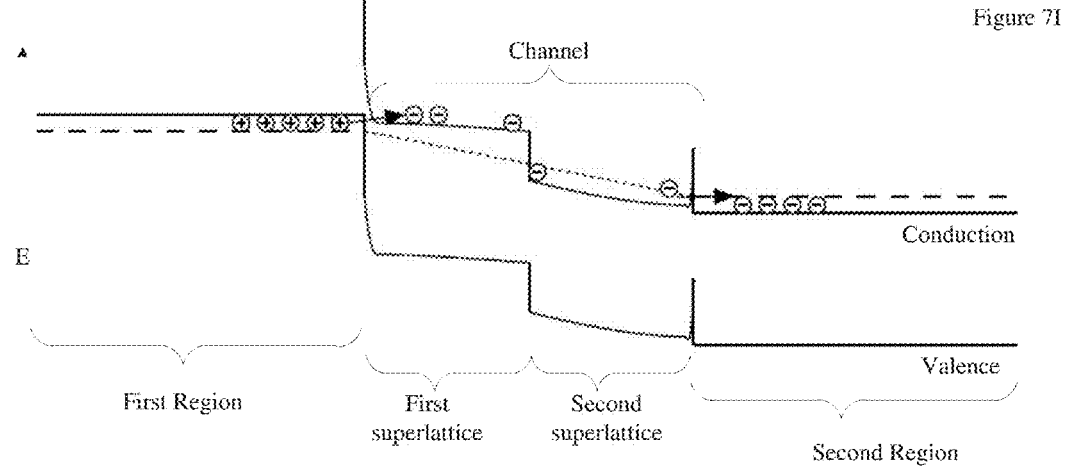

FIG. 7H through FIG. 7J show qualitative band alignments for the CUT-MOS device of FIG. 7G during operation of the CUT-MOS. For instance, FIG. 7H shows the band alignments for the bias conditions at which VDS (voltage of drain minus voltage of source) for T-NMOS is <0, and VDS for T-PMOS>0. The band diagram depicts the bands without the effects of the presence of a gate. FIG. 7I shows the band alignments for the bias conditions at which VDS for T-NMOS is >0, and VDS for T-PMOS<0. The band diagram depicts the bands without the effects of the presence of a gate. FIG. 7J shows the band alignments for the bias conditions at which VDS for T-NMOS is >0 and VGS for T-NMOS is >0. Under the conditions of FIG. 7J, the T-NMOS is in the ON state with current flowing from the p-type doped first region 52, tunneling into the channel 50, and drifting into the n-type doped second region 54. As is evident from FIG. 7J, holes cannot flow from the n-type doped second region 54 into the channel 50 because at the interface between the second region 54 and the channel 50, the applied gate voltage increases the energy differential between the valence band edge of the channel relative to the conduction band edge of doped second region.

Figure 7K:
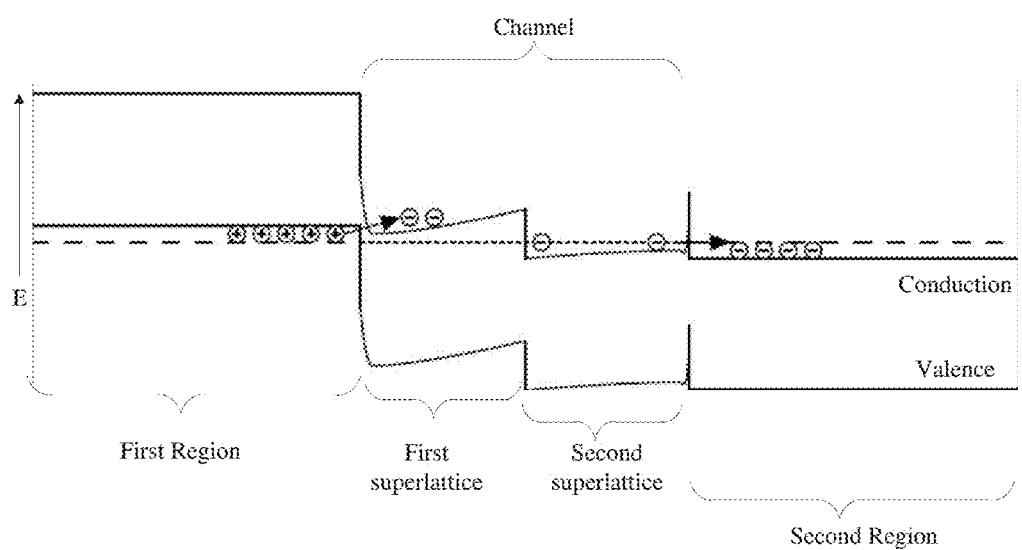

FIG. 7K shows the band alignments for the CUT-MOS device of FIG. 7G for the bias conditions at which VDS for T-NMOS is =0, and VGS for T-NMOS is >0. Under these conditions, the T-NMOS is in the ON state but current does not flow since the potential at the second region 54 (drain of T-NMOS) is identical to the potential at the p-type doped first region (source of T-NMOS).

Figure 7L:
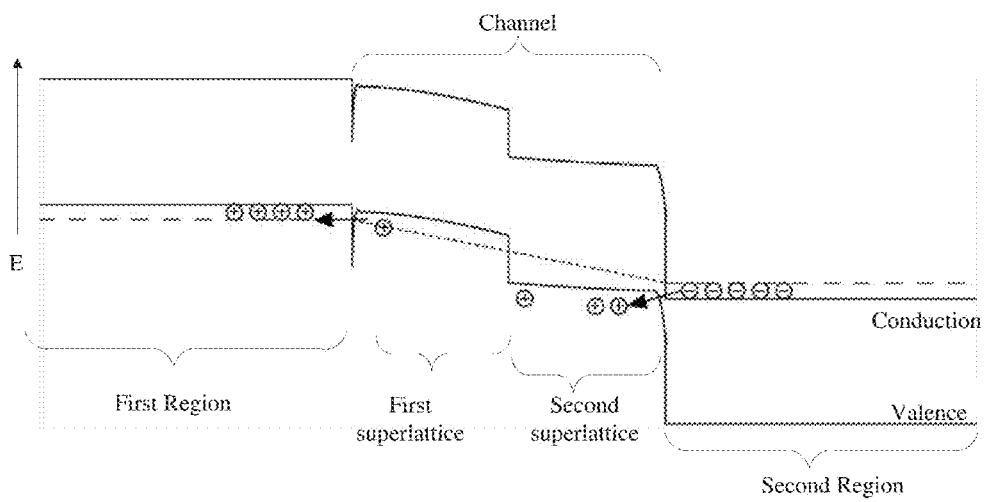

FIG. 7L shows the band alignments for the CUT-MOS device of FIG. 7G for the bias conditions at which VDS for T-PMOS is <0, and VGS for T-PMOS is also <0. Under these conditions, the T-PMOS is in the ON state with current flowing from the n-type doped second region 54, tunneling into the undoped channel 50, and drifting into the p-type doped first region 52. As it is evident from FIG. 7L, electrons do not flow from the first region 52 into the channel 50 because at the interface between the first region 52 and the channel 50, the applied gate voltage increases the energy differential between the conduction band edge of the channel and the valence band edge of the first region 52.

Figure 7M:
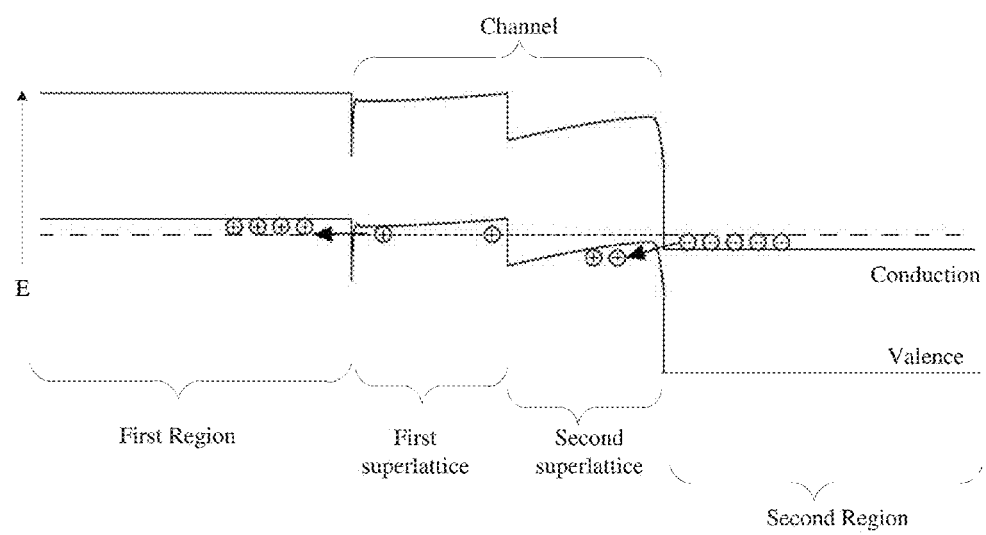

FIG. 7M shows the band alignments for the CUT-MOS device of FIG. 7G for the bias conditions at which VDS for T-PMOS is =0, and VGS for T-PMOS is <0. Under these conditions, the T-PMOS is in the ON state but current does not flow since the potential at the first region 52 (drain of T-PMOS) is identical to the potential at the second region 54 (source of T-PMOS).

Figure 7N:
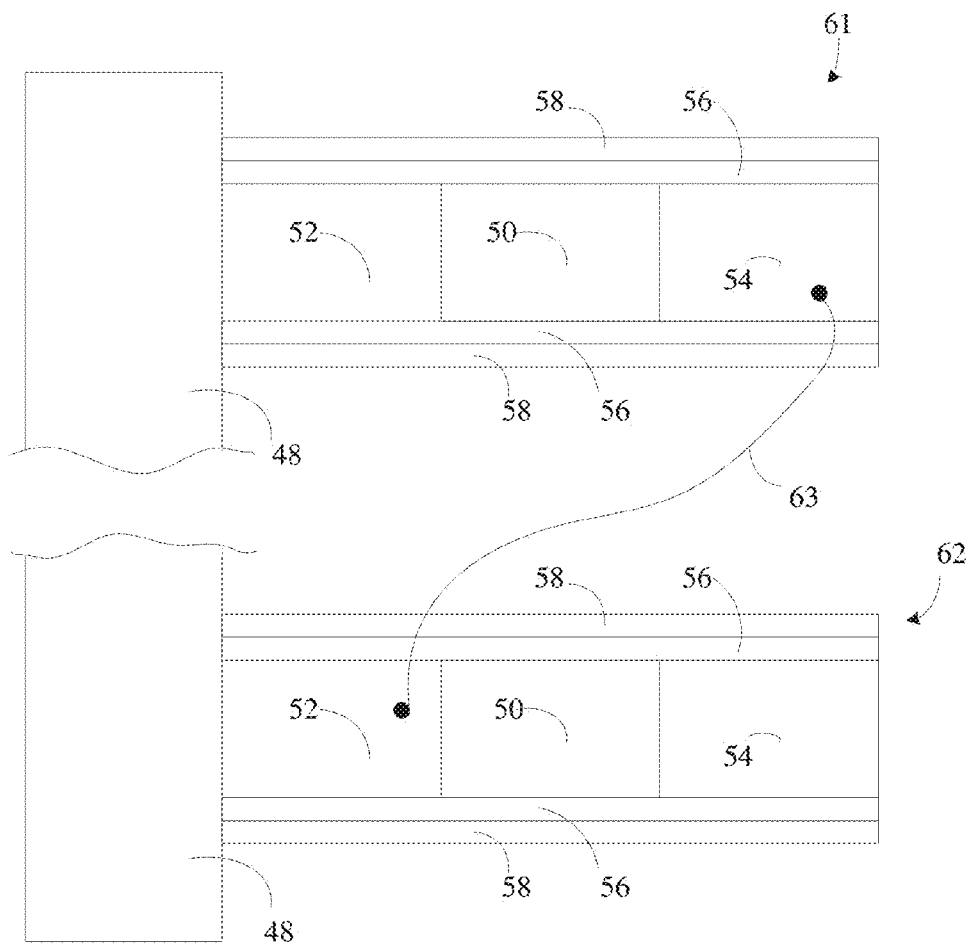
FIG. 7N is a cross section of a system having CUTMOS transistors connected to function as an inverter. The system includes a first CUTMOS transistor constructed according to FIG. 7A and a second CUTMOS transistor constructed according to FIG. 7A.

CMOS inverters are a building block for circuitry implemented with CMOS technology to provide Boolean logic. The above CUTMOS transistors can be used to generate CMOS inverters. For instance, the second region of a first CUTMOS transistor can be in electrical communication with the first region of a second CUTMOS transistor and the first CUTMOS transistor can be operated as NMOS transistor while the second CUTMOS transistor is operated as PMOS. As an example, FIG. 7N is a cross section of a system that includes a first CUTMOS transistor 61 constructed according to FIG. 7A and a second CUTMOS transistor 62 constructed according to FIG. 7A. Although not illustrated, the first CUTMOS transistor 61 and the second CUTMOS transistor 62 can include a terminal in electrical communication with the gate electrode 58 and a terminal in electrical communication with the second region 54. An electrical conductor 63 is schematically shown in FIG. 7N in order to illustrate electrical communication between the second region 54 of the first CUTMOS transistor 61 and the first region 52 of the second CUTMOS transistor 62. Suitable electrical conductors include, but are not limited to, semimetals, metals, and metal silicides, such as Nickel Silicide. Although not illustrated, the gate electrode 58 of the first CUTMOS transistor 61 is in electrical communication with the gate electrode 58 of the second CUTMOS transistor 61 such that the gate electrodes are at the same potential. Electronics (not shown) can be in electrical communication with each of the terminals and with the electrical conductor 63 and can be configured to apply electrical energy to the terminals in order to operate the first CUTMOS transistor 61 and the second CUTMOS transistor 62.

The first CUTMOS transistor 61 and the second CUTMOS transistor 62 can be positioned on the same device or on different devices. For instance, the base substrate 48 for the first CUTMOS transistor 61 can be the same as the base substrate 48 for the second CUTMOS transistor 62 or the base substrate 48 for the first CUTMOS transistor 61 can be different from the base substrate 48 for the second CUTMOS transistor 62.

Figure 7O:
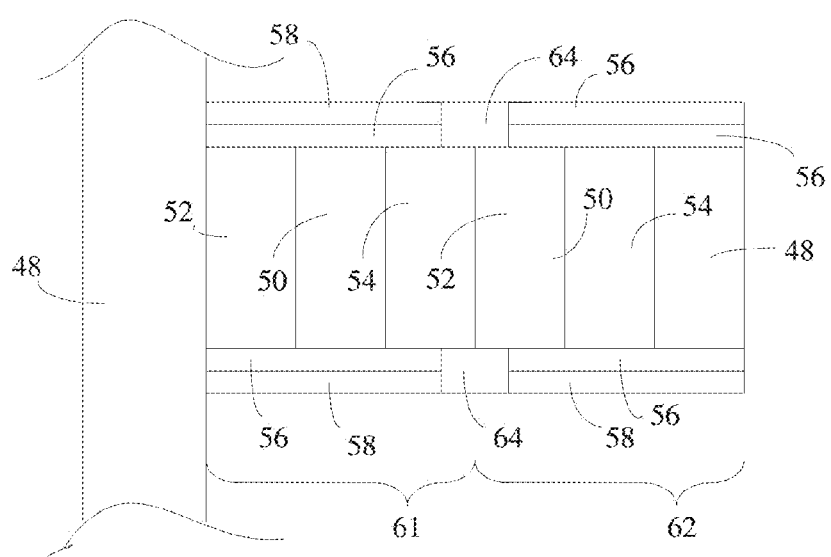
FIG. 7O is a cross section of a system that includes an inverter constructed vertically on a substrate.

The inverter of FIG. 7N can be constructed vertically as shown in FIG. 7O. For instance, the first CUTMOS transistor 61 can between the second CUTMOS transistor 62 and the base substrate 48. A spacer 64 can optionally be used to prevent direct electrical communication between the gate electrode 58 of the first CUTMOS transistor 61 and the gate electrode 58 of the second CUTMOS transistor 62. The spacer 64 can be an electrically non-conductive solid or can be a gas. For instance, the spacer can be the atmosphere in which the device is positioned such as ambient air. Electrical communication between the second region 54 of the first CUTMOS transistor 61 and the first region 52 of the second CUTMOS transistor 62 is provided by direct physical contact between the second region 54 of the first CUTMOS transistor 61 and the first region 52 of the second CUTMOS transistor 62. Alternately, an intermediary layer (not shown) can optionally be positioned between the second region 54 of the first CUTMOS transistor 61 and the first region 52 of the second CUTMOS transistor 62 and can provide electrical communication between the second region 54 of the first CUTMOS transistor 61 and the first region 52 of the second CUTMOS transistor 62. Suitable intermediary layers include, but are not limited to, metals, semimetals, and metal silicides. In instances where an intermediary layer is not present between the second region 54 of the first CUTMOS transistor 61 and the first region 52 of the second CUTMOS transistor 62, a nonconducting PN junction can form between the second region 54 of the first CUTMOS transistor 61 and the first region 52 of the second CUTMOS transistor 62. The use of an electrically conducting intermediary layer can defeat the PN junction. As noted above, the disclosed superlattices can be semimetals. Accordingly, the intermediary layer can include or consist of one or more of the disclosed superlattices. Use of one or more of the disclosed superlattices as an intermediary layer allows the intermediary layer to be epitaxially grown on the second region 54 of the first CUTMOS transistor 61 and/or the first region 52 of the second CUTMOS transistor 62 to be epitaxially grown on the intermediary layer.

Although not illustrated, the first CUTMOS transistor 61 and the second CUTMOS transistor 62 can include a terminal in electrical communication with the gate electrode 58, a terminal in electrical communication with the first region 52, and a terminal in electrical communication with the second region 54. Although not illustrated, the gate electrode 58 of the first CUTMOS transistor 61 is in electrical communication with the gate electrode 58 of the second CUTMOS transistor 61 such that the gate electrodes are at the same potential. Electronics (not shown) can be in electrical communication with each of the terminals and can be configured to apply electrical energy to the terminals in order to operate the first CUTMOS transistor 61 and the second CUTMOS transistor 62.

In the device of FIG. 7N or FIG. 7O, the channel 50, first region 52, and second region 54 can be the same for the first CUTMOS transistor 61 and the second CUTMOS transistor 62. For instance, the one or more superlattices included in the channel 50 of the first CUTMOS transistor 61 can be the same as the one or more superlattices included in the second CUTMOS transistor 62. Alternately, one, two, or three of the components selected from the group consisting of the channel 50, first region 52, and second region 54 included in the first CUTMOS transistor 61 can be different from the same component included in the second CUTMOS transistor 62.

During operation of an inverter constructed according to FIG. 7N or FIG. 7O, the first CUTMOS transistor 61 is operated as an NMOS transistor and the first CUTMOS transistor 62 is operated as a PMOS transistor. When the NMOS is OFF, the PMOS is ON and when the NMOS is ON, the PMOS is OFF. During operation, the source of the NMOS device (the first region 52 of the first CUTMOS transistor 61) is set at zero volts, and the source of the PMOS device (the first region 52 of the first CUTMOS transistor 61) is set at a positive voltage that is suitable for operation of the inverter. For instance, the level of the positive voltage is related to the device dimensions, as well as the target operation speed, power consumption and other parameters.

Figure 7P:
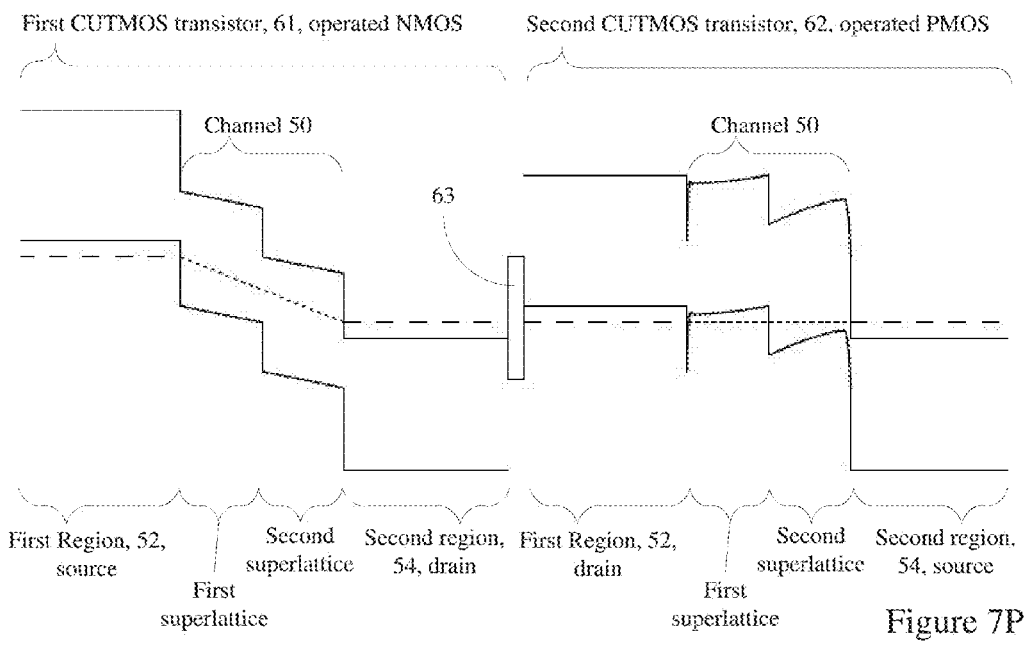
FIG. 7P show the band alignment for a system according to FIG. 7N or FIG. 7O where electronics have biased the inverter such that the second CUTMOS transistor is ON and the first CUTMOS transistor is OFF.
Figure 7Q:
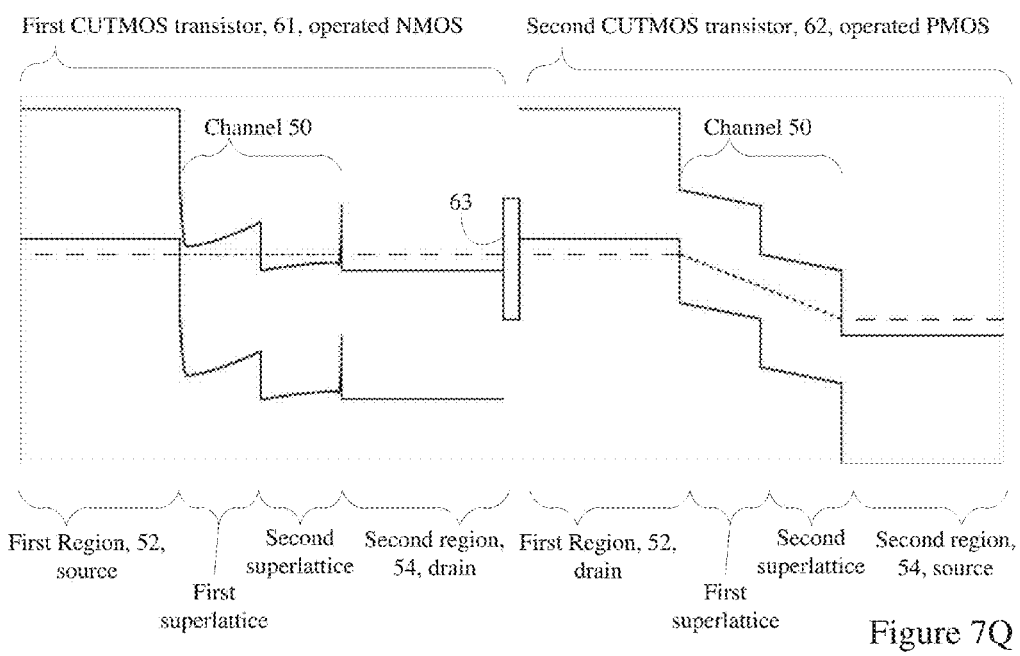

FIG. 7P and FIG. 7Q show the band alignment of CUTMOS transistors connected to function as a CMOS inverter such as is disclosed in the context of FIG. 7N and FIG. 7O. In FIG. 7P, the electronics have biased the inverter such that the second CUTMOS transistor 62 (PMOS) is ON and the first CUTMOS transistor 61 (NMOS) is OFF. For instance, the voltage of the source (first region 52) of the first CUTMOS transistor 61 (NMOS) is zero, VDS for the first CUTMOS transistor 61 is >0, VGS for the first CUTMOS transistor 61 is =0, the voltage at the drains for the first CUTMOS transistor 61 and the second CUTMOS transistor 62 (PMOS) is >0, the voltage at the gate of the second CUTMOS transistor 62 is zero, the voltage of the source of the second CUTMOS transistor 62 is >0, VDS for the second CUTMOS transistor 62 is =0, and VGS for the second CUTMOS transistor 62 is <0.

In contrast, in FIG. 7Q the electronics have biased the inverter such that the second CUTMOS transistor 62 (PMOS) is OFF and the first CUTMOS transistor 61 (NMOS) is ON. For instance, the voltage of the source (first region 52) of the first CUTMOS transistor 61 (NMOS)=0, VDS for the first CUTMOS transistor 61=0, VGS for the first CUTMOS transistor 61 is >0, the voltage at the drains for the first CUTMOS transistor 61 and the second CUTMOS transistor 62 (PMOS) is =0, the voltage of the gate of the second CUTMOS transistor 62 is >0, the voltage of the source of the second CUTMOS transistor 62 is >0, VDS for the second CUTMOS transistor 62 is <0, and VGS for the second CUTMOS transistor 62 is =0.

FIG. 7P and FIG. 7Q show that when a CUTMOS transistor is operated as an NMOS transistor in the ON state, electrons flow through the device structure while the hole current is negligible. Conversely, when a CUTMOS transistor is operated as a PMOS transistor in the ON state, holes flow through the device structure while electron current is negligible. As a result, a single CUTMOS transistor can function as either an NMOS transistor or PMOS transistor depending only on the bias conditions applied to it. Furthermore, the electronics can alternate back and forth between operating the CUTMOS transistor as a NMOS transistor and a PMOS transistor. For instance, the electronics can sequentially change from operating a CUTMOS transistor as an NMOS transistor to operating the CUTMOS transistor as a PMOS transistor, and then revert again to operating the CUTMOS transistor as a PMOS transistor.

Symmetric threshold voltages for NMOS and PMOS operation can be achieved when the superlattices and gate electrode(s) are selected such that, at the mid distance point between the First Region and Second Region, at the interface with the gate insulator, the difference in energy between the conduction band edge in the channel and the valence band edge in the First Region is substantially the same as the difference in energy between the valence band edge in the channel and the conduction band edge in the Second Region. These differences in energy already take into account the effects of the work-function of the gate electrode. This can be achieved with a single gate electrode having a work-function that produces such alignments. Alternately, this can be achieved with two different gate electrodes having work-functions that are smaller and larger, by the same amount, than the work-function of the single electrode that satisfies the conditions outlined above. The utilization an electrode with a smaller work-function enables the operation as NMOS at a smaller applied voltage, and the utilization an electrode with a larger work-function enables the operation as PMOS at a smaller applied voltage.

In some instances, the above transistors can have multiple gate electrodes. For instance, in the CUTMOS transistors of FIG. 7A, FIG. 7N, and FIG. 7O, gate electrodes 58 are shown on opposing sides of the components (first region 52, second regions 54, and channel). The illustrated gate electrodes 58 can represent different parts of the same electrode. Alternately, the illustrated gate electrodes can illustrate two different electrodes. When the gate electrodes 58 are different from one another, the electronics can use one of the gate electrodes 58 when operating the CUTMOS transistor as NMOS and the opposing gate electrode 58 when operating the CUTMOS transistor as PMOS. The work function for when the electronics operate the CUTMOS transistor as PMOS can be different from when the electronics operate the CUTMOS transistor as NMOS. The ability of these gate electrodes 58 to be different from one another allows the different electrodes to be constructed with different characteristics such as different materials and/or dimensions such as thickness. The different characteristics allows the work function for operating the CUTMOS transistor as PMOS to be optimized independently of the work function for operating the CUTMOS transistor as NMOS. As a result, the use of different gate electrodes can permit the threshold voltage of the CUTMOS transistor to be reduced for both PMOS and NMOS operation.

Although FIG. 7A, FIG. 7N and FIG. 7O show the first region 52 bonded to the base substrate 48, the second region 54 of a CUTMOS transistor can be bonded to the base substrate 48. For instance, the second region 54 can be grown directly on the base substrate 48.

The above superlattices can also be used in light sensors that convert light energy to electrical energy. For instance, a light absorbing layer in a light sensor can include or consist of one or more of the disclosed superlattices. Further, these light sensors can be included in optoelectronic devices. For instance, light sensors can be monolithically integrated with complementary metal-oxide semiconductor (CMOS) devices.

Figure 8A:
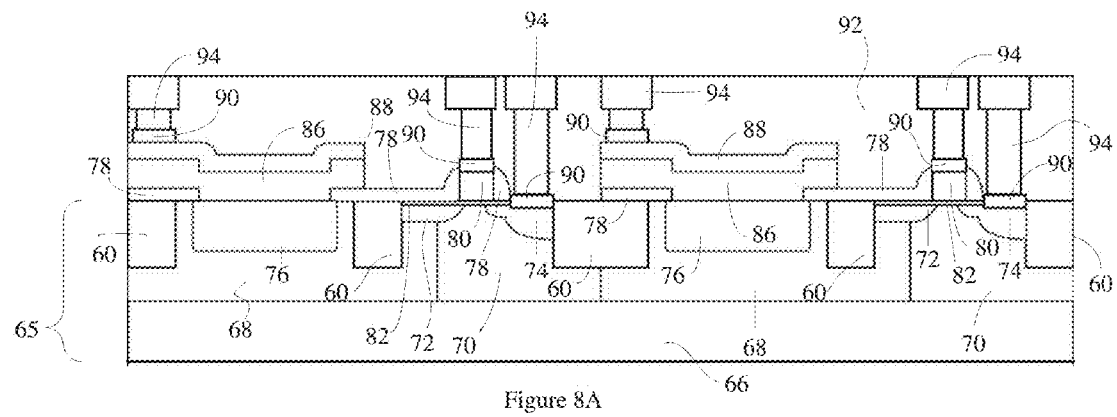
FIG. 8A is a cross section of an optoelectronic device that includes a light sensor electrically connected to a transistor.

FIG. 8A is a cross section of an optoelectronic device that includes a photodiode electrically connected to the source or drain of an NMOS transistor. This arrangement of photodiode and transistor is used in applications such as general light-sensors, CMOS image sensors, and optical transceivers.

The device is built on a substrate 65 that is doped so as to define a base region 66, first regions 68, second regions 70, source regions 72, drain regions 74, and third regions 76. The third regions extend into the first regions 68. The drain regions 74 extend into the second regions 70. Shallow trench isolation structures extend into the substrate 65. The base region 66, first regions 68, second regions 70, third regions 76, source regions 72 and drain regions 74 can each be doped so as to be an n-type region or a p-type region. In particular, the first region 68 can be doped so as to serve and an n-well or a p-well and the second regions 70 can be doped so as to serve and an n-well or a p-well. In the example shown in FIG. 8A, the base region 66 is doped so as to be a p-type base region 66, the first regions 68 are doped so as to be n-type first regions that serve as n-wells, the second regions 70 are doped so as to be p-type second regions that serve as p-wells, the third regions 76 are doped so as to be an n-type third regions, the source regions 72 are doped so as to be n-type source regions, and the drain regions 74 are doped so as to be n-type drain regions. The concentration of dopant in the first regions 68 and in the second regions 70 can be greater than the dopant concentration in the base region 66. The concentration of dopant in the third regions 76 can be greater than the dopant concentration in the first regions 68. The concentration of drain regions 74 can be greater than the dopant concentration in the source regions 72 which can be greater than the dopant concentration in the first region 68. The dopant concentration in the drain regions 74 can be sufficient to make the drain regions 74 degenerate semiconductors. Suitable materials for the substrate 65 include, but are not limited to, silicon, Thick-Film Silicon-on-Insulator (SOI), Thin-Film SOI, UltraThinFilm (UTF)-SOI, Thin-Film Germanium on Insulator (GOI or GeOI), and UltraThinFilm (UTF)-GOI, Thin-Film Silicon-Germanium on Insulator (GOI), and UltraThinFilm (UTF)-Silicon-Germanium on Insulator. Suitable materials for the shallow trench isolation structures include, but are not limited to, dielectric materials such as silicon oxide.

Insulators 78, gates 80, and gate insulators 82 are positioned on the substrate 65. The gate insulator 82 is positioned between the substrate 65 and the gate 80. Suitable materials for a gate insulator 82 include, but are not limited to dielectric materials such as silicon oxide, Si-oxynitride, High-K metal-oxide and metal-oxinitride materials, such as for example, Hf-oxide, Al-oxide, metal-alloy oxides, such as HfAl-oxide, and HfAlZr-oxide. A light-absorbing medium 86 is positioned between the third region 76 and a cap layer 88. The light-absorbing medium 86 can be in direct physical contact with the cap layer 88 and the third region 76. The light-absorbing medium 86 need not be doped and can accordingly be an intrinsic region. The cap layer 88 is electrically conducting and can be a doped region. In the example of FIG. 8A, the cap layer 88 can be doped so as to be a p-type cap layer. Suitable materials for the cap layer 88 include, but are not limited to, silicon, Ge, random alloys of $Si_{1-x}Ge_x$ where x is greater than or equal to 0 and/or less than or equal to 1, and $Si_{1-x-y}Ge_xC_y$ where x is greater than 0 and less than or equal to 1 and y is greater than 0 and less than or equal to 0.25.

Electrical contacts 90 are in direct physical contact with the cap layer 88, the gate 80, and the drain region 74. Suitable materials for the electrical contacts 90 include, but are not limited to, silicides such as Nickel-Silicide. A protective layer is positioned on the device such that the cap layer 88, the insulator 78, and the gate 80 are between the protective layer 92 and the substrate 65. A suitable protective layer 92 includes, but is not limited to, the layers called Pre-Metal Dielectric (PMD) in CMOS technology applications. Suitable materials for the protective layer 92 include, but are not limited to, silicon oxide. Electrical conductors 94 extend through the protective layer 92 to the electrical contacts 90. Electronics (not shown) can be in electrical communication with the electrical conductors 94. As a result, the electronics can apply electrical energy to the electrical conductors 94 in order to operate the device.

During operation of the device, the third region 76, the light-absorbing medium 86, and the cap layer 88 operate as a photodiode. In particular, the third region 76 and the cap layer 88 function as the anode and cathode of the photodiode. The electronics apply electrical energy to the electrical conductors 94 so as to apply a reverse bias across the photodiode. Electrical current flows through the photodiode in response to the absorption of light by the light-absorbing medium 86.

The first region 68 is sufficiently doped so as to provide electrical communication between the third region 76 of the photodiode and the source region 72 of the transistor. The source region 72, drain region 74 and gate 80 respectively act as the source, drain, and gate of the transistor. Further, the second region 70 is doped such that the portion of the second region 70 closest to the gate insulator 82 acts as the channel of the transistor. For instance, the second region 70 can include a gradient in the dopant concentration that allows the second region 70 to function as a retrograde well. The electronics can turn the transistor on and off enabling the photo-diode to be operated in different modes. For example, the pixels of CMOS Image Sensors (CIS) include multiple MOSFETs, and the MOSFET that interfaces directly with the photo-diode is called the Transfer Gate (TG). When operating the device as a pixel of CMOS Image Sensor, the device can be operated in a first mode where the transistor is turned OFF, and the photo-generated charges are integrated or accumulated during a finite time interval, commonly referred to as the shutter interval. By turning the transistor ON, the total amount of charge can be transferred to a different circuit element, such as a storage capacitor. A suitable storage capacitor includes capacitor often call a sense node in standard CMOS Image Sensors (CIS). An alternative mode of operation is to have the transistor turned ON while the photo-diode produces a photo-generated signal. In this case, the signal is not time integrated, and can be a photo-current signal that varies in real time according to optical signal absorbed by the photo-diode.

Figure 8B:
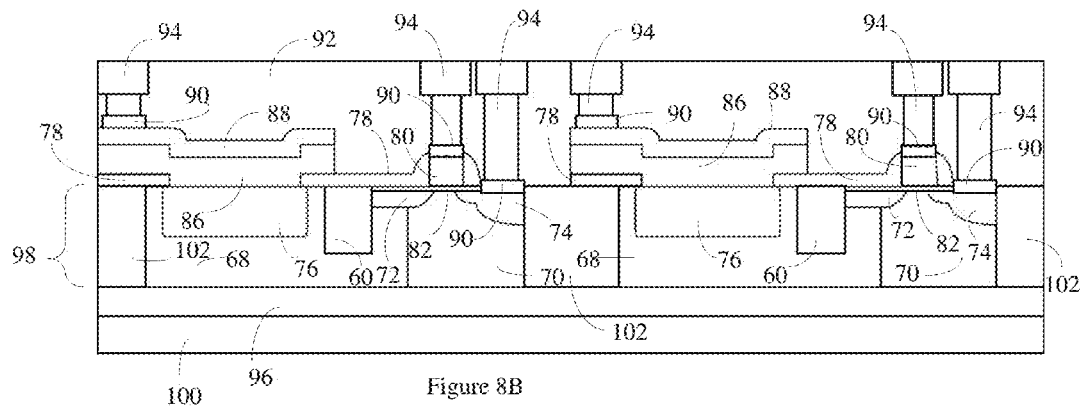
FIG. 8B is a cross section of an optoelectronic device that includes a light sensor electrically connected to a transistor.

The substrate 65 in the device of FIG. 8A is shown as a single layer of material but can be a multilayered substrate. For instance, FIG. 8B shows the device of FIG. 8A built on a Silicon-On-Insulator (SOI) wafer. A Silicon-On-Insulator (SOI) wafer includes a buried oxide layer 96 that is typically silicon oxide, between an upper layer 98 of silicon and a lower layer of silicon 100. As is evident in FIG. 8B, the first regions 68, second regions 70, third regions 76, source regions 72 and drain regions 74 are formed in the upper layer 98. Additionally, the shallow trench isolation structures extend into the upper layer of silicon. Deep trench isolation structures 102 extend into the upper layer of silicon. Suitable materials for the deep trench isolation structures 102 include, but are not limited to, dielectric materials such as silicon oxide.

The deep trench isolation structures 102 can optionally extend into contact with the buried oxide layer 96. Since silicon oxide is both less electrically conductive and less thermally conductive than silicon, extending the deep trench isolation structures 102 into contact with the silicon oxide layer can enhance the degree of thermal and electrical isolation of the different regions of the device. Increasing the thermal and electrical isolation of each combination of transistors and light sensors can reduce the thermal and electrical cross talk between adjacent circuits.

The device of FIG. 8A and FIG. 8B can have light approach the light sensor from above the device and/or below the device but are most efficient when light approaches the light sensor from above the device. When light penetrates the light-sensor from above the device, the light will penetrate the light-absorbing medium 86 after crossing the cap layer 88, which could be just a few nanometers thick and thinner than the substrate 65 or the upper layer 98. As a result, the light that reaches the light-absorbing medium 86 will not be substantially absorbed.

Figure 8C:
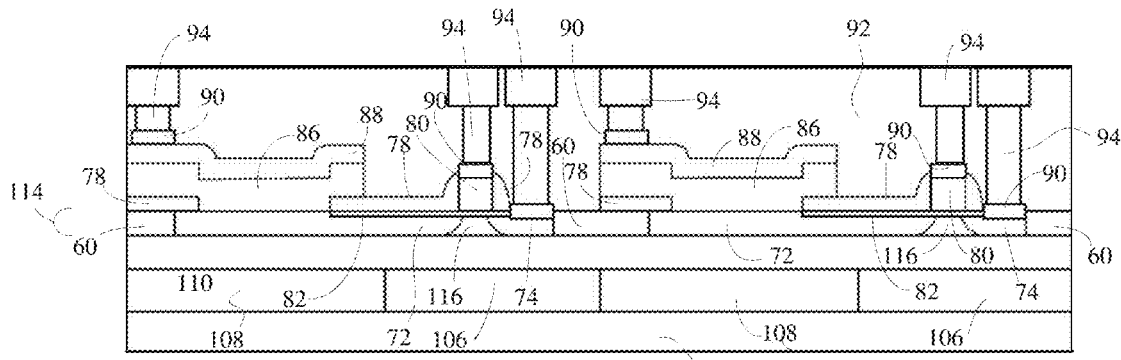
FIG. 8C is a cross section of an optoelectronic device that includes a light sensor electrically connected to a transistor.

FIG. 8C illustrates a version of the device that is efficient when light approaches the light sensor from the bottom of the device. The device is built on a base substrate 104 that is transparent to at least the wavelength(s) of light that is to be detected by the device. Suitable base substrates 104 include, but are not limited to, glass, quartz, sapphire, and plastics with suitable optical properties. For instance, if the wavelength(s) of light to be detected by the device are only in the IR range a suitable base substrates 104 is silicon.

Light blocking layers 106 and wavelength filters 108 can optionally be positioned between the base substrate 104 and an intermediate layer 110. The light blocking layers 106 can be configured to block incoming light. For instance, the light blocking layers 106 can be configured to absorb or reflect the incoming light. The wavelength filters 108 are configured to pass light having wavelength in a range that includes the wavelength(s) of light that is to be detected by the device while blocking at least a portion of the light wavelengths that are not to be detected by the device. Suitable wavelength filters 108 include, but are not limited to, conventional color dyes used in CMOS Image Sensors, one or more layers of dielectric materials, one or more layers of dielectric material stacked with one or more metal layers, patterned layers that include one or metal layers metal(s) on dielectrics suitable for surface plasmon wavelength filters. Suitable light blocking layers include, but are not limited to, metal film(s). Suitable intermediate layers 110 include, but are not limited to, silicon-oxide, silicon-oxynitride, sapphire—$Al_2O_3$—for silicon-on-sapphire (SOS) substrates.

A semiconductor layer 114 is positioned on the intermediate layer 110. The semiconductor layer 114 includes doped regions such as channels 116, source regions 72 and drain regions 74. Shallow trench isolation structures extend into the semiconductor layer 114 and can optionally extend into contact with the intermediate layer 110. The channels 116, source regions 72 and drain regions 74 can each be doped so as to be an n-type region or a p-type region. In the example shown in FIG. 8C, the source regions 72 are doped so as to be n-type source regions, the channels 116 are doped so as to be p-type channels, and the drain regions 74 are doped so as to be n-type drain regions. The dopant concentration in the drain regions 74 can optionally be sufficient to make the drain regions 74 degenerate semiconductors. The channels 116 can be doped such that the channels 116 can act as the channel for the transistor. Suitable materials for the semiconductor layer 114 include, but are not limited to, Si, Ge, random alloys of $Si_{1-x}Ge_x$ where x is greater than or equal to 0 and/or less than or equal to 1, and random alloys of $Si_{1-x-y}Ge_xC_y$ where x is greater than 0 and less than or equal to 1 and y is greater than 0 and less than or equal to 0.25.

Insulators 78, gates 80, and gate insulators 82 are positioned on the semiconductor layer 114. The gate insulator 82 is positioned between the semiconductor layer 114 and the gate 80. A light-absorbing medium 86 is positioned between the source region 72 and a cap layer 88. The light-absorbing medium 86 can be in direct physical contact with the cap layer 88 and the source region 72. The light-absorbing medium 86 need not be doped and can accordingly be an intrinsic region. The cap layer 88 can be a doped region. In the example of FIG. 8C, the cap layer 88 can be doped so as to be a p-type cap layer. Suitable materials for the cap layer 88 include, but are not limited to, Si, Ge, random alloys of $Si_{1-x}Ge_x$ where x is greater than or equal to 0 and/or less than or equal to 1, and random alloys of $Si_{1-x-y}Ge_xC_y$ where x is greater than 0 and less than or equal to 1 and y is greater than 0 and less than or equal to 0.25.

Electrical contacts 90 are in direct physical contact with the cap layer 88, the gate 80, and the drain region 74. Suitable materials for the electrical contact 90 include, but are not limited to, silicides, such as Nickel-Silicide. A protective layer 92 is positioned on the device such that the cap layer 88, the insulator 78, and the gate 80 are between the protective layer 92 and the semiconductor layer 114 or between the top surface of the protective layer 92 and the semiconductor layer 114. Suitable protective layer 92 include, but are not limited to, the layers called Pre-Metal Dielectric (PMD) in CMOS technology applications. Electrical conductors 94 extend through the protective layer 92 to the electrical contacts 90. Electronics (not shown) can be in electrical communication with the electrical conductors 94. As a result, the electronics can apply electrical energy to the electrical conductors 94 in order to operate the device.

During operation of the device, the source region 72, the light-absorbing medium 86, and the cap layer 88 operate as a photodiode. In particular, the source region 72 and the cap layer 88 function as the anode and cathode of the photodiode. The electronics apply electrical energy to the electrical conductors 94 so as to apply a reverse bias across the photodiode. Electrical current flows through the photodiode in response to the absorption of light by the light-absorbing medium 86.

The source region 72 is sufficiently doped so as to provide electrical communication between the light-absorbing medium 86 and the channel 116. As a result, the source region 72, channel 116, drain region 74 and gate 80 respectively act as the source, channel, drain, and gate of the transistor. The photodiodes illustrated in FIG. 8A through FIG. 8C can be pinned photodiodes. Pinned photodiodes are the type of photodiode that currently has the lowest noise levels (dark currents, i.e., leakage currents in the absence of light impinging on the photo-diode). As a result, the most widely used pixel technology is based on Pinned Photo-Diodes (PPDs). In silicon photodiode platforms, a major sources of dark currents are regions where the silicon lattice terminates such as interfaces between the silicon and other materials such as $SiO_2$ and/or where the silicon has more defects.

Pinned photodiodes include a pinning layer that electrically decouples the light-absorbing medium in the photodiode from the regions where silicon interfaces with other materials, such as the shallow trench isolation (STI) regions or the top surface of the wafer substrate. Electronics generally keep the pinning layer at a fixed potential, while the light-absorbing medium is allowed to float, depending on the amount of charges generated by photo-absorption.

Figure 8D:
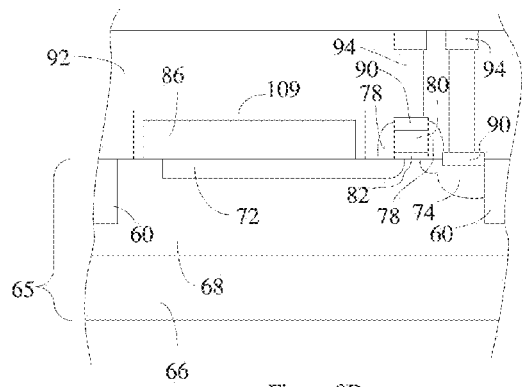
FIG. 8D is a cross section of an optoelectronic device that includes a pinned photodiode electrically connected to the source or drain of an NMOS transistor.
Figure 8E:
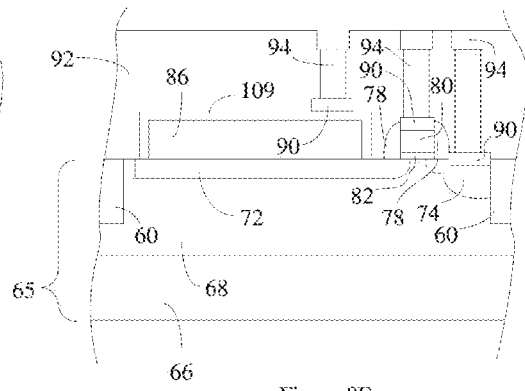
FIG. 8E is a cross section of an optoelectronic device that includes a pinned photodiode electrically connected to the source or drain of an NMOS transistor.
Figure 8F:
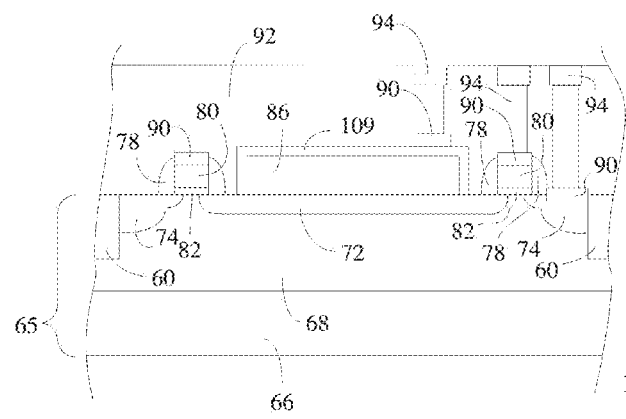
FIG. 8F is a cross section of an optoelectronic device that includes a pinned photodiode electrically connected to the source or drain of an NMOS transistor that surrounds the photodiode.
Figure 8G:
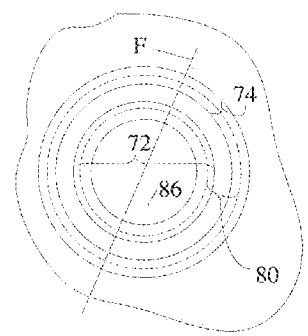
FIG. 8G is a topview of a portion of the components on the device shown in FIG. 8F in order to illustrate the relative positions of the components shown in the cross section of FIG. 8F. The cross section shown in FIG. 8F can be taken along the line labeled F in FIG. 8G.
Figure 8H:
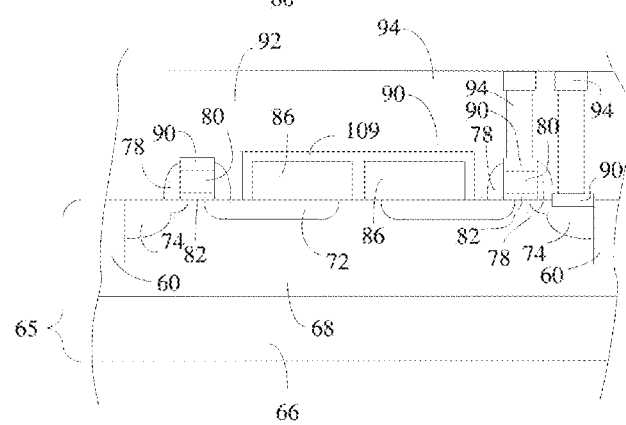
FIG. 8H is a cross section of an optoelectronic device that includes a pinned photodiode electrically connected to the source or drain of an NMOS transistor that surrounds the photodiode.
Figure 8I:
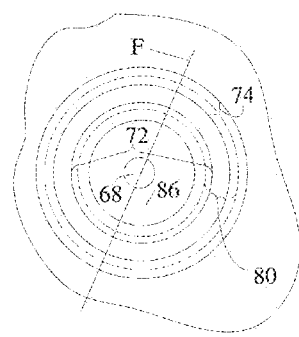
FIG. 8I is a topview of a portion of the components on the device shown in FIG. 8H in order to illustrate the relative positions of the components shown in the cross section of FIG. 8H. The cross section shown in FIG. 8H can be taken along the line labeled F in FIG. 8I.
Figure 8J:
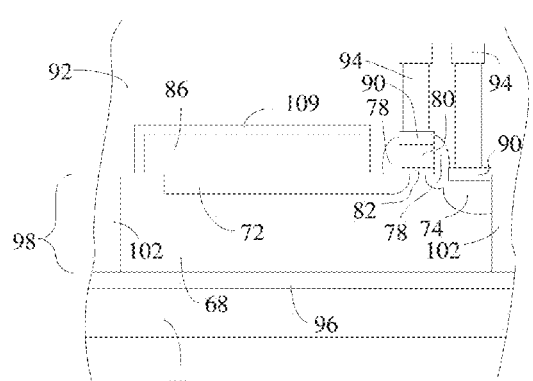
FIG. 8J shows the device of FIG. 8D built on a Silicon-On-Insulator (SOI) wafer.
Figure 8K:
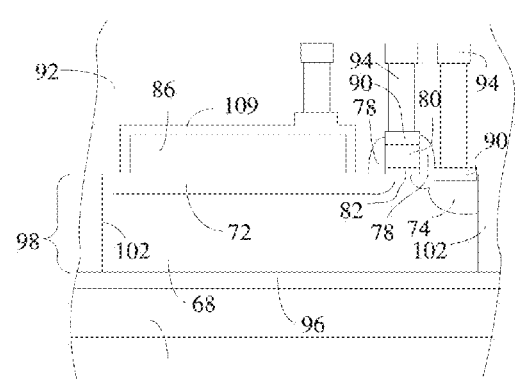
FIG. 8K shows the device of FIG. 8E built on a Silicon-On-Insulator (SOI) wafer.
Figure 8L:
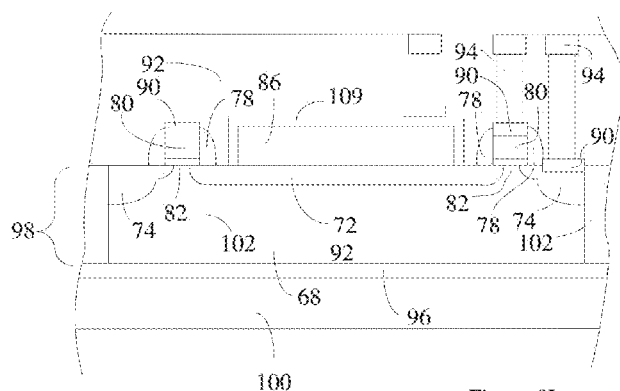
FIG. 8L shows the device of FIG. 8F built on a Silicon-On-Insulator (SOI) wafer.
Figure 8Q:
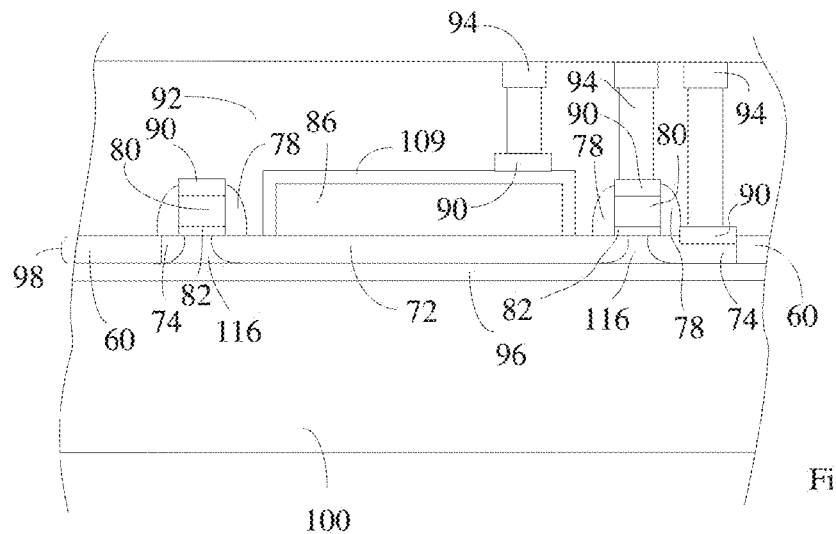
Figure 8R:
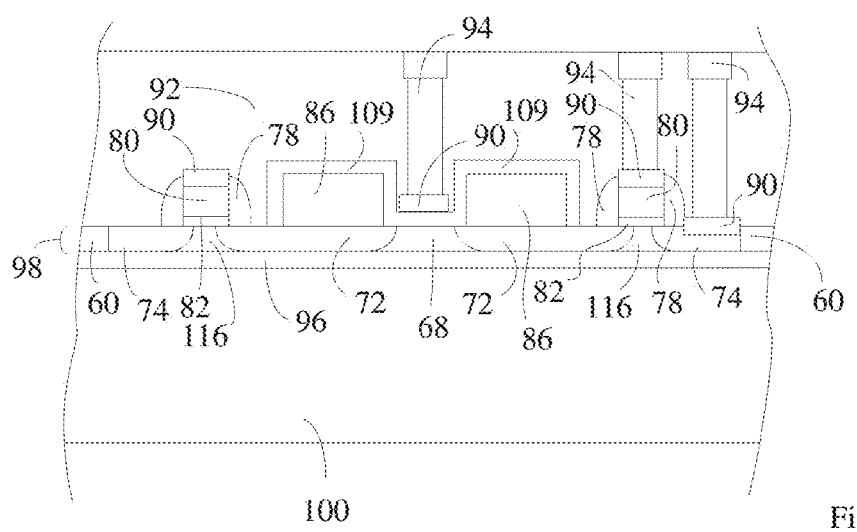

FIG. 8D through FIG. 8R provide examples of optoelectronic devices that include pinned photodiodes. For instance, FIG. 8D is a cross section of an optoelectronic device that includes a pinned photodiode electrically connected to the source or drain of an NMOS transistor. This arrangement of photodiode and transistor is used in applications such as general light-sensors, CMOS image sensors, and optical transceivers. The device is built on a substrate 65 having a base region 66, a first region 68, a source region 72 and a drain region 74. The first region 68, a source region 72 and a drain region 74 are doped regions of the substrate 65. The source region 72 and drain region 74 extend into the first region 68. Shallow trench isolation structures 60 extend into the substrate 65. The base region 66, first region 68, source region 72 and drain region 74 can each be doped so as to be an n-type region or a p-type region. In the example shown in FIG. 8D, the base region 66 is doped so as to be a p-type base region 66, the first region 68 is doped so as to be p-type first region and can serve as a p-well, the source region 72 is doped so as to be n-type source region, and the drain region 74 is doped so as to be n-type drain region. The concentration of dopant in the first regions 68 can be greater than the dopant concentration in the base region 66. The concentration of dopant in the drain region 74 can be greater than the dopant concentration in the source regions 72 which can be greater than the dopant concentration in the first region 68. The dopant concentration in the drain regions 74 can be sufficient to make the drain regions 74 degenerate semiconductors. Suitable materials for the substrate 65 include, but are not limited to, silicon, Thick-Film Silicon-on-Insulator (SOI), Thin-Film SOI, UltraThinFilm (UTF)-SOI, Thin-Film Germanium on Insulator (GOI or GeOI), and UltraThinFilm (UTF)-GOI, Thin-Film Silicon-Germanium on Insulator (GOI), and UltraThinFilm (UTF)-Silicon-Germanium on Insulator. Suitable materials for the shallow trench isolation structures 60 include, but are not limited to, dielectric materials such as silicon oxide.

An insulator 78, gate 80, and gate insulator 82 are positioned on the substrate 65. The gate insulator 82 is positioned between the substrate 65 and the gate 80. A light-absorbing medium 86 is positioned between the source region 72 and a pinning layer 109. The light-absorbing medium 86 can be in direct physical contact with the pinning layer 109 and the source region 72. The pinning layer 109 is in electrical communication with the first region 68. For instance, the pinning layer 109 can be in direct physical contact with the first region 68. The first region 68, pinning layer 109 and source region 72 can surround the light-absorbing medium 86.

The pinning layer 109 is doped with the same polarity as the first region 68. For instance, when the first region 68 is doped so as to be a p-type first region 68, the pinning layer 109 is doped so as to be a p-type pinning layer 109. The concentration of dopant in the pinning layer 109 can exceed the concentration of dopant in the first region 68. In some instances, the pinning layer 109 is degeneratively doped.

The light-absorbing medium 86 need not be doped or can be lightly doped. When the light-absorbing medium 86 is lightly doped, it is doped with the opposite polarity of the pinning layer 109. For instance, when the pinning layer 109 is a p-type pinning layer 109, the light-absorbing medium 86 can be lightly doped so as to be an n-type light-absorbing medium 86.

Suitable materials for the pinning layer 109 include, but are not limited to, Si, Ge, random or ordered alloys of $Si_{1-x}Ge_x$ where x is greater than or equal to 0 and/or less than or equal to 1, $Si_{1-y}C_y$ where y is greater than 0 and less than or equal to 0.25, and $Si_{1-x-y}Ge_xC_y$ where x is greater than 0 and less than or equal to 1 and y is greater than 0 and less than or equal to 0.25.

Electrical contacts 90 are in direct physical contact with the gate 80, and the drain region 74. Suitable materials for the electrical contacts 90 include, but are not limited to, silicides such as Nickel-Silicide. A protective layer is positioned on the device such that the pinning layer 109, the insulator 78, and the gate 80 are between the protective layer 92 and the substrate 65. Suitable protective layers 92 include, but are not limited to, the layers called Pre-Metal Dielectric (PMD) in CMOS technology applications. Suitable materials for the protective layer 92 include, but are not limited to, silicon oxide. Electrical conductors 94 extend through the protective layer 92 to the electrical contacts 90. Electronics (not shown) can be in electrical communication with the electrical conductors 94. As a result, the electronics can apply electrical energy to the electrical conductors 94 in order to operate the device. Additionally, the electronics can be in electrical communication with the first region 68 so as to control the potential of the first region 68. Alternately, the first region 68 can be grounded.

During operation of the device, the source region 72, the light-absorbing medium 86, and the pinning layer 109 operate as a pinned photodiode. In particular, the source region 72 and the pinning layer 109 function as the anode and cathode of the photodiode. The electronics apply electrical energy to the electrical conductors 94 so as to form a reverse bias across the photodiode. Since the pinning layer 109 is in electrical communication with the first region, the first region 68 and the pinning layer are at the same potential during operation of the photodiode. In some instances, the electronics apply electrical energy to the first region 68 so as to form the reverse bias or make use of the grounded potential of the first region 68 so as to form the reverse bias. Electrical current flows through the photodiode in response to the absorption of light by the light-absorbing medium 86.

The source region 72, drain region 74 and gate 80 respectively act as the source, drain, and gate of the transistor. Further, the first region 68 is doped such that the portion of the first region 68 closest to the gate insulator 82 acts as the channel of the transistor. For instance, the first region 68 can include a gradient in the dopant concentration that allows the first region 68 to function as a retrograde well. The electronics can turn the transistor on and off enabling the photo-diode to be operated in different modes as described above.

The device of FIG. 8D can be modified such that the pinning layer 109 is not in electrical communication with the first region 68 as shown in FIG. 8E. FIG. 8E is a cross section of an optoelectronic device that includes a pinned photodiode electrically connected to the source or drain of an NMOS transistor. The pinning layer 109 contacts the source region 72 on opposing sides of the light-absorbing medium 86. Accordingly, the pinning layer 109 and source region 72 surrounds the light-absorbing medium 86. Since the pinning layer 109 does not contact the first region 68, an electrical conductor 94 extends through the protective layer 92 to an electrical contact 90 in direct physical contact with the pinning layer 109. As discussed in the context of FIG. 8D, other electrical conductors 94 are in electrical communication with the gate 80, and the drain region 74. The electronics can be in electrical communication with the electrical conductors 94 and during operation of the device can apply electrical energy to the electrical conductors 94 so as to form a reverse bias across the photodiode.

When the pinning layer 109 is not in electrical communication with the first region 68 as shown in FIG. 8E, the electrical potential applied to the pinning layer 109 can have a larger magnitude than possible or desirable by applying the potential through the first region 68 of the FIG. 8D device because the potential of the FIG. 8D device may be limited by the resulting electric field across the gate insulator of the TG-NMOS. Larger (negative) voltages applied to the pinning layer 109 allow for the operation of the photodiode in the avalanche mode. Avalanche breakdown takes place inside the light-absorbing medium 86, rather than the junction region formed by the pinning layer 109 and the source region 72 because the light-absorbing medium 86 can have a lower avalanche breakdown voltage due to a smaller bandgap of the light-absorbing medium 86 than the bandgap of silicon.

The device of FIG. 8E can be modified such that the transistor partially or fully surrounds the photodiode. For instance, FIG. 8F is a cross section of an optoelectronic device that includes a pinned photodiode electrically connected to the source or drain of an NMOS transistor that surrounds the photodiode. FIG. 8G is a topview of a portion of the components on the device shown in FIG. 8F in order to illustrate the relative positions of the components shown in the cross section of FIG. 8F. The cross section shown in FIG. 8F can be taken along the line labeled F in FIG. 8G.

As is most evident from FIG. 8G, a portion of the components of the transistor surround the photodiode. For instance, the gate 80 surround the light-absorbing medium 86. Additionally, an imaginary plane can be parallel to the upper or lower surface of the light-absorbing medium 86 and extend through the light-absorbing medium 86. A projection of the drain regions 74 onto the imaginary plane surrounds the light-absorbing medium 86. Further, a projection of the perimeter of the source region 72 onto the imaginary plane surrounds the light-absorbing medium 86. Although not evident from FIG. 8G, a projection of the gate insulators 82 onto the imaginary plane optionally surrounds the light-absorbing medium 86 as is evident from FIG. 8F showing the gate insulators 82 on opposing sides of the light-absorbing medium 86. Although not evident from FIG. 8G, a projection of the portion of the first region that acts as the channel onto the imaginary plane can surround the light-absorbing medium 86 as is evident from FIG. 8F showing the this portion of the first region on opposing sides of the light-absorbing medium 86. In some instances, a projection of the electrical contact 90 that contacts the gate onto the plane surrounds the light-absorbing medium 86 as is evident from FIG. 8F showing this electrical contact 90 on opposing sides of the light-absorbing medium 86. An advantage of the device configuration shown in FIG. 8F and FIG. 8G is that the MOSFET associated with the photo-diode, usually designated as the Transfer-Gate (TG), can be a ring-shaped MOSFET which completely surrounds the photo-diode layers. Ring-MOSFETs are devices known for their extremely low leakage currents, much smaller than the rectangular-shaped MOSFETs, in which the source, channel and drain regions are interfaced with a trench isolation region, typically filled with silicon oxide. That interface is a pathway for leakage currents from source through the channel to the drain, and from the drain to the substrate.

As with the device of FIG. 8E, the pinning layer 109 does not contact the first region 68. As a result, an electrical conductor 94 extends through the protective layer 92 to an electrical contact 90 in direct physical contact with the pinning layer 109. As discussed in the context of FIG. 8D, other electrical conductors 94 are in electrical communication with the gate 80, and the drain region 74. The electronics can be in electrical communication with the electrical conductors 94 and during operation of the device can apply electrical energy to the electrical conductors 94 so as to form a reverse bias across the photodiode.

The device of FIG. 8F and FIG. 8G can be modified such that the pinning layer 109 is in electrical communication with the first region 68. For instance, FIG. 8H is a cross section of an optoelectronic device that includes a pinned photodiode electrically connected to the source or drain of an NMOS transistor that surrounds the photodiode. FIG. 8I is a topview of a portion of the components on the device shown in FIG. 8H in order to illustrate the relative positions of the components shown in the cross section of FIG. 8H. The cross section shown in FIG. 8H can be taken along the line labeled F in FIG. 8I.

The source region 72 is arranged such that a portion of the first region 68 extends through the source region 72 to the upper surface of the substrate 65. Additionally, the pinning layer extends through the light-absorbing medium 86 into contact with the underlying first region. Accordingly, the source region 72 optionally surrounds a portion of the first region 68 and the light-absorbing medium 86 optionally surrounds a portion of the pinning layer 109. Accordingly, the pinning layer 109 is in electrical communication with the first region 68 as is discussed in the context of FIG. 8A.

The electronics can be in electrical communication with the first region 68 so as to control the potential of the first region 68 and accordingly of the pinning layer 109. Alternately, the first region 68 can be grounded. During operation of the device, the electronics apply electrical energy to the electrical conductors 94 so as to form a reverse bias across the photodiode. Since the pinning layer 109 is in electrical communication with the first region 68, the first region 68 and the pinning layer are at the same potential during operation of the photodiode. In some instances, the electronics apply electrical energy to the first region 68 so as to form the reverse bias or make use of the grounded potential of the first region 68 so as to form the reverse bias. Electrical current flows through the photodiode in response to the absorption of light by the light-absorbing medium 86. An advantage to this configuration is that the Transfer Gate is a Ring-MOSFET, but the pinning layer 109 is in direct electrical contact with first region 68 and therefore it is not necessary to form a separate electrical contact to layer 109.

The substrate 65 in the devices of FIG. 8D through FIG. 8I is shown as a single layer of material but can be a multilayered substrate. For instance, FIG. 8J shows the device of FIG. 8D built on a Silicon-On-Insulator (SOI) wafer. FIG. 8K shows the device of FIG. 8E built on a Silicon-On-Insulator (SOI) wafer. FIG. 8L shows the device of FIG. 8F built on a Silicon-On-Insulator (SOI) wafer. FIG. 8M shows the device of FIG. 8H built on a Silicon-On-Insulator (SOI) wafer. A Silicon-On-Insulator (SOI) wafer includes a buried oxide layer that is typically silicon oxide, between an upper layer of silicon and a lower layer of silicon. As is evident in FIG. 8J through FIG. 8H, the first regions 68, source regions 72 and drain regions 74 are formed in the upper layer 98. Additionally, deep trench isolation structures 102 extend into the upper layer of silicon. Suitable materials for the deep trench isolation structures 102 include, but are not limited to, dielectric materials such as silicon oxide.

The devices of FIG. 8D through FIG. 8M can also be constructed on the thin film or ultra thin film of a platforms such as Thin-Film SOI, UltraThinFilm (UTF)-SOI, Thin-Film Germanium on Insulator (GOI), and UltraThinFilm (UTF)-GOI, Thin-Film Silicon-Germanium on Insulator, and UltraThinFilm (UTF)-Silicon-Germanium on Insulator. For the purposes of illustration, FIG. 8N through FIG. 8R illustrate the devices of FIG. 8D through FIG. 8M constructed on a Thin-Film SOI platform.

FIG. 8N illustrates the device of FIG. 8D or FIG. 8J built on a thin-film platforms or on an ultra-thin-film platform. Examples of suitable substrates for a thin-film platform include, but are not limited to, thin film Silicon-On-Insulator (SOI) wafer and examples of suitable substrates for a ultra thin-film platforms include, but are not limited to, ultra-thin-film Silicon-On-Insulator (SOI) wafer. The phrase "Thin-Film" refers to the layer of the substrate that includes the source region 72. As noted above, the Silicon-On-Insulator (SOI) wafers includes a buried oxide layer 96 that is typically silicon oxide, between an upper layer 98 of silicon and a lower layer 100 of silicon. In the case of Silicon-On-Insulator (SOI) wafers, the "Thin-Film" or "Ultra-Thin-Film" typically refers to the upper layer 98. The thin film typically has a thickness less than 100 nm or even less than 10 nm. Depending on the thickness, the source region 72 often extend through the "thin film" or the "ultra-thin-film" into contact with an underlying layer of the device. In these situations, the first region 68 can not operate as a p-well or an n-well.

The upper layer 98 includes a first region 68, a source region 72, a drain region 74 and a channel 116. Shallow trench isolation structures 60 extend into the upper layer 98. The first region 68, source region 72, and drain region 74, and channel 116 can each be doped regions of the upper layer 98 and can be doped so as to be an n-type region or a p-type region. In the example shown in FIG. 8N, the first region 68 is doped so as to be p-type first region 68, the source region 72 is doped so as to be n-type source region, the drain region 74 is doped so as to be an n-type drain region, and the channel 116 is doped so as to be a p-type channel. The concentration of dopant in the first regions 68 can be greater than the dopant concentration in the base region 66. The concentration of dopant in the drain region 74 can be greater than the dopant concentration in the source regions 72 which can be greater than the dopant concentration in the first region 68. The dopant concentration in the drain regions 74 can be sufficient to make the drain regions 74 degenerate semiconductors. The channel 116 can be doped such that the channel 116 acts as the channel for the transistor. In some instances, the concentration of dopant in the first region 68 is sufficient to provide good ohmic contact with the electrical conductors 94. In contrast, the concentration of dopant in the channel 116 can determine the threshold voltage for the transistor. As a result, the concentration of dopant in the first region 68 can be higher than the concentration of dopant in the channel 116.

An insulator 78, gate 80, and gate insulator 82 are positioned on the upper region 98. The gate insulator 82 is positioned between the upper region 98 and the gate 80. A light-absorbing medium 86 is positioned between the source region 72 and a pinning layer 109. The light-absorbing medium 86 can be in direct physical contact with the pinning layer 109 and the source region 72. The pinning layer 109 is in electrical communication with the first region 68. For instance, the pinning layer 109 can be in direct physical contact with the first region 68. The combination of the first region 68, pinning layer 109 and source region 72 can surround the light-absorbing medium 86.

The pinning layer 109 is doped with the same polarity as the first region 68. For instance, when the first region 68 is doped so as to be a p-type first region 68, the pinning layer 109 is doped so as to be a p-type pinning layer 109. The concentration of dopant in the pinning layer 109 can exceed the concentration of dopant in the first region 68. In some instances, the pinning layer 109 is degeneratively doped.

The light-absorbing medium 86 need not be doped or can be lightly doped. When the light-absorbing medium 86 is lightly doped, it is doped with the opposite polarity of the pinning layer 109. For instance, when the pinning layer 109 is a p-type pinning layer 109, the light-absorbing medium 86 can be lightly doped so as to be an n-type light-absorbing medium 86.

Suitable materials for the pinning layer 109 include, but are not limited to, Si, Ge, random or ordered alloys of $Si_{1-x}Ge_x$ where x is greater than or equal to 0 and/or less than or equal to 1, $Si_{1-y}C_y$ where y is greater than 0 and less than or equal to 0.25, and $Si_{1-x-y}Ge_xC_y$ where x is greater than 0 and less than or equal to 1 and y is greater than 0 and less than or equal to 0.25.

Electrical contacts 90 are in direct physical contact with the gate 80, the drain region 74, and the first region 68. Suitable materials for the electrical contacts 90 include, but are not limited to, silicides such as Nickel-Silicide. A protective layer 92 is positioned on the device such that the pinning layer 109, the insulator 78, and the gate 80 are between the protective layer 92 and the upper region 98. A suitable protective layer 92 includes, but is not limited to, the layers called Pre-Metal Dielectric (PMD) in CMOS technology applications. Suitable materials for the protective layer 92 include, but are not limited to, silicon oxide. Electrical conductors 94 extend through the protective layer 92 to the electrical contacts 90. Electronics (not shown) can be in electrical communication with the electrical conductors 94. As a result, the electronics can apply electrical energy to the electrical conductors 94 in order to operate the device.

During operation of the device, the source region 72, the light-absorbing medium 86, and the pinning layer 109 operate as the components of a pinned photodiode. In particular, the source region 72 and the pinning layer 109 function as the anode and cathode of the photodiode. The electronics apply electrical energy to the electrical conductors 94 so as to form a reverse bias across the photodiode. Since the pinning layer 109 is in electrical communication with the first region 68, the first region 68 and the pinning layer are at the same potential during operation of the photodiode. Accordingly, the electronics can apply electrical energy to the first region 68 so as to form the reverse bias. Electrical current flows through the photodiode in response to the absorption of light by the light-absorbing medium 86.

The source region 72 is sufficiently doped so as to provide electrical communication between the light-absorbing medium 86 and the channel 116. As a result, the source region 72, channel 116, drain region 74 and gate 80 respectively act as the source, channel, drain, and gate of the transistor. The electronics can turn the transistor on and off enabling the photo-diode to be operated in different modes as described above.

In the device of FIG. 8N, the bottom of the light absorbing medium contacts the first region 68; however the device can be modified so the bottom of the light absorbing medium does not contact the first region as shown in FIG. 8O. The light-absorbing medium 86 is positioned within the perimeter of the source region 72. The electrical contact 90 is in contact with a portion of the pinning layer that extends away from the light-absorbing medium 86 and is located the substrate. In some instances, the portion of the pinning layer that extends away from the light-absorbing medium 86 contacts the substrate 65.

The device of FIG. 8N can be modified such that the pinning layer 109 is not in electrical communication with the first region 68 as shown in FIG. 8E. For instance, FIG. 8P illustrates the device of FIG. 8E or FIG. 8K built on a Thin-Film SOI platform or on an Ultra-Thin-Film SOI platform. The pinning layer 109 contacts the source region 72 on opposing sides of the light-absorbing medium 86. Accordingly, the pinning layer 109 and source region 72 surrounds the light-absorbing medium 86. Since the pinning layer 109 does not contact the first region 68, an electrical conductor 94 extends through the protective layer 92 to an electrical contact 90 in direct physical contact with the pinning layer 109. As discussed in the context of FIG. 8N, other electrical conductors 94 are in electrical communication with the gate 80, and the drain region 74. The electronics can be in electrical communication with the electrical conductors 94 and during operation of the device can apply electrical energy to the electrical conductors 94 so as to form a reverse bias across the photodiode.

The device of FIG. 8P can be modified such that the transistor partially or fully surrounds the photodiode. For instance, FIG. 8Q illustrates the device of FIG. 8F and FIG. 8G or the device of FIG. 8L built on the Thin-Film SOI platform or on an Ultra-Thin-Film SOI platform. As described in the context of FIG. 8G, a portion of the transistor components surround the photodiode. For instance, the gate 80 can surround the light-absorbing medium 86 as is evident from FIG. 8Q showing gate 80 on opposing sides of the light-absorbing medium 86. Additionally, as described in the context of FIG. 8G, an imaginary plane can be parallel to the upper or lower surface of the light-absorbing medium 86 and extend through the light-absorbing medium 86. A projection of the drain regions 74 onto the imaginary plane surrounds the light-absorbing medium 86 as is evident from FIG. 8Q showing drain regions 74 on opposing sides of the light-absorbing medium 86. Further, a projection of the perimeter of the source region 72 onto the imaginary plane surrounds the light-absorbing medium 86 as is evident from FIG. 8Q showing the source region 72 on opposing sides of the light-absorbing medium 86. A projection of the gate insulators 82 onto the imaginary plane optionally surrounds the light-absorbing medium 86 as is evident from the FIG. 8Q showing the gate insulators 82 on opposing sides of the light-absorbing medium 86. A projection of the channel 116 onto the imaginary plane optionally surrounds the light-absorbing medium 86 as is evident from the FIG. 8Q showing the channel 116 on opposing sides of the light-absorbing medium 86. In some instances, a projection of the electrical contact 90 that contacts the gate onto the plane surrounds the light-absorbing medium 86 as is evident from the FIG. 8Q showing this electrical contact 90 on opposing sides of the light-absorbing medium 86. An advantage of the device configuration shown in FIG. 8Q is that the Transfer Gate is a Ring-MOSFET.

The pinning layer 109 does not contact the first region 68. As a result, an electrical conductor 94 extends through the protective layer 92 to an electrical contact 90 in direct physical contact with the pinning layer 109. As discussed in the context of FIG. 8N, other electrical conductors 94 are in electrical communication with the gate 80, and the drain region 74. The electronics can be in electrical communication with the electrical conductors 94 and during operation of the device can apply electrical energy to the electrical conductors 94 so as to form a reverse bias across the photodiode.

The device of FIG. 8Q can be modified such that the pinning layer 109 is in electrical communication with the first region 68. For instance, FIG. 8R is a cross section of an optoelectronic device that includes a pinned photodiode electrically connected to the source or drain of an NMOS transistor that surrounds the photodiode.

The upper layer 98 includes a first region 68 in addition to the source region 72, drain region 74 and channel 116. The first region 68 can be undoped or can be doped with the opposite polarity of the source region 72. A portion of the first region 68 extends through the source region 72 to the upper surface of the upper layer 98. Accordingly, the source region 72 surrounds all or a portion of the first region 68. Additionally, the pinning layer 109 extends through the light-absorbing medium 86 such that light-absorbing medium 86 surrounds a portion of the pinning layer 109. The pinning layer extends through the light-absorbing medium 86 into contact with the underlying first region 68. Accordingly, the pinning layer 109 is in electrical communication with the first region 68 as is discussed in the context of FIG. 8A.

Electrical contacts 90 are in direct physical contact with the gate 80, the drain region 74, and the pinning layer 109. Suitable materials for the electrical contacts 90 include, but are not limited to, silicides such as Nickel-Silicide. A protective layer 92 is positioned on the device such that the pinning layer 109, the insulator 78, and the gate 80 are between the protective layer 92 and the upper region 98. A suitable protective layer 92 includes, but is not limited to, the layers called Pre-Metal Dielectric (PMD) in CMOS technology applications. Suitable materials for the protective layer 92 include, but are not limited to, silicon oxide. Electrical conductors 94 extend through the protective layer 92 to the electrical contacts 90. Electronics (not shown) can be in electrical communication with the electrical conductors 94. As a result, the electronics can apply electrical energy to the electrical conductors 94 in order to operate the device.

During operation of the device, the source region 72, the light-absorbing medium 86, and the pinning layer 109 operate as the components of a pinned photodiode. In particular, the source region 72 and the pinning layer 109 function as the anode and cathode of the photodiode. The electronics apply electrical energy to the electrical conductors 94 so as to form a reverse bias across the photodiode. Electrical current flows through the photodiode in response to the absorption of light by the light-absorbing medium 86. An advantage to this configuration is that the contact to the pinning layer 109 is made at the center of the photodiode, and with the pinning layer touching the first region 68, without the risk that materials for the electrical contact 90 could cause an electrical short between the pinning layer 109 and the light-absorbing medium 86.

Figure 9A:
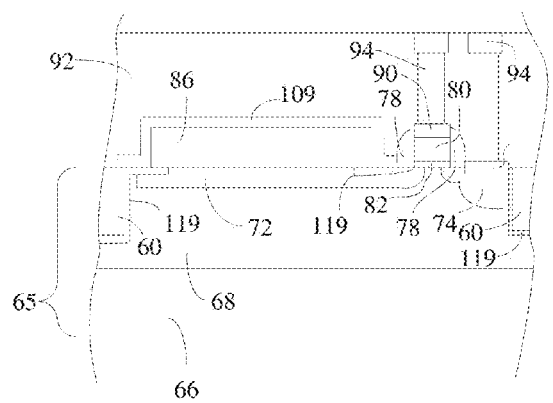
FIG. 9A shows the device of FIG. 8E with a substrate having a secondary pinning layer that provides electrical communication between the pinning layer and a first region.

The devices of FIG. 8D through FIG. 8R can be modified to include a variety of other features that can improve performance and/or simplify fabrication. For instance, the substrate 65 can be doped so as to include a secondary pinning layer 119 that provides electrical communication between the pinning layer 109 and the first region 68. As an example, FIG. 9A shows the device of FIG. 8E with a substrate having a secondary pinning layer 119 that provides electrical communication between the pinning layer 109 and the first region 68. The secondary pinning layer 119 contacts the first regions 68 and/or the source region 72. The secondary pinning layer 119 is doped with the same polarity as the pinning layer 109. For instance, when the pinning layer 109 is doped so as to be p-type, the secondary pinning layer 119 is doped so as to be p-type. In some instances, the concentration of dopant in the pinning layer 109 can exceed the concentration of dopant in the secondary pinning layer 119. In some instances, the secondary pinning layer 119 is degeneratively doped. Since the secondary pinning layer 119 is in contact with both the pinning layer 109 and the first region 68, the secondary pinning layer 119 can provide electrical communication between the pinning layer 109 and the first region 68. Accordingly, an electrical conductor 94 that is in electrical communication with the pinning layer 109 as shown in FIG. 8E is not required.

Figure 9B:
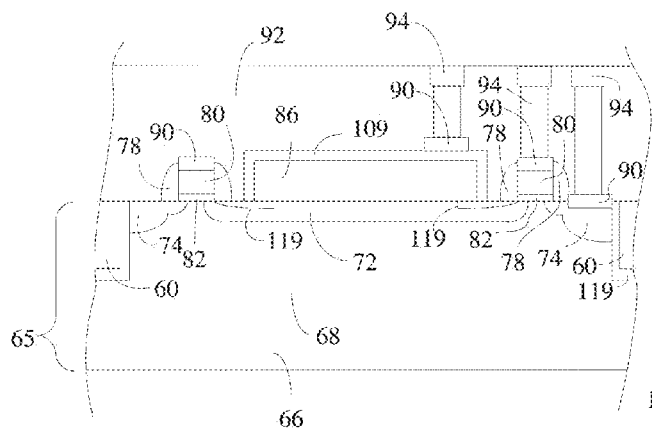
FIG. 9B is a cross section of an optoelectronic device that includes a pinned photodiode electrically connected to the source or drain of an NMOS transistor that surrounds the photodiode.
Figure 9C:
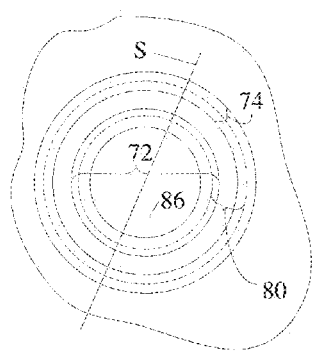
FIG. 9C is a topview of a portion of the components on the device shown in FIG. 9B in order to illustrate the relative positions of the components shown in the cross section of FIG. 9B.

As with the device of FIG. 8E, the device of FIG. 9A can be modified such that the transistor partially or fully surrounds the photodiode. For instance, FIG. 9B is a cross section of an optoelectronic device that includes a pinned photodiode electrically connected to the source or drain of an NMOS transistor that surrounds the photodiode. FIG. 9C is a topview of a portion of the components on the device shown in FIG. 9B in order to illustrate the relative positions of the components shown in the cross section of FIG. 9B. The cross section shown in FIG. 9B can be taken along the line labeled S in FIG. 9C. The pinning layer 109 is not in electrical communication with the first region 68 as is evident in FIG. 9B. The pinning layer 109 contacts the secondary pinning layer 119 on opposing sides of the light-absorbing medium 86. Accordingly, the pinning layer 109, secondary pinning layer 119, and source region 72 surrounds the light-absorbing medium 86. Since the pinning layer 109 does not contact the first region 68, an electrical conductor 94 extends through the protective layer 92 to an electrical contact 90 in direct physical contact with the pinning layer 109. As discussed in the context of FIG. 8D, other electrical conductors 94 are in electrical communication with the gate 80, and the drain region 74. The electronics can be in electrical communication with the electrical conductors 94 and during operation of the device can apply electrical energy to the electrical conductors 94 so as to form a reverse bias across the photodiode.

Since the pinning layer 109 in FIG. 9B is not in electrical communication with the first region 68, the electrical potential applied to the pinning layer 109 can have a larger magnitude than possible or desirable by applying the potential through the first region 68 of the FIG. 9A device because the potential of the FIG. 9A device may be limited by the resulting electric field across the gate insulator of the TG-NMOS. Larger (negative) voltages applied to the pinning layer 109 allow for the operation of the photodiode in the avalanche mode. Avalanche breakdown takes place inside the light-absorbing medium 86, rather than the junction region formed by the pinning layer 109 and the source region 72 because the light-absorbing medium 86 can have a lower avalanche breakdown voltage due to a smaller bandgap of the light-absorbing medium 86 than the bandgap of silicon.

Figure 9D:
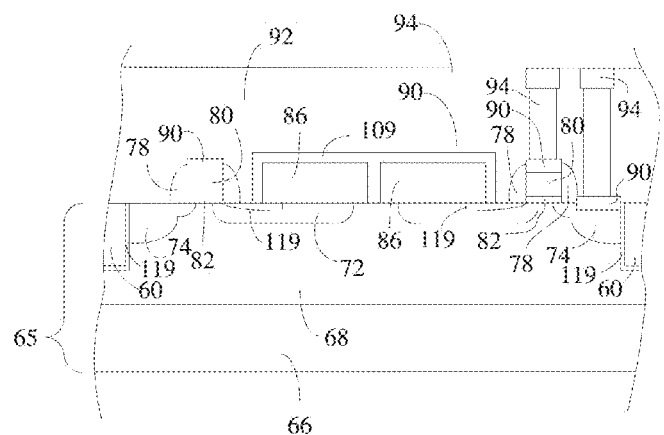
FIG. 9D is a cross section of the device of FIG. 9B and FIG. 9C modified as disclosed in the context of FIG. 8H and FIG. 8I.

The device of FIG. 9B and FIG. 9C can be modified to provide electrical communication between the pinning layer and the first region 68. For instance, the modification illustrated in FIG. 8H and FIG. 8I can be employed in the device of FIG. 9B and FIG. 9C. FIG. 9D is a cross section of the device of FIG. 9B and FIG. 9C modified as disclosed in the context of FIG. 8H and FIG. 8I. The source region 72 is arranged such that a portion of the first region 68 extends through the source region 72 to the upper surface of the substrate 65. The pinning layer extends through the light-absorbing medium 86 into contact with the underlying first region 68. Accordingly, the pinning layer 109 is in electrical communication with the first region 68. Accordingly, the source region 72 can optionally surround a portion of the first region 68 and/or the light-absorbing medium 86 optionally surrounds a portion of the pinning layer 109. The resulting device can be operated as disclosed in the context of FIG. 8H and FIG. 8I.

Figure 9E:
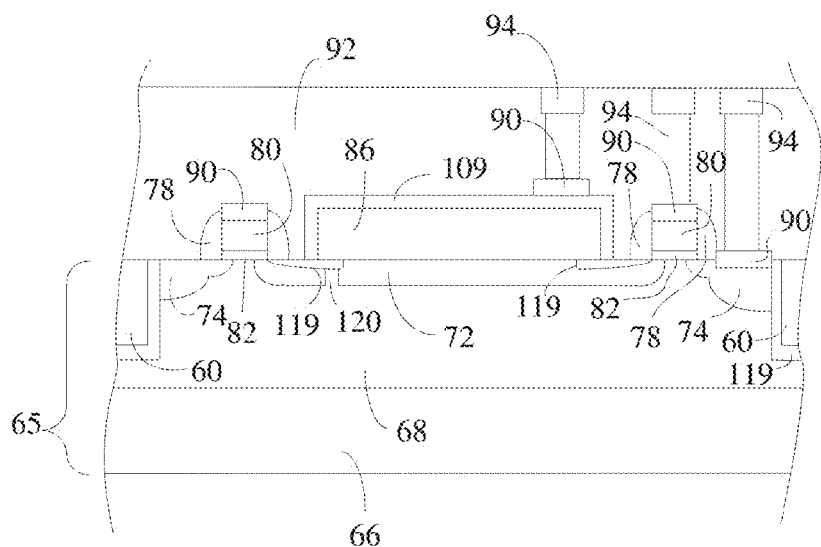
FIG. 9E is a cross section of the device of FIG. 9B and FIG. 9C modified such that one or more channels extend through a source region of a transistor.

Other structures can be used to provide electrical communication between the pinning layer and the first region 68. For instance, FIG. 9E is a cross section of the device of FIG. 9B and FIG. 9C modified such that one or more channels 120 extend through the source region 72 into contact with the secondary pinning layer 119. In some instances, the one or more channels are portions of the first region 68 that extend through the source region 72 into contact with the secondary pinning layer 119. The channels 120 can be created by limiting the areas of the substrate that are doped for the source region 72 so that one or more regions of the first region 68 extend through the resulting source.

Figure 9F:
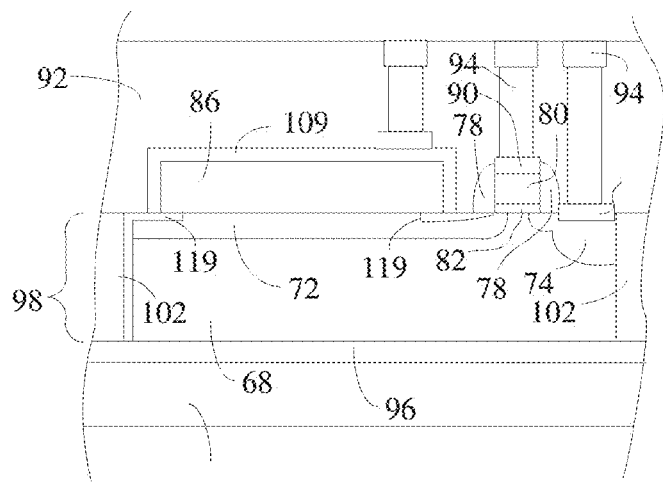
FIG. 9F illustrates the device of FIG. 8K modified to include a secondary pinning layer between a light-absorbing medium and a source region.
Figure 9G:
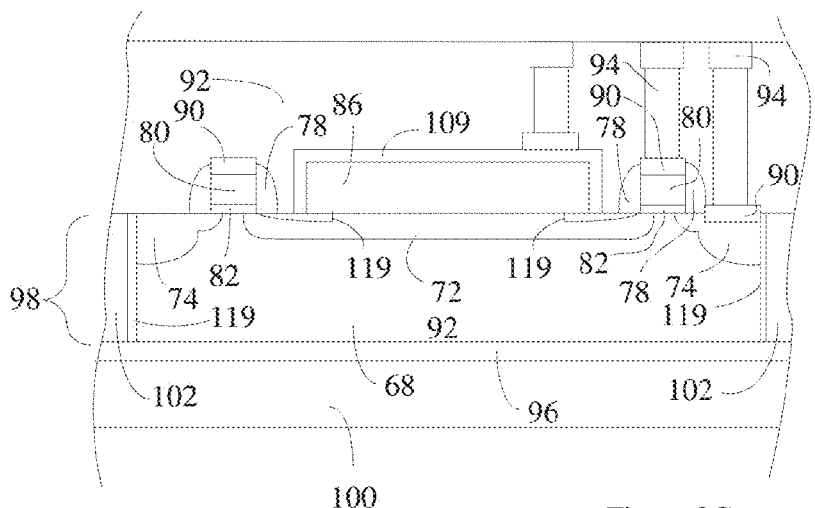
FIG. 9G illustrates the device of FIG. 8L modified to include a secondary pinning layer between a light-absorbing medium and a source region.
Figure 9H:
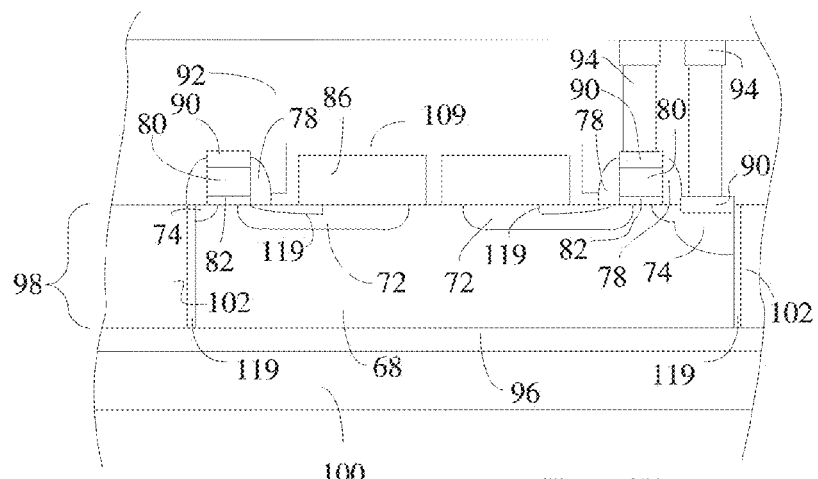
FIG. 9H illustrates the device of FIG. 8M modified to include a secondary pinning layer between a light-absorbing medium and a source region.
Figure 9I:
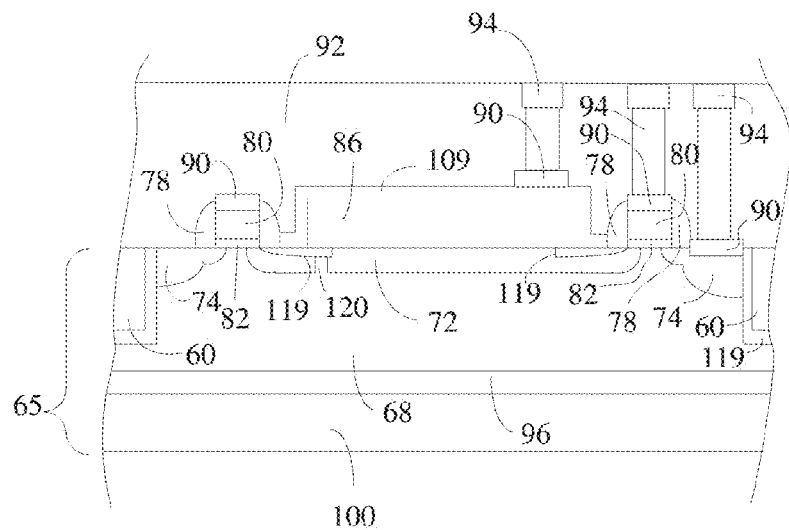
FIG. 9I illustrates the device of FIG. 9E modified to include a multilayered substrate such as a Silicon-On-Insulator (SOI) wafer.

A secondary pinning layer 119 can also be used in conjunction with multilayered substrates such as Silicon-On-Insulator (SOI) wafers. For instance, the devices in FIG. 8J through FIG. 8R can each include one or more secondary pinning layer 119. For instance, FIG. 9F illustrates the device of FIG. 8K modified to include a secondary pinning layer 119 between the light-absorbing medium 86 and the source region 72. As another example, FIG. 9G illustrates the device of FIG. 8L modified to include a secondary pinning layer 119 between the light-absorbing medium 86 and the source region 72. As another example, FIG. 9H illustrates the device of FIG. 8M modified to include a secondary pinning layer 119 between the light-absorbing medium 86 and the source region 72. Further, FIG. 9I illustrates the device of FIG. 9E modified to include a multilayered substrate such as a Silicon-On-Insulator (SOI) wafer.

In the above embodiments where the electronics are in electric communication with the pinning layer 109 through an electrical conductor 94 such as is shown in FIG. 8F, FIG. 8K FIG. 8L, FIG. 9B, etc., that electrical conductor 94 can optionally be used to provide electrical communication between the pinning layer 109 and the first region 68. The electronics can then hold the pinning layer 109 and the first region 68 at the same potential in order to provide the first region with pinning functionality. Alternately, in devices such as FIG. 8F, FIG. 8K, FIG. 8L, FIG. 8N, and FIG. 8O, the potential applied to the pinning layer 109 may be different from that applied to first region 68. In particular, the voltage applied to pinning layer 109 can be negative and with a magnitude such that an avalanche process can be induced in the light-absorbing medium 86, for the multiplication of photo-generated carriers in the light-absorbing medium 86.

The devices of FIG. 9A through FIG. 9I shows a portion of the secondary pinning layer 119 contacting the shallow trench isolation structures 60. These portions of the secondary pinning layer 119 can act as decoupling layers. In some instances, these decoupling layers are continuous with the portion of the secondary pinning layer 119 contacting the light-absorbing medium and, in some instances, these decoupling layers are separate from the portion of the secondary pinning layer 119 contacting the light-absorbing medium. The decoupling layers can help decouple drain regions 74 from the shallow trench isolation structures 60. Without the decoupling layers, it may be possible for electrons and/or holes generated at the interface of a drain regions 74 and shallow trench isolation structures 60 to enter the drain region 74. However, the decoupling layers can provide an energy barrier that reduces or stops the entry of these holes and/or electrons into the drain regions 74.

In each of the devices illustrated in FIG. 8D through FIG. 9I, a single transistor and photodiode combinations is illustrated. However, the devices of FIG. 8D through FIG. 9I can include more than one transistor and photodiode combinations. For instance, these devices can be scaled to include additional transistor and photodiode combinations as shown in FIG. 8A through FIG. 8C. For instance, shallow trench isolation structures 60 and/or deep trench isolation structures 102 can be used to reduce electrical cross-talk between adjacent devices as is needed. In cases where a thin-film or ultra-thin-film platform is used, it may not be necessary to use shallow trench isolation structures 60 because as the upper layer 98 becomes thinner becomes possible to convert the entire upper layer 98 to an oxide through simple oxidation processes and the resulting oxide can provide the desired isolation. In some instances, complete electrical isolation of adjacent devices may not be desired, for instance, in a device constructed according to FIG. 8D, the first region 68 can serve as a common ground to multiple different photiodes on the device.

The pinning layer 109 can combine with other components to serve as an effective pinning layer. For instance, the secondary pinning layers 119 and the pinning layer 109 can effectively act as a pinning layer (effective pinning layer). Alternately, the pinning layer 109 can serve as an effective pinning layer by itself. In each of the devices illustrated in FIG. 8D through FIG. 9I, increasing the portion of the light-absorbing medium 86 that contacts or is adjacent to the effective pinning layer may be desired in order for the effective pinning layer to keep the perimeter of the light-absorbing medium at a constant potential and without interfacing other materials, such as silicon dioxide, except for a region underneath the Transfer Gate. As is evident in devices such as at least the devices disclosed in FIG. 8G, FIG. 8I, and FIG. 9C, the pinning layer 109 acts as the effective pinning layer and can optionally surround the light-absorbing medium 86 in the horizontal direction. Accordingly, when the pinning layer has six sides (i.e. a cube or cuboid), the pinning layer contacts one or two pairs of opposing lateral sides of the light-absorbing medium 86. The use of the secondary pinning layers 119 can increase the portion of the light-absorbing medium 86 that contacts or is adjacent to the effective pinning layer. For instance, the above images show the secondary pinning layer 119 extending the effective pinning layer to locations beneath the light-absorbing medium 86 and/or between the light-absorbing medium 86 and the portion of the substrate underneath the secondary pinning layer 119. As a result, the effective pinning layer can contact or be adjacent to one, two, three, or more than three pairs of opposing sides of a light-absorbing medium 86. When the light-absorbing medium has an odd number of sides as would occur with a disk configuration, the effective pinning layer can contact one, two, three, or more than three pairs of opposing sides of the light-absorbing medium 86 and an additional side of the light-absorbing medium 86. Accordingly, the secondary pinning layer 119 allows the percentage of light-absorbing medium 86 that is adjacent to or in contact with the effective pinning layer to be increased or even surrounded in the vertical direction. In some instances, the devices can be constructed such that a vertical reference plane (perpendicular to the substrate) can be drawn through the light-absorbing medium 86 and the resulting cross section can have the pinning layer 109 or the effective pinning layer 109 in contact with or adjacent to more than 50%, 70%, 90%, 95%, or 99% of the area surrounding the light-absorbing medium 86.

The pinning layer 109 can be epitaxially grown on the light-absorbing medium 86 and/or over a secondary pinning layer 119, and/or over other regions of the device where it is desired. Further, the pinning layer 109 can be doped during the epitaxial growth process and can be in-situ doped during the epitaxial growth, which can be selective or non-selective. In prior devices, the pinning layer is formed by ion-implantation, and requires multiple steps, such as lithography, etching, cleans, thermal anneals, etc. The epitaxial growth with in-situ doping of the pining layers that can be sued with the disclosed devices can be performed at a temperature that is low enough to avoid dopant diffusion, thereby resulting in dopant concentrations and profiles that are impossible to achieve with the conventional ion implantation and annealing. Furthermore, the insertion point of the epitaxial growth of the superlattice layers and of the pinning layer, in the CMOS process flow is such that all subsequent process steps are done at temperatures that do not disturb the structural characteristics of the superlattice and pinning layers. In contrast, in conventional CMOS Image Sensors, the "pinning implant" is performed fairly early in the process flow, typically before source/drain implants and the respective annealing steps. Consequently, the conventional pinning implants could never achieve the dopant concentration and profiles that can be achieved with doping during the epitaxial growth process. The ability to fabricate a pinning layer with much higher dopant concentration, up to degeneracy levels (e.g., more than 1E20 cm$^{-3}$), and much better controlled profiles, (e.g., delta-doping and/or graded profiles), allows the pinning layer to be thinner that the pinning layer of conventional CMOS Image Sensors, and yet perform the same function.

In each of the devices illustrated in FIG. 8A through FIG. 9I, the light-absorbing medium 86 includes or consists of one or more of the disclosed superlattices. Accordingly, the light-absorbing medium 86 can be added to a surface of the substrate 65 rather than being a region of the substrate that is defined through a technique such as doping. For instance, the light-absorbing medium 86 can be added to the substrate by growing the light-absorbing medium 86 on the substrate 65. Suitable methods of growth include, but are not limited to, epitaxial growth on the substrate 65 and/or on an upper layer 98 of a wafer that will act as a substrate.

Figure 9J:
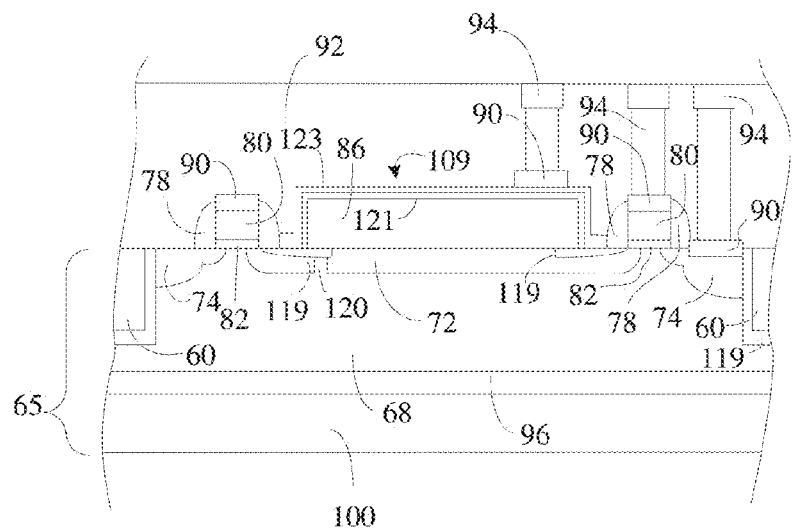
FIG. 9J is an example of a pinning layer that includes multiple layers.

Since the pinning layer 109 can be grown on the device, the pinning layer 109 can be silicon; however, the use of growth to form the pinning layer 109 means that pinning layer 109 can be other materials. For instance, suitable materials for the pinning layer 109 include, but are not limited to, Si, Ge, random or ordered alloys of $Si_{1-x}Ge_x$ where x is greater than or equal to 0 and/or less than or equal to 1, $Si_{1-y}C_y$ where y is greater than 0 and less than or equal to 0.25, and $Si_{1-x-y}Ge_xC_y$ where x is greater than 0 and less than or equal to 1 and y is greater than 0 and less than or equal to 0.25. The use of these materials as a pinning layer can reduce any barriers to holes moving from the superlattices included in the light-absorbing medium to the pinning layer 109 relative to the barriers that would be achieved with silicon. As a result, these materials can provide smooth grading of each of the band edges so that holes can be efficiently extracted from the superlattice layers. In some instances, the chemical composition of the pinning layer 109 has a gradient that provides a graded valence band edge for the interface of the superlattices with the pinning layer 109. Although the pinning layer 109 of FIG. 8D through FIG. 9I is illustrated as a single layer of material, the pinning layer 109 can include multiple layers of material. For instance, the pinning layer 109 can include one or more transition layers that contact the light-absorbing medium 86. The pinning layer 109 can also include one or more outer layers. At least one of the outer layers contacts one or more of the transition layers with at least one of the transition layers being between the light-absorbing medium 86 and one or more of the outer layers. As an example, FIG. 9J illustrates the device of FIG. 9I but where the pinning layer 109 includes a transition layer 121 between an outer layer 123 and the light-absorbing medium. Although FIG. 9J uses the device of FIG. 9I to illustrate a pinning layer with multiple layers, the other disclosed pinning layers can also have multiple layers. The one or more transition layer and the one or more outer layers can be added to the device using growth techniques such as epitaxial growth.

In instances where the pinning layer 109 is in contact with the first region 68, at least one of the transition layers 121 and/or at least one of the outer layers can contact the first region 68. In instances where the device includes a secondary pinning layer 119 that contacts the pinning layer 109, at least one of the transition layers 121 and/or at least one of the outer layers can contact the secondary pinning layer 119. As noted above, the pinning layer 109 is doped with the same polarity as the first region 68 and when the device includes a secondary pinning layer 119, the pinning layer 109 is doped with the same polarity as the secondary pinning layer 119. When the pinning layer 109 includes multiple layers, at least one of the outer layers is doped with the same polarity as the first region 68 and when the device includes a secondary pinning layer 119, at least one of the outer layers is doped with the same polarity as the secondary pinning layer 119. However, in some instances, one or more transition layers is not doped. When one or more of the transition layers is doped, it is doped with the same polarity as the first region 68 and when the device includes a secondary pinning layer 119, at least one of the outer layers is doped with the same polarity as the secondary pinning layer 119.

The one or more transition layers can be used to create a smooth band edge transition between the one or more outer layer and the one or more superlattices included in the light-absorbing medium. For instance, in instances where it is desirable to use a certain material for the pinning layer 109, the band offset between the desired material and the one or more superlattices included in the light-absorbing medium can produce undesirable barriers to the extraction of electrons and/or holes from the light-absorbing medium. To resolve this issue, the desired pinning layer 109 material can be used as an outer layer 123 and the material for the one or more transition layers can be selected to smooth the band offsets at the two or more material interfaces between the desired pinning layer 109 material and the light-absorbing medium. For instance, when the pinning layer 109 includes a single transition layer between the light-absorbing medium and an outer layer, the band offsets between the light-absorbing medium and the transition layer and between the transition layer and the pinning layer 109 can each be less than the band offset between the light-absorbing medium and the outer layer. This arrangement can reduce the barrier to extraction of electrons and/or holes from the light-absorbing medium. In one example, the pinning layer 109 includes an outer layer that is silicon and one or more transition layers selected such that at least one transition layer is selected from a group consisting of Si, Ge, random or ordered alloys of $Si_{1-x}Ge_x$ where x is greater than or equal to 0 and/or less than or equal to 1, $Si_{1-y}C_y$ where y is greater than 0 and less than or equal to 0.25, and $Si_{1-x-y}Ge_xC_y$ where x is greater than 0 and less than or equal to 1 and y is greater than 0 and less than or equal to 0.25.

It can be desirable to reduce any barriers to electrons moving from the superlattices at any junctions between the superlattices and the n-type source region 72. A wide variety of superlattices will have a wide variety of band offsets with respect to materials such as silicon. For each superlattice composition, any undesirably high barriers can optionally be reduced by inserting an interposing layer (not illustrated) between the superlattices and source region 72. The interposing layer can provide smooth grading of each of the band edges so that both electrons and holes can be efficiently extracted from the superlattice layers. Suitable interposing layers include, but are not limited to, materials such as Si, Ge, random or ordered alloys of $Si_{1-x}Ge_x$ where x is greater than or equal to 0 and/or less than or equal to 1, $Si_{1-y}C_y$ where y is greater than 0 and less than or equal to 0.25, and $Si_{1-x-y}Ge_xC_y$ where x is greater than 0 and less than or equal to 1 and y is greater than 0 and less than or equal to 0.25, with suitably graded band offsets between silicon and the superlattices.

The devices disclosed in the context of FIG. 8A through FIG. 9I are disclosed in the context of an NMOS transistor gate, a p-type pinning layer 109, and a p-type secondary pinning layer 119 in devices that include secondary pinning layer 119; however, the complementary configuration (PMOS transistor gate, a n-type pinning layer 109, and n-type secondary pinning layer 119 in devices that include secondary pinning layer 119), can be achieved by reversing the disclosed doping polarity for each of the regions shown in the figures. In one example, the first regions 68 are doped so as to be p-type first regions that serve as p-wells, the second regions 70 are doped so as to be n-type second regions that serve as n-wells, the third regions 76 are doped so as to be an p-type third regions, the source regions 72 are doped so as to be p-type regions, and the drain regions 74 are doped so as to be p-type regions, the pinning layer 109 is doped so as to be an n-type pinning layer, when present, the base region 66 is doped so as to be a n-type silicon substrate, or a n-type doped triple n-well on a p-type substrate (not shown) 66, and when present, the secondary pinning layer 119 is doped so as to be an n-type secondary pinning layer 119. When the complementary configuration is employed, the one or more interposing layers disclosed above can also be employed. In some instances, but not all, reversing of polarity in the doped regions requires that the one or more superlattice(s) included in the light-absorbing medium be changed. For instance, it may be necessary to employ one or more superlattice(s) with a more suitable band offset with respect to the substrate material and/or with respect to the pinning layer.

The devices disclosed in at least FIG. 8F, FIG. 8H, FIG. 8L, FIG. 8M, FIG. 8Q, FIG. 8R, FIG. 9B through FIG. 9E, and FIG. 9G through FIG. 9I are disclosed as having components of the transistor or the transistor itself surrounding the light-absorbing medium. However, the transistor or the transistor components can partially surround the light-absorbing medium. For instance, the transistor or the transistor components can be arranged such that the device still has a cross section according to any one of FIG. 8F, FIG. 8H, FIG. 8L, FIG. 8M, FIG. 8Q, FIG. 8R, FIG. 9B through FIG. 9E, and FIG. 9G through FIG. 9I but the transistor or the transistor components do not fully surround the light-absorbing medium.

In each of the devices illustrated in FIG. 8A through FIG. 9I, the light-absorbing medium 86 includes or consists of one or more of the disclosed superlattices. Accordingly, the base substrate 104 and/or the third region 76 and/or the source region 72 can serve as the substrate for the disclosed superlattice systems. Note that in these instances, the superlattice is or can be grown directly on one or more of components selected from a group consisting of the first region 68, base substrate 104, the third region 76, secondary pinning layer 119, and source region 72. In prior devices, the light-absorbing medium 86 is commonly silicon or germanium. However, silicon is not an effective absorber of light until the wavelengths approach the ultraviolet region. Ge produces higher levels of dark current that Si due to Ge having a higher intrinsic carrier concentration than Si. An example of a superlattice system that can serve as the substrate and light-absorbing medium 86 is $(Si_4C)_3—(Ge_5)_4$ grown on the (100) face of a silicon substrate. This superlattice has indirect and direct fundamental gaps around 1.0 eV, with a difference between the two of about 44 meV, that is, less than 2KT at room temperature, i.e., thermal noise level.

The inclusion of the disclosed superlattices in the light-absorbing medium 86 broadens the number of applications for these photodiodes. For instance, the ability to detect certain wavelength can be achieved by selecting the superlattice system with the bandgaps that provide absorption of those wavelengths. These bandgaps need not be only direct but can also be indirect. As is evident from this disclosure, the broad range of bandgaps and band structures that can be achieved with the disclosed superlattice permits the photodiodes to be efficiently used with a broad range of wavelengths. For instance, the short wavelength infrared (SWIR) wavelength range is usually between 1.4 µm and 3 µm (~0.9 eV to ~0.4 eV), which covers the night glow, and also eye-safe lasers. Silicon cannot absorb in this range, and Ge relaxed layers on Si, can absorb only up to 1.6 µm. However, the disclosed superlattices and/or superlattice systems can permit effective light sensing in this range. Additionally mid-wave infrared range (MWIR) wavelength range is usually between 3 µm and 8 µm (~0.4 eV to ~0.15 eV) and can be used for the chemical identification (sensing) of gases in general, and it is especially important for those that are poisonous and have no color or odor. The disclosed superlattices and/or superlattice systems can permit effective light sensing in this range and can accordingly enable the use of light sensors for these applications. The long-wave infrared (LWIR) wavelength range is usually between 8 µm and 15 µm (~0.15 eV to ~0.08 eV), which can be used for thermal sensing & imaging. The disclosed superlattices and/or superlattice systems can permit effective light sensing in this range and can accordingly enable the use of light sensors for these applications.

The device of FIG. 8C can be constructed on a wafer that includes the intermediate layer 110 between the semiconductor layer 114, and a dummy substrate. During fabrication of the device, the semiconductor layer 114 can be doped so as to form the channels 116, source regions 72 and drain regions 74 in the semiconductor layer 114. One or more of the components positioned on the semiconductor layer 114 in FIG. 8C can be formed on the semiconductor layer 114. For instance, the light-absorbing medium 86 can be epitaxially grown on the semiconductor layer 114. The dummy substrate can be removed so as to expose the intermediate layer 110. Suitable methods for removing the dummy substrate include, but are not limited to, etching. The light blocking layers 106 and wavelength filters 108 can then be generated on the exposed intermediate layer 110. The substrate 104 can then be bonded to the result such that the light blocking layers 106 and wavelength filters 108 are between the base substrate 104 and an intermediate layer 110. In some instances, the wafer is a Silicon-On-Insulator (SOI) wafer. As noted above, an SOI wafer includes a buried oxide layer that is typically silicon oxide, between an upper layer of silicon and a lower layer of silicon. The buried oxide layer can serve as the intermediate layer 110, the upper layer of silicon can serve as the semiconductor layer 114, and the lower layer of silicon can serve as the dummy substrate.

In the descriptions of the devices in each of FIG. 8A through FIG. 8C, each of the photodiodes is described as a p-i-n photodiodes. However, the photodiodes can be n-i-n or p-i-p photodiodes. For instance, in the above description, the pinning layer 109 can be doped so as to be an n-type cap layer to provide n-i-n photodiodes. In the descriptions of the devices in each of FIG. 8A through FIG. 8C, each of the transistors is described as an NMOS transistor. However, one or more of the transistors can be a PMOS transistor. For instance, the first regions 68 are doped so as to be p-type first regions, the second regions 70 can be doped so as to be n-type second regions, the third regions 76 can be doped so as to be an p-type third regions, the source regions 72 are doped so as to be p-type source regions, the drain regions 74 are doped so as to be p-type drain regions, and the base regions 66 are doped so as to by n-type base regions. In these circumstances, the cap layers 88 can be doped so as to be an p-type cap layer which results in a p-i-p photodiodes. Combinations of different light sensors and transistors can be present on the same device. For instance, a portion of the light sensors on a device can be p-i-n photodiodes while another portion of the light sensors are p-i-p photodiodes. Additionally or alternately, a portion of the transistors on a device can be PMOS while another portion are NMOS.

Although FIG. 8A through FIG. 8C illustrate a device having light sensors on a single device, the device can include only one light sensor. Further, the one or more light sensors on a device can be in electrical communication with components other than the transistors illustrated above. For instance, one or more light sensors on a device can each be in electrical communication with one or more resistors. Further, the one or more light sensors need not be in electrical communication with other components integrated onto the device.

The construction of the devices illustrated in FIG. 8A through FIG. 8C can be achieved using traditional integrated circuit fabrication techniques. Additionally or alternately, the portion of the devices that include the disclosed superlattices and/or superlattice systems can be generated as disclosed in this document. Additional information related to the structure, construction, operation, and fabrication of the devices illustrated in FIG. 8A through FIG. 8C can be found in U.S. Pat. No. 6,943,051, patent application Ser. No. 10/399,495, issued on Sep. 13, 2005, filed on Apr. 17, 2003, and entitled "Method of fabricating heterojunction photodiodes integrated with CMOS;" U.S. Pat. No. 7,265,006, patent application Ser. No. 11/176,538, issued on Sep. 4, 2007, filed on Jul. 7, 2005, and entitled "Method of fabricating heterojunction devices integrated with CMOS;" U.S. Pat. No. 7,153,720, patent application Ser. No. 11/142,783, issued on Dec. 26, 2006, filed on Jun. 1, 2005, an entitled "CMOS image sensor;" U.S. Pat. No. 7,521,737, patent application Ser. No. 11/070,721, issued on Apr. 21, 2009, filed on Mar. 2, 2005, and entitled "Light-sensing device;" U.S. Pat. No. 8,120,079, patent application Ser. No. 12/403, 900, issued on Feb. 21, 2012, filed on Mar. 13, 2009, and entitled "Light-sensing device for multi-spectral imaging;" U.S. Pat. No. 8,183,516, patent application Ser. No. 11/572, 525, issued on May 22, 2012, filed on Jul. 28, 2005, and entitled "Layouts for the monolithic integration of CMOS and deposited photonic active layers;" U.S. patent application Ser. No. 11/781,544, filed on Jul. 23, 2007, and entitled "Method of Fabricating Heterojunction Photodiodes with CMOS", and U.S. patent application Ser. No. 11/572,519, filed on Jul. 28, 2005, and entitled "Photonic Devices Monolithically Integrated with CMOS", each of which is incorporated herein in its entirety.

Figure 10A:
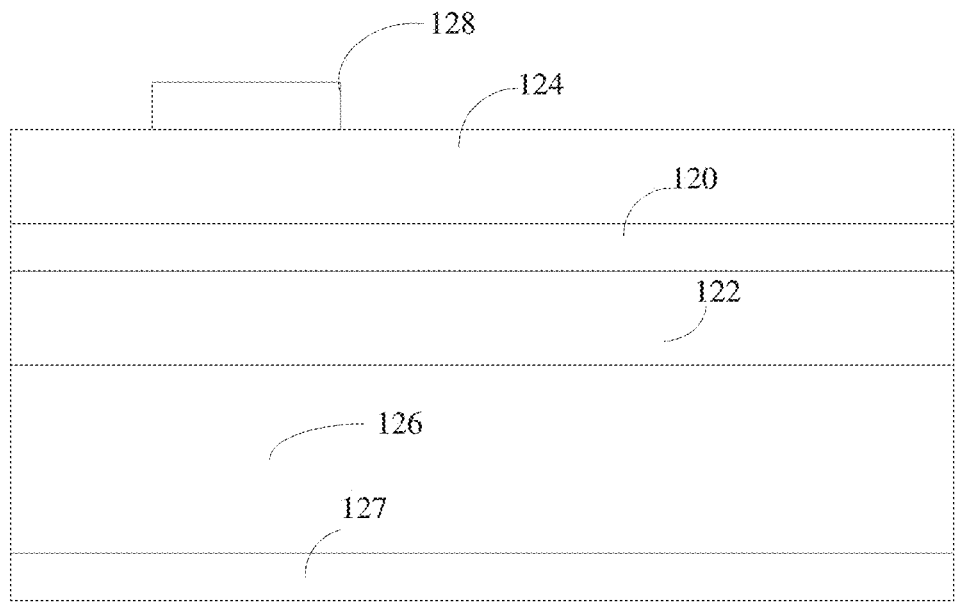
FIG. 10A is a cross section of a double heterojunction light emitting diode.

The disclosed superlattices can also be used to generate light in devices such as light emitting diodes. For instance, the above superlattices can also be included in the active regions or gain media of light sources such as lasers and LEDs. As an example, FIG. 10A is a cross section of a double heterojunction Light emitting diode (LED). The light emitting diode includes components positioned on a base 126. The components include an active layer 120, first region 122 and second region 124. The active layer 120 is located between the first region 122 and the second region 124. The active layer 120 can be in direct physical contact with both the first region 122 and the second region 124. The first region 122 and the second region 124 can be the same material.

The components are positioned on a base 126 such that the base 126 is located between the first region 122 and a base electrode 127. Additionally, the second region 124 is between an electrode 128 and the active layer 120. Electronics (not shown) can be in electrical communication with the base electrode 127 and the electrode 128 and can be configured to apply a forward bias to the light emitting diode in order to generate light. Suitable materials for the base 126 include, but are not limited to, Si, Ge, random alloys of $Si_{1-x}Ge_x$ where x is greater than or equal to 0 and/or less than or equal to 1, and random alloys of $Si_{1-x-y}Ge_xC_y$ where x is greater than 0 and less than or equal to 1 and y is greater than 0 and less than or equal to 0.25.

The disclosed superlattices can serve as any one, any two or all three of the components selected from the group consisting of the first region 122, the second region 124, and the active layer 120. For instance, one, two, or three components selected from the first region 122, the second region 124, and the active layer 120 can each include or consist of one or more of the disclosed superlattices. When a component includes multiple superlattices, the superlattices can be stacked as disclosed in the context of FIG. 1B. In one example, at least the active layer 120 includes or consists of one or more of the disclosed superlattices. Additionally or alternatively, bulk semiconductor materials can serve as any one or any two of the components selected from the group consisting of the first region 122, the second region 124, and the channel. Suitable bulk materials include, but are not limited to, random alloys of Si, $Si_{1-x}Ge_x$ where x is greater than or equal to 0 and/or less than or equal to 1, $Si_{1-y}C_y$ where y is greater than or equal to 0 or 0.1 and/or less than or equal to 0.25, $Si_{1-x-y}Ge_xC_y$ where x is greater than or equal to 0 or 0.1 and/or less than or equal to 1 and y is greater than or equal to 0 or 0.01 and/or less than or equal to 0.25. In one example, at least the active layer 120 includes or consists of one or more of the disclosed superlattices. The base 126 can serve as the substrate of one of the disclosed superlattice systems. Alternately, the first region 122 or the active layer 120 can serve as the substrate of one of the disclosed superlattice systems. As a result, any or all of the first region 122, the second region 124, and the active layer 120 can be epitaxially grown on the base 126. For instance, the first region 122 can be epitaxially grown on the base 126, the active layer 120 can be epitaxially grown on the first region 122 and the second region 124 can be epitaxially grown on the active layer 120.

The first region 122 is doped so as to be a n-type first region 122, the active layer 120 is undoped so as to be an intrinsic channel, and the second region 124 is doped so as to be a p-type second region 124. When the active layer 120 includes or consists of one or more of the disclosed superlattices, the one or more superlattices are selected such that the bandgap of the active layer 120 is smaller than the bandgap of a material used for both the first region 122 and the second region 124.

The disclosed superlattices can include or consist of group IV materials as discussed above. As a result, the material for the first region 122 and the second region 124 can also be a group IV material such as silicon. Superlattices with different bandgaps will produce different wavelengths. As a result, the one or more superlattices in the active layer 120 can be selected so as to achieve a particular wavelength. In one example of a light emitting diode, the first region 122 and the second region 124 are silicon and the active layer 120 includes or consists of $(Ge_4C)_5$—$(Ge_5)_5$ grown on the (100) face of the silicon first region 122.

Figure 10B:
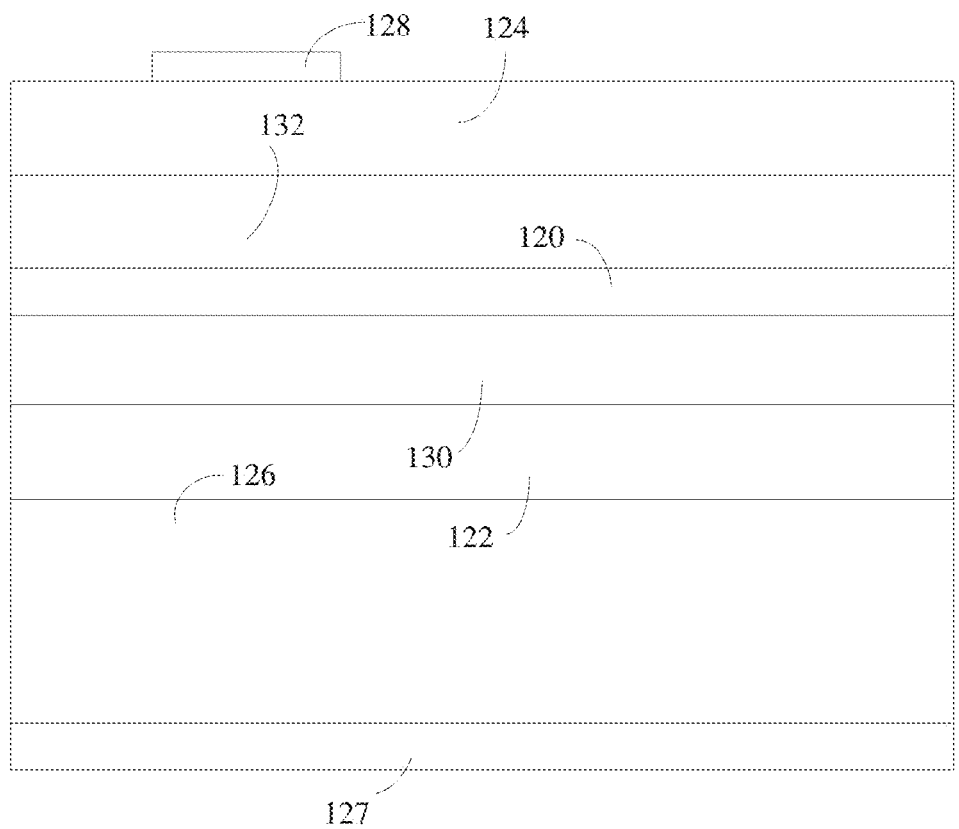
FIG. 10B illustrates a light source having cladding layers added to the double heterojunction light emitting diode of FIG. 10A.

Cladding layers can be added to the light source of FIG. 10A in order to provide a degree of confinement of the light. For instance, FIG. 10B illustrates a light source constructed as shown in FIG. 10A but with a first cladding 130 between the first region 122 and the active layer 120 and a second cladding 132 between the second region 124 and the active layer 120. The first cladding 130 has a larger index of refraction than the first region 122 and the second cladding 132 has a larger index of refraction than the second region 124. The change in the index of refraction can provide confinement of light between the first cladding 130 and the second cladding 132. Suitable materials for the first cladding 130 and/or the second cladding 132 include, but are not limited to, Ge, random alloys of $Si_{1-x}Ge_x$ where x is greater than or equal to 0 and/or less than or equal to 1, and random alloys of $Si_{1-x-y}Ge_xC_y$ where x is greater than 0 and less than or equal to 1 and y is greater than 0 and less than or equal to 0.25.

The first cladding 130 can be constructed from the same material as the second cladding 132 or from a material that is different from the material of the second cladding 132. The first cladding 130 can be doped so as to be the same type of region as the first region 122. For instance, the first region 122 and the first cladding 130 can both be doped so as to be n-type regions. The second cladding 132 can be doped so as to be the same type of region as the second region 124. For instance, the second region 124 and the second cladding 132 can both be doped so as to be p-type regions. In view of these conditions, it is possible for the first region 122 and the first cladding 130 to be the same material but to be doped such that the first cladding 130 has a larger index of refraction than the first region 122. Additionally or alternately, the second region 124 and the second cladding 132 can be the same material but to be doped such that the second cladding 132 has a larger index of refraction than the second region 124.

In one example of a device constructed according to FIG. 10A, the first region 122 and the second region 124 are the same material but one is an n-type region and the other is a p-type region. Additionally, the first cladding 130 and second cladding 132 are the same material but one is an n-type region and the other is a p-type region. Additionally, the first cladding 130 and first region 122 are both an n-type region or are both a p-type region and the second cladding 132 and second region 124 are both an n-type region or are both a p-type region.

An advantage of light sources constructed according to FIG. 10A and FIG. 10B is that a large enough electric field can be applied between the base electrode 127 and the electrode 128 for the light emitting diode to operate in the avalanche mode. As a result, the light sources can be operated as an Avalanche Photo-Diodes (APDs). A suitable Avalanche Photo-Diode can be designed such that photo-absorption and avalanche multiplication take place in different regions, in which either or both of those regions can incorporate superlattices. In each region there can be one or multiple superlattices. The superlattices can be different and selected according to the suitability of their optoelectronic properties for the specific function of each region in the Separated Absorption and Multiplication Avalanche Photo-Diode (SAM-APD).

The light sources of FIG. 10A and FIG. 10B generally do not provide sufficient confinement for the light signal to resonate within a cavity and can accordingly be classified as resonance enhancement structures. As a result, these light sources can be combined with other components so as to form resonance enhancement structures such as a laser cavity with these light sources acting as the gain medium. For instance, the lights source of FIG. 10A or FIG. 10B can be positioned in a laser cavity so the light signal makes multiple passes through the active before exiting from the laser cavity. When the light source of FIG. 10A is included in a laser cavity, the light source of FIG. 10A can act as the gain element of a Superlattice or Multi-Quantum Well (MQW) laser. When the light source of FIG. 10B is included in a laser cavity, the light source of FIG. 10B can act as the gain element of a Separate Confinement Heterostructure (SCH) laser.

Figure 10C:
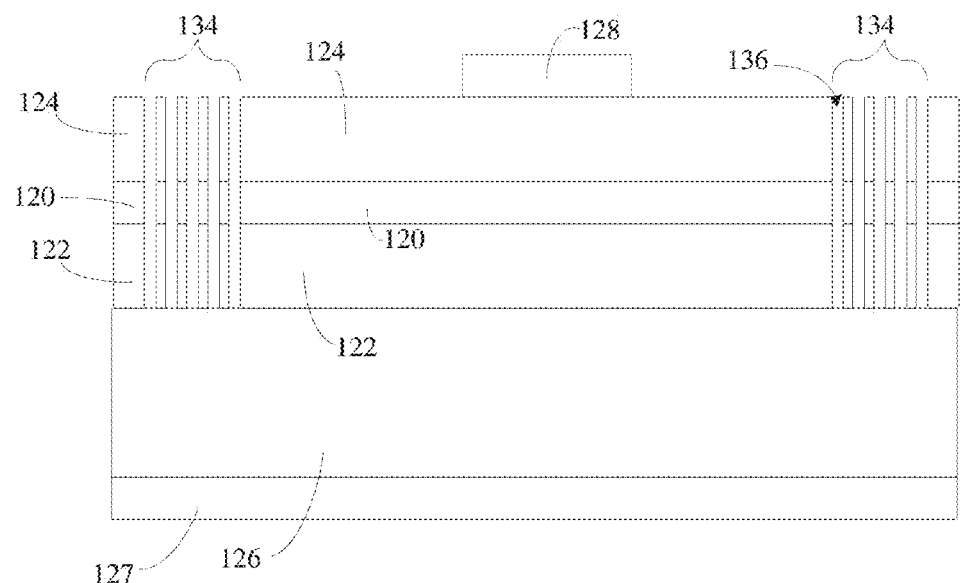
FIG. 10C is a cross section of the light source of FIG. 10A with optical gratings positioned to reflect a particular wavelength or range of wavelengths within an active layer.

The above light sources can be modified so as to act as a laser cavity. For instance, the above light sources can be modified to include light reflectors positioned so as to form a laser cavity within the light source. Examples of light reflectors are mirrors and optical gratings 134. As an example, FIG. 10C is a cross section of the light source of FIG. 10A with optical gratings 134 positioned to reflect a particular wavelength or range of wavelengths within the active layer 120. Accordingly, the light source can act as a Distributed FeedBack (DFB) laser where the gain medium includes one or more of the disclosed superlattices. Suitable optical gratings 134 include, but are not limited to, Bragg gratings. The optical gratings 134 can be formed by etching openings 136 into or through the active layer 120. The openings 136 in the optical grating 134 can be filled with a solid, liquid, or gas such as the ambient atmosphere in which the light source is positioned. The features of the grating such as the opening width, depth, etc. can be selected such that a particular wavelength of light or range of wavelengths are reflected by the gratings while other wavelengths pass by the gratings. The one or more superlattices in the active layer 120 also generate light signals of a particular wavelength or range of wavelengths. As a result, the one or more super-lattices in the active layer 120 can be matched to the features of the gratings. The broad range of bandgaps and band structures provided by the disclosed superlattice increases the number of possible grating configurations and accordingly increases the number and bandwidth of light signals that can be provided by the light source.

Although FIG. 10C illustrates the optical gratings 134 used in conjunction with the light source of FIG. 10A, these optical gratings 134 can be used in conjunction with a light source according to FIG. 10B.

Figure 10D:
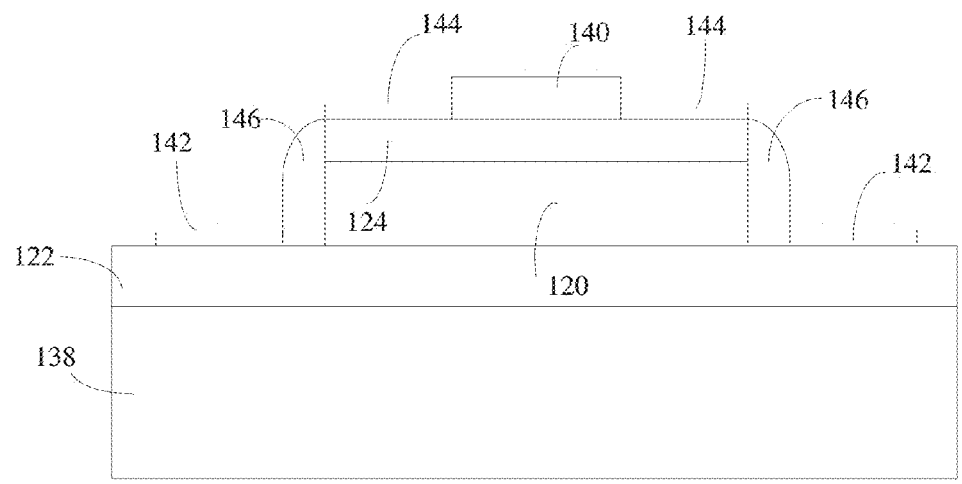
FIG. 10D is a cross section of a light source according to FIG. 10A modified to include light reflectors positioned so as to form a laser cavity within the device.

FIG. 10D is a cross section of a light source according to FIG. 10A modified to include light reflectors. The light reflectors are positioned so as to form a laser cavity within the device. In particular, the light reflectors are positioned such that the light source acts as a Vertical Cavity Surface Emitting Laser (VCSEL) where the gain medium includes one or more of the disclosed superlattices. The base 126 of FIG. 10A can be positioned between the first region 122 and a base reflector 138. Alternately, as shown in FIG. 10D, the base reflector 138 can replace the base 126 illustrated in FIG. 10A. As a result, the first region 122 is between the base reflector 138 and the active layer 120. The light source also includes a second reflector 140 positioned such that the second region 124 is between the second reflector 140 and the second region 124. The first reflector and the second reflector 140 can be configured to provide a Fabry-Perot (FP) laser cavity. For instance, the base reflector 138 and/or the second reflector 140 is partially transmissive to provide an output from the laser cavity. When the base reflector 138 is partially transmissive the second reflector 140 can be partially transmissive or fully reflective. When the second reflector 140 is partially transmissive the base reflector 138 can be partially transmissive or fully reflective. Suitable materials for the first reflector and the second reflector 140 include, but are not limited to, Si, Ge, random alloys of $Si_{1-x}Ge_x$ where x is greater than or equal to 0 and/or less than or equal to 1, and random alloys of $Si_{1-x-y}Ge_xC_y$ where x is greater than 0 and less than or equal to 1 and y is greater than 0 and less than or equal to 0.25.

First electrical contacts 142 are in electrical communication with the first region 122 and second electrical contacts 144 are in electrical communication with the second region 124. Spacers 146 are positioned between the first electrical contacts and the active layer 120 and can be constructed of an electrically insulating material. Electronics (not shown) can be in electrical communication with the first electrical contacts 142 and the second electrical contacts 144. The electronics can apply electrical energy to the first electrical contacts 142 and the second electrical contacts 144 in order to electrically pump the laser. Suitable materials for the first electrical contacts 142 and the second electrical contacts 144 include, but are not limited to, metal silicides, such as Nickel Silicide. Suitable materials for the spacers 146 include, but are not limited to, dielectrics, such as silicon oxide, and silicon nitride.

In the light source of FIG. 10D, the first region 122 or the second region 124 can act as the substrate for one or more of the disclosed superlattice systems. For instance, the active layer 120 can be grown on the first region 122 or the second region 124.

Figure 11A:
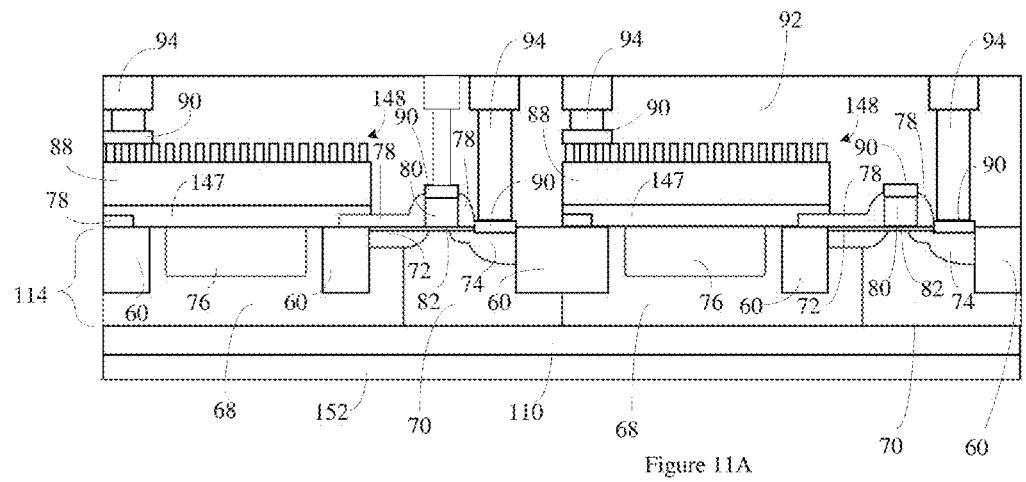
FIG. 11A is a cross section of an optoelectronic device that includes a light source electrically connected to a transistor.

Light sources that include one or more of the disclosed superlattices in the active layer or gain medium can be included in optoelectronic devices. For instance, light sources can be monolithically integrated into complementary metal-oxide semiconductor (CMOS) devices. For instance, FIG. 11A is a cross section of an optoelectronic device that includes a light source electrically connected to the source of an NMOS transistor. This arrangement of light source and transistor can be used in applications such as vertical cavity surface emitting lasers, monolithically integrated with CMOS for intra-chip optical interconnects, replacing or supplementing electrical interconnects, inter-chip optical interconnects, replacing or supplementing Through Silicon Vias (TSVs) for 3D-IC integrated chips, intra-board optical interconnects, replacing or supplementing metal lines in Printed Circuit Board (PCB) with optical waveguides, inter-board optical interconnects, either using fiber optics connections or free space optical connections between PCBs, on-chip light sources for a wide range of optical, optoelectronic, opto-chemical and opto-mechanical devices such as optical gyroscopes, optical switches, optical chemical detectors, and optical activation/control of mechanical actuators.

The device includes a semiconductor layer 114 having first regions 68, second regions 70, source regions 72 and drain regions 74. Third regions 76 extend into the first regions 68. The drain regions 74 extend into the second regions 70. Shallow trench isolation structures 60 extend into the semiconductor layer 114. The base region 66, first regions 68, second regions 70, third regions 76, sources and drains can each be doped so as to be an n-type region or a p-type region. In the example shown in FIG. 11A, the base region 66 is doped so as to be a p-type base region, the first regions 68 are doped so as to be n-type first regions that serve as n-wells, the second regions 70 are doped so as to be p-type second regions that serve as p-wells, the third regions 76 are doped so as to be an n-type third regions, the source regions 72 are doped so as to be n-type source regions, and the drain regions 74 are doped so as to be n-type drain regions. The concentration of dopant in the first regions 68 and in the second regions 70 can be greater than the dopant concentration in the base region 66. The concentration of dopant in the third regions 76 can be greater than the dopant concentration in the first regions 68. The concentration of drain regions 74 can be greater than the dopant concentration in the source regions 72 which can be greater than the dopant concentration in the first region 68. The dopant concentration in the drain regions 74 can be sufficient to make the drain regions 74 degenerate semiconductors. Suitable materials for the semiconductor layer 114 include, but are not limited to, silicon, Thick-Film Silicon-on-Insulator (SOI), UltraThinFilm (UTF)-SOI, and UltraThinFilm (UTF)-GOI. Suitable materials for the shallow trench isolation structures include, but are not limited to, dielectric materials such as silicon oxide.

Insulators 78, gates 80, and gate insulators 82 are positioned on the semiconductor layer 114. The gate insulator 82 is positioned between the semiconductor layer 114 and a gate 80. A gain medium 147 is positioned between the third region 76 and a cap layer 88. The gain medium 147 can be in direct physical contact with the cap layer 88 and the third region 76. The gain medium 147 need not be doped and can accordingly be an intrinsic region. The cap layer 88 can be a doped region. In the example of FIG. 11A, the cap layer 88 can be doped so as to be a p-type cap layer. Suitable materials for the cap layer 88 include, but are not limited to, silicon, Suitable materials for the first reflector and the second reflector 140 include, but are not limited to, Si, Ge, random alloys of $Si_{1-x}Ge_x$ where x is greater than or equal to 0 and/or less than or equal to 1, and random alloys of $Si_{1-x-y}Ge_xC_y$ where x is greater than 0 and less than or equal to 1 and y is greater than 0 and less than or equal to 0.25. A surface plasmon resonance structure 148 is positioned on the cap layer 88.

Electrical contacts 90 are in direct physical contact with the surface plasmon resonance structure 148, the gate 80, and the drain region 74. Suitable materials for the electrical contact 90 include, but are not limited to, silicides such as Nickel Silicide. A protective layer 92 is positioned on the device such that the cap layer 88, the surface plasmon resonance structure 148, the insulator 78, and the gate 80 are between the protective layer 92 and the semiconductor layer 114. Suitable protective layers 92 include, but are not limited to, the layers called Pre-Metal Dielectric (PMD) in CMOS technology applications. Electrical conductors 94 extend through the protective layer 92 to the electrical contacts 90. Electronics (not shown) can be in electrical communication with the electrical conductors 94. As a result, the electronics can apply electrical energy to the electrical conductors 94 in order to operate the device.

The semiconductor layer 114 is positioned on an intermediate layer 110 such that the intermediate layer 110 is between the semiconductor layer 114 and a light reflector 152. Suitable intermediate layers 110 have a lower index of refraction than the semiconductor layer 114. Suitable materials for the light reflector 152 include, but are not limited to, metals such as aluminum, copper, silver, and gold. The device can be constructed on a Silicon-On-Insulator (SOI) wafer. As noted above, a SOI wafer includes a buried oxide layer that is typically silicon oxide, between an upper layer of silicon and a lower layer of silicon. The lower layer of silicon can be removed so as to expose the buried oxide layer. The light reflector 152 can then be formed on the exposed buried oxide. As a result, the buried oxide from the silicon-on-insulator wafer serves as the intermediate layer 110 and the top layer of silicon from the silicon-on-insulator wafer serves as the semiconductor layer 114.

During operation of the device, the light reflector 152 and the surface plasmon resonance structure 148 define a laser cavity. For instance, electronics apply electrical energy to the electrical conductors 94 so as to generate light from the gain medium 147. The generated light resonates between the light reflector 152 and the surface plasmon resonance structure 148. The surface plasmon resonance structure 148 reflects the light signal and includes multiple patterned structures. For instance, the surface plasmon resonance structure 148 can include or consist of a patterned, electrically conductive material such as a metal film. The plasmon resonance structure 148 can interact with the resonant light so as to select the wavelength and/or polarization of the resonant light signal. The material for the structures, the thickness of the material, and the pattern in which the structures are arranged determine the resulting wavelength and polarization of the resonant light. Suitable materials for the structures include, but are not limited to, metals such as aluminum, copper, silver, and gold. Suitable sizes for at least one dimension of the plasmon resonance structures include, but are not limited to, sizes less than 100 nm, 75 nm, or 50 nm. In some instances, the at least one dimension is the thickness of the plasmon resonance structure 148 relative to the cap layer 88. As is known in the design of Fabry-Perot (FP) lasers, the light reflector 152 and/or the surface plasmon resonance structure 148s can be configured to be partially transmissive in order to provide the laser output from the device.

The first region 68 is sufficiently doped so as to provide electrical communication between the third region 76 of the photodiode and the source region 72 of the transistor. The source region 72, drain region 74 and a gate 80 respectively act as the source, drain, and gate of the transistor. Further, the second region 70 is doped such that the portion of the second region 70 closest to the gate insulator 82 acts as the channel of the transistor. For instance, the second region 70 can include a gradient in the dopant concentration that allows the second region 70 to function as a retrograde well. The electronics can turn the transistor on and off and accordingly turn the laser on and off. Accordingly, the electronics can modulate the output of the laser.

Figure 11B:
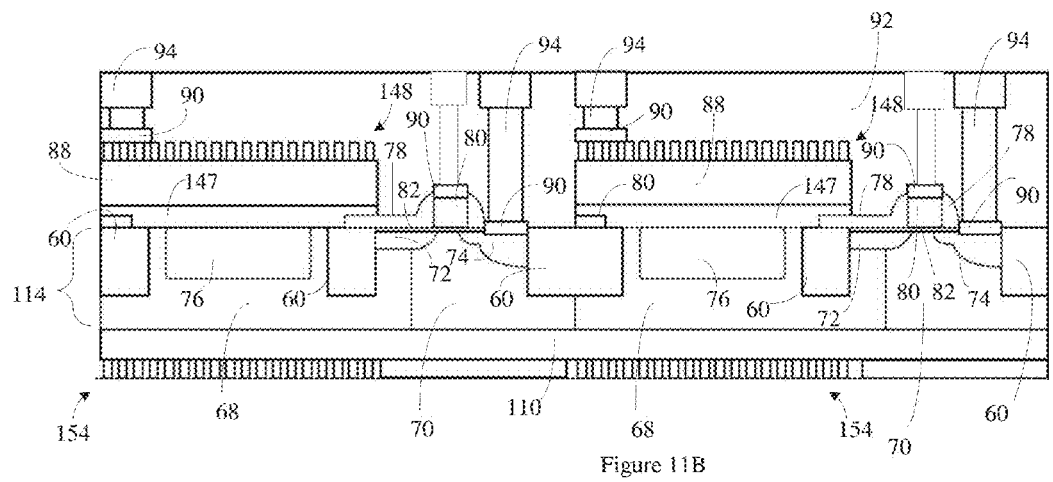
FIG. 11B is a cross section of an optoelectronic device that includes a light source electrically connected to a transistor.

The light reflector 152 in the device of FIG. 11A can be replaced with a second surface plasmon resonance structure 154 as shown in FIG. 11B. As a result, the light signal resonates between the surface plasmon resonance structure 148 and the second surface plasmon resonance structure 154. The second surface plasmon resonance structure 154 can have the same characteristics as the surface plasmon resonance structure 148. For instance, second surface plasmon resonance and the surface plasmon resonance structure 148 can be constructed of the same material, have the same thickness or substantially the same thickness and arranged in the same pattern or substantially the same pattern. Alternately, the second surface plasmon resonance structure 154 can have different characteristics from the surface plasmon resonance structure 148.

Figure 11C:
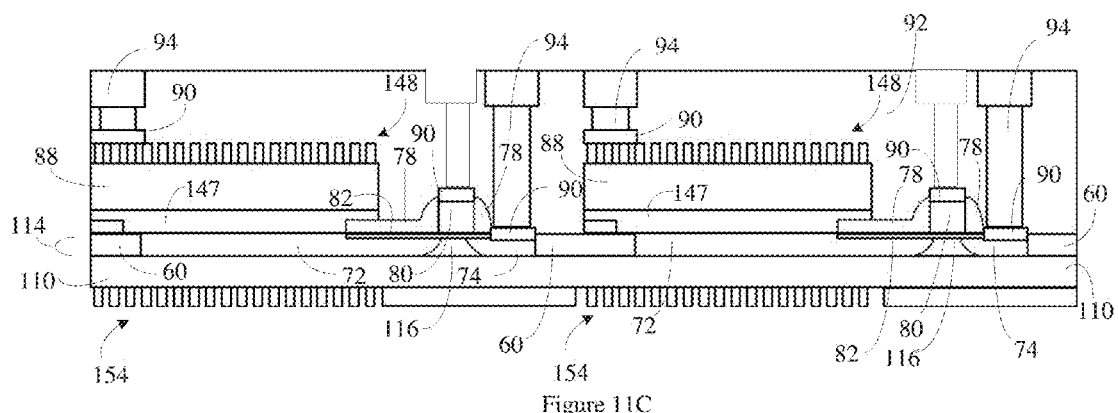
FIG. 11C is a cross section of an optoelectronic device that includes a light source electrically connected to a transistor.

The thickness of the semiconductor layer 114 can be reduced as shown in the cross section of FIG. 11C. The semiconductor layer 114 includes channels 116, source regions 72 and drain regions 74. Shallow trench isolation structures 60 extend into the semiconductor layer 114 and can optionally extend into contact with an intermediate layer 110. The channels 116, source regions 72 and drain regions 74 can each be doped so as to be an n-type region or a p-type region. In the example shown in FIG. 11C, the source regions 72 are doped so as to be n-type source regions, the channels 116 are doped so as to be p-type channels, and the drain regions 74 are doped so as to be n-type drain regions. The dopant concentration in the drain regions 74 can optionally be sufficient to make the drain regions 74 degenerate semiconductors. The channels 116 can be doped such that the channels 116 can act as the channel for the transistor. Suitable materials for the semiconductor layer 114 include, but are not limited to, Si, Ge, random alloys of $Si_{1-x}Ge_x$ where x is greater than or equal to 0 and/or less than or equal to 1, and random alloys of $Si_{1-x-y}Ge_xC_y$ where x is greater than 0 and less than or equal to 1 and y is greater than 0 and less than or equal to 0.25.

Insulators 78, gates 80, and gate insulators 82 are positioned on the semiconductor layer 114. The gate insulator 82 is positioned between the semiconductor layer 114 and a gate 80. A gain medium 147 is positioned between the source region 72 and a cap layer 88. The gain medium 147 can be in direct physical contact with the cap layer 88 and the source region 72. The gain medium 147 need not be doped and can accordingly be an intrinsic region. The cap layer 88 can be a doped region. In the example of FIG. 11C, the cap layer 88 can be doped so as to be a p-type cap layer. Suitable materials for the cap layer 88 include, but are not limited to, Si, Ge, random alloys of $Si_{1-x}Ge_x$ where x is greater than or equal to 0 and/or less than or equal to 1, and random alloys of $Si_{1-x-y}Ge_xC_y$ where x is greater than 0 and less than or equal to 1 and y is greater than 0 and less than or equal to 0.25. A surface plasmon resonance structure 148 is positioned on the cap layer 88.

Electrical contacts 90 are in direct physical contact with the surface plasmon resonance structure 148, the gate 80, and the drain region 74. Suitable materials for the electrical contact 90 include, but are not limited to, silicides such as Nickel Silicide. A protective layer 92 is positioned on the device such that the cap layer 88, the surface plasmon resonance structure 148, the insulator 78, and the gate 80 are between the protective layer 92 and the semiconductor layer 114. Suitable protective layers 92 include, but are not limited to, the layers called Pre-Metal Dielectric (PMD). Electrical conductors 94 extend through the protective layer 92 to the electrical contacts 90. Electronics (not shown) can be in electrical communication with the electrical conductors 94. As a result, the electronics can apply electrical energy to the electrical conductors 94 in order to operate the device.

The semiconductor layer 114 is positioned on an intermediate layer 110 such that the intermediate layer 110 is between the semiconductor layer 114 and a second surface plasmon resonance structure 154. Suitable intermediate layers 110 have a lower index of refraction than the semiconductor layer 114. The device can be constructed on a Silicon-On-Insulator (SOI) wafer. As noted above, a SOI wafer includes a buried oxide layer that is typically silicon oxide, between an upper layer of silicon and a lower layer of silicon. The lower layer of silicon can be removed so as to expose the buried oxide layer. The second surface plasmon resonance structure 154 can then be formed on the exposed buried oxide. As a result, the buried oxide from the silicon-on-insulator wafer serves as the intermediate layer 110 and the top layer of silicon from the silicon-on-insulator wafer serves as the semiconductor layer 114.

During operation of the device illustrated in FIG. 11C, the surface plasmon resonance structure 148 and the second surface plasmon resonance structure 154 define a laser cavity. For instance, electronics apply electrical energy to the electrical conductors 94 so as to generate light from the gain medium 147. The generated light signal resonates between the second surface plasmon resonance structure 154 and the surface plasmon resonance structure 148. The surface plasmon resonance structure 148 includes multiple patterned structures that interact with the resonant light so as to select the wavelength and/or polarization of the resonant light signal. The material for the structures, the thickness of the material, and the pattern in which the structures are arranged determine the resulting wavelength and polarity of the resonant light. Suitable materials for the structures include, but are not limited to, metals, such as aluminum, copper, silver, and gold. Suitable sizes for at least one dimension of the plasmon resonance structures include, but are not limited to, sizes less than 100 nm, 75 nm, or 50 nm. In some instances, the at least one dimension is the thickness of the plasmon resonance structure 148 relative to the cap layer 88. The second surface plasmon resonance structure 154 can have the same characteristics as the surface plasmon resonance structure 148. For instance, the second surface plasmon resonance and the surface plasmon resonance structure 148 can be constructed of the same material, have the same thickness or substantially the same thickness and arranged in the same pattern or substantially the same pattern. Alternately, the second surface plasmon resonance structure 154 can have different characteristics from the surface plasmon resonance structure 148. As is known in the design of Fabry-Perot (FP) lasers, the surface plasmon resonance structure 148 and/or the second surface plasmon resonance structure 154s can be configured to be partially transmissive in order to provide the laser output from the device.

The source region 72 is sufficiently doped so as to provide electrical communication between the gain medium 147 and the channel 116. As a result, the source region 72, channel 116, drain region 74 and gate 80 respectively act as the source, channel, drain, and gate of the transistor. The electronics can turn the transistor on and off and accordingly turn the laser on and off. Accordingly, the electronics can modulate the output of the laser.

Figure 11D:
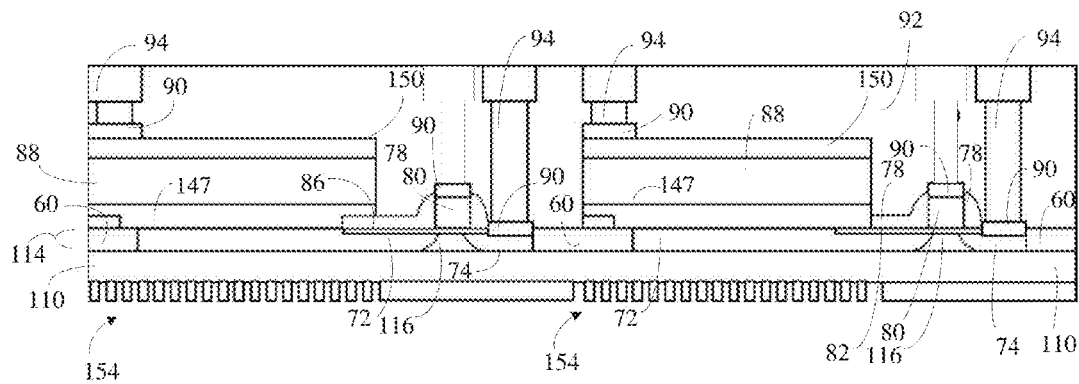
FIG. 11D is a cross section of an optoelectronic device that includes a light source electrically connected to a transistor.

The surface plasmon resonance structure 148 can be replaced with a light reflector such as a mirror. For instance, FIG. 11D illustrates the device of FIG. 11C with the surface plasmon resonance structure 148 replaced by a light reflector such as a mirror. Suitable materials for the reflector include, but are not limited to, metals, such as aluminum, copper, silver, and gold. During operation of the device, the light reflector and the second surface plasmon resonance structure 154 define the laser cavity. As is known in the design of Fabry-Perot (FP) lasers, the light reflector and/or the second surface plasmon resonance structure 154s can be configured to be partially transmissive in order to provide the laser output from the device.

The inclusion of one or more the disclosed superlattices in the gain medium 147 allow for the gain medium to generate a broad range of wavelengths despite being used on a silicon platform. The gain medium of LEDs and/or Lasers generally needs to be a material with a direct bandgap. Further, CMOS technology is based on silicon, Ge, random alloys of $Si_{1-x}Ge_x$ and random alloys of $Si_{1-x-y}Ge_xC_y$ which all have indirect bandgaps. The disclosed superlattices include or consist of Group IV elements and can have direct bandgaps. As a result, the disclosed superlattices are suitable for use as the gain medium of LEDs and lasers. Further, the disclosed superlattices can be epitaxially grown on silicon which makes them very well suited for monolithic integration with CMOS.

Figure 11E:
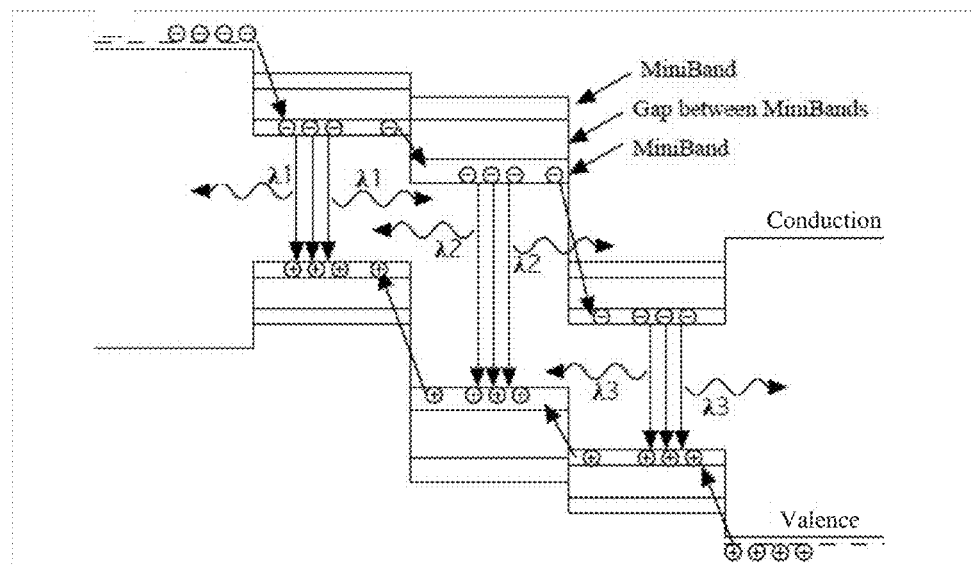
FIG. 11E illustrates an example of band alignments suitable for the materials included in the gain medium or active layer of any of the light sources of 10A through FIG. 11D.

In each of the devices illustrated in FIG. 11A through FIG. 11D, the gain medium 147 includes or consists of one or more of the disclosed superlattices. Accordingly, the semiconductor layer 114 and/or the third region 76 and/or the source region 72 can serve as the substrate for the disclosed superlattice systems. When the gain medium 147 includes multiple superlattices, the superlattices can be stacked as disclosed in the context of FIG. 1B. Further, when the gain medium or active layer includes multiple different superlattices, the different superlattices can have compatible band alignments that allow the different superlattices to produce different wavelengths of light. For instance, FIG. 11E illustrates an example band alignments that can produce this result in a laser cavity constructed according to any of the devices illustrated in FIG. 11A through FIG. 11D. The light-absorbing medium 86 includes or consists of a first superlattice, a second superlattice, and a third superlattice and each of the different superlattices generates a different wavelength of light $\lambda_1$, $\lambda_2$, and $\lambda_3$. This is generally not possible with bulk materials because one bulk material will generally absorb the light produced by other bulk materials. However, the disclosed superlattices do not show the same level of cross absorption because as illustrated in FIG. 11E, the disclosed superlattices can possess minibands and gaps between the minibands that make them more transparent to photons whose energy exceeds their own fundamental gap but that matches energy levels that fall in the gaps between minibands. Further, it is believed that the disclosed superlattices can permit electrons and holes to be available for radiative recombination in each of the superlattices simultaneously. Also, the superlattices do not need to be in a particular order of ascending or descending bandgap magnitude but can be in a sequence in which electrons and holes can traverse each superlattice without encountering heterojunction barriers at the interfaces between the superlattices. When a light source includes one or more surface plasmon resonance structures, the surface plasmon resonance structures can be used to achieve resonance of the different wavelengths generated in the gain medium. For instance, the one or more surface plasmon resonant structures can be designed to provide multiple resonant peaks and different peaks can be associated with the bandgap of different superlattices. For instance, each of the different wavelengths produced by the gain medium can have a wavelength that falls within one of the resonant peaks. As a result, the multiple SLs in the active layer or gain medium can result in light signals of different wavelengths being output or can increase the bandwidth of the light signals output by the light source.

In the descriptions of the devices in each of FIG. 11A through FIG. 11D, each of the transistors is described as an NMOS transistor. However, one or more of the transistors can be a PMOS transistor. For instance, to generate a PMOS transistor, the first regions 68 are doped so as to be p-type first regions, the second regions 70 are be doped so as to be n-type second regions, the third regions 76 are doped so as to be p-type third regions, the source regions 72 are doped so as to be p-type source regions, and the drain regions 74 are doped so as to be p-type drain regions. In these circumstances, the cap layers 88 can be doped so as to be a p-type cap layer. Combinations of different transistors can be present on the same device. For instance, a portion of the transistors on a device can be PMOS while another portion are NMOS.

Although FIG. 11A through FIG. 11D illustrate a device having multiple light sources on a single device, the device can include only one light source. Further, the one or more light sources on a device can be in electrical communication with components other than the transistors illustrated above. For instance, one or more light sources on a device can each be in electrical communication with one or more resistors. Further, the one or more light sources need not be in electrical communication with other components integrated onto the device.

The construction of the devices illustrated in FIG. 11A through FIG. 11D can be achieved using traditional integrated circuit fabrication techniques. Additionally or alternately, the portion of the devices that include the disclosed superlattices and/or superlattice systems can be generated as disclosed in this document. Additional information related to the structure, construction, operation, and fabrication of the devices illustrated in FIG. 11A through FIG. 11D can be found in U.S. Pat. No. 6,943,051, patent application Ser. No. 10/399,495, issued on Sep. 13, 2005, filed on Apr. 17, 2003, and entitled "Method of fabricating heterojunction photodiodes integrated with CMOS;" U.S. Pat. No. 7,265,006, patent application Ser. No. 11/176,538, issued on Sep. 4, 2007, filed on Jul. 7, 2005, and entitled "Method of fabricating heterojunction devices integrated with CMOS;" U.S. Pat. No. 7,153,720, patent application Ser. No. 11/142,783, issued on Dec. 26, 2006, filed on Jun. 1, 2005, an entitled "CMOS image sensor;" U.S. Pat. No. 7,521,737, patent application Ser. No. 11/070,721, issued on Apr. 21, 2009, filed on Mar. 2, 2005, and entitled "Light-sensing device;" U.S. Pat. No. 8,120,079, patent application Ser. No. 12/403,900, issued on Feb. 21, 2012, filed on Mar. 13, 2009, and entitled "Light-sensing device for multi-spectral imaging;" U.S. Pat. No. 8,183,516, patent application Ser. No. 11/572,525, issued on May 22, 2012, filed on Jul. 28, 2005, and entitled "Layouts for the monolithic integration of CMOS and deposited photonic active layers;" U.S. patent application Ser. No. 11/781,544, filed on Jul. 23, 2007, and entitled "Method of Fabricating Heterojunction Photodiodes with CMOS", and U.S. patent application Ser. No. 11/572,519, filed on Jul. 28, 2005, and entitled "Photonic Devices Monolithically Integrated with CMOS", each of which is incorporated herein in its entirety.

In each of the light sources disclosed in FIG. 10A through FIG. 11Q, the gain medium or active layer includes or consists of one or more of the disclosed superlattices. When the gain medium or active layer includes multiple different superlattices, the different superlattices can have compatible band alignments that allow the different superlattices to produce different wavelengths of light. As a result, the multiple SLs in the active layer or gain medium can result in light signals of different wavelengths being output or can increase the bandwidth of the light signals output by the light source.

Many of the light sources described above can also function as a light sensor. For instance, the gain 147 medium or active layer 120 in these devices can be replaced with a layer that includes or consists of one of the disclosed light-absorbing media 86. As a result, devices such as the devices of FIG. 10C through FIG. 11E can include a light sensor within a resonant cavity or a resonant enhancement structure. Accordingly, FIG. 10C through FIG. 11E also disclose light sensors. The use of a light sensor within a resonant cavity or a resonant enhancement structure can increase the portion of an incident light signal that is absorbed by the light sensor and accordingly increase the efficiency of the device.

Figure 12:
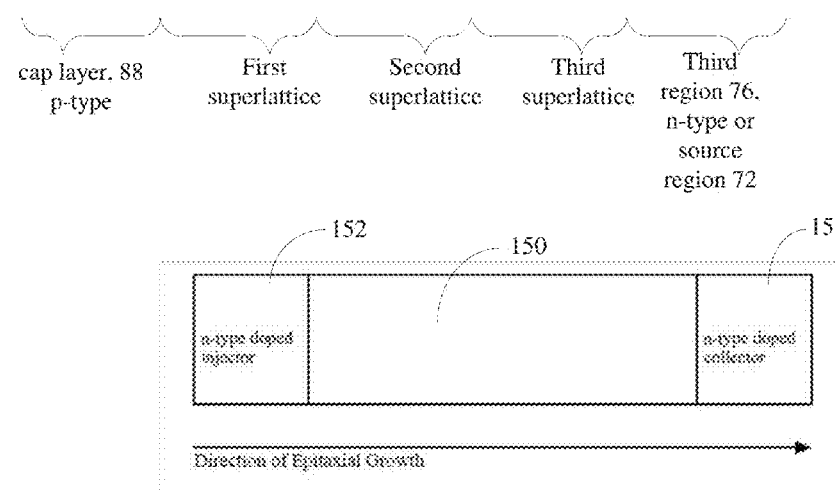
FIG. 12 is a schematic of an example of a two terminal negative differential resistance (NDR) device.

The disclosed superlattices can be employed in negative differential resistance (NDR) devices or Gunn devices. These devices can be two or three terminal devices where a voltage is applied across the device. For at least a portion of the range of voltages applied to these devices, the resistance of the device increases as the applied voltage increases. FIG. 12 is a schematic of an example of a two terminal negative differential resistance (NDR). The device includes an active region 150 between and in contact with the doped regions 152 of the device terminals. The doped regions can both be degenerately doped so as to be n-type regions. The active region is the region of the device where the resistance increases in response to applied voltage. The active region includes or consists of one or more of the disclosed superlattices.

The disclosed superlattices can provide negative differential resistance (NDR) by one of several mechanisms. For instance, the band structure shown in FIG. 21 has a conduction band with the conduction band minimum (CBM) located at the gamma point. There are other conduction band minima that are adjacent to the CBM that serve as satellite valleys (for example, near the points L3, L2 and L1). These satellite valleys have a flatter curvature than the CBM indicating a larger electron mass. When sufficient voltage is applied and sufficient mean free path is available, the electrons residing in the CBM gain enough energy to jump to the satellite valley with higher energy but lower mass and lower mobility. This leads to a lower current at a higher voltage and thus a NDR.

Another mechanism through which the disclosed superlattices can provide negative differential resistance (NDR) is evident from FIG. 22. FIG. 22 shows the bottom of the conduction band includes periodic minibands having narrow widths (in energy) along the line from the L0 point to the gamma point of the band structure. When electrons are accelerated by the applied voltage, they reach the point at which the curvature of the dispersion curve reverses polarity and thus lead to a current decrease. This current decrease provides the desired NDR.

Figure 42:
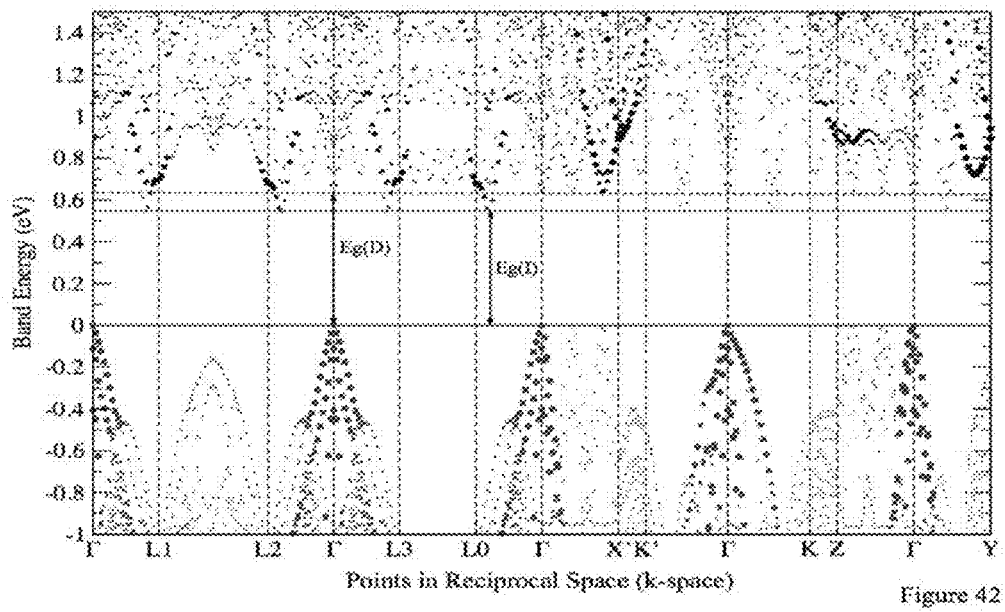
FIG. 42 is the simulated band structure for the superlattice cell represented by $(Ge_4C)_3$—$(Ge_5)_7$ grown on the (111) face of silicon.

Prior NDR device were a result of the electrons responding to the applied voltage through mechanisms such as the mechanisms describe above; however, the disclosed superlattices can provide NDR devices that result from the response of holes to the applied voltage. For instance, FIG. 42 has a valence band with a valence band maximum (VBM) located at the Γ point. There are other valence band maxima that are adjacent to the VBM that serve as satellite peaks (for example, near mid-distance between points L1 and L2). These satellite peaks have a flatter curvature than the VBM indicating an increased hole mass. When sufficient voltage is applied and sufficient mean free path is available, the holes residing in the VBM gain enough energy to jump to the satellite peak and accordingly results in a lower level of electrical current.

Another mechanism by which holes can provide NDR is evident from FIG. 38. FIG. 38 shows the top of the valence band includes periodic minibands having narrow widths (in energy) along the line from the L0 point to the gamma point of the band structure. When holes are accelerated by the applied voltage, they reach the point at which the curvature of the dispersion curve reverses polarity and thus lead to a current decrease. This current decrease provides the desired NDR. Accordingly, there are various mechanisms by which the disclosed superlattices provide negative differential resistance (NDR).

Example 1

The band structure for the superlattice cell represented by $(Ge_4C)_5$—$(Ge_5)_5$ grown on the (100) face of silicon was simulated and the resulting band structure presented in FIG. 11. The band structure for the superlattice cell represented by $(Ge_4C)_5$—$(Ge_5)_5$ grown on the (111) face of silicon was simulated and the resulting band structure presented in FIG. 13. Band structures are a plot of the band energy values over a number of high symmetry points in the Brillouin Zone (BZ), also known as the k-path or k-circuit. The high symmetry points change according to the symmetry of the superlattice cell, and consequently so does the k-circuit. The band structure in FIG. 11 is different from the band structure shown in FIG. 13. This difference is believed to be a result of the different impact of strain on the different components of the superlattice, due to the fact that the surfaces of constant energy in the BZ are oriented along different directions for the different materials used as components of the superlattice. For example, for materials whose surfaces of constant energy are oriented along the X-direction of the BZ, such as silicon, the X-direction coincides with the direction of uniaxial strain for films grown on (100) surfaces, while for materials whose surfaces of constant energy are oriented along the L-direction, such as germanium, the L-direction coincides with the direction of uniaxial strain for films grown on (111) surfaces. Consequently, for the same material, the impact of strain is different depending on the crystallographic surface orientation on which the material is epitaxially grown, and for the same crystallographic surface orientation, the impact of strain depends on the direction of symmetry of the constant energy surfaces of each material. These results indicate that substrate can be selected so as to achieve particular bandgap results.

Example 2

Figure 15:
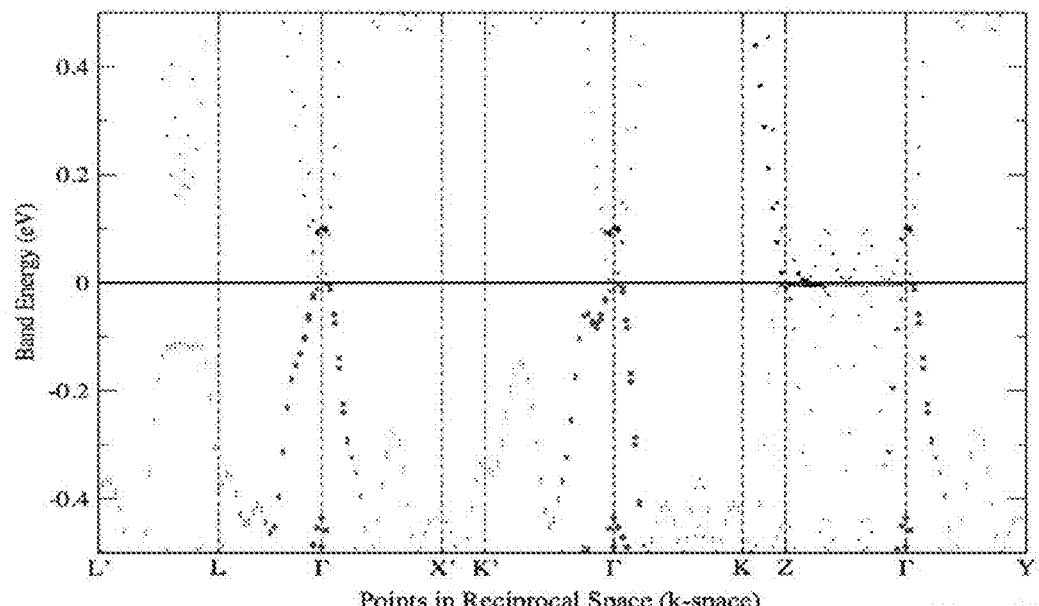
FIG. 15 is the simulated band structure for the superlattice cell represented by $(Si_4C)_5$—$(Si_5)_1$—$(Ge_5)_1$—$(Si_5)_3$—$(Ge_5)_1$—$(Si_5)_1$ grown on the (100) face of silicon.
Figure 16:
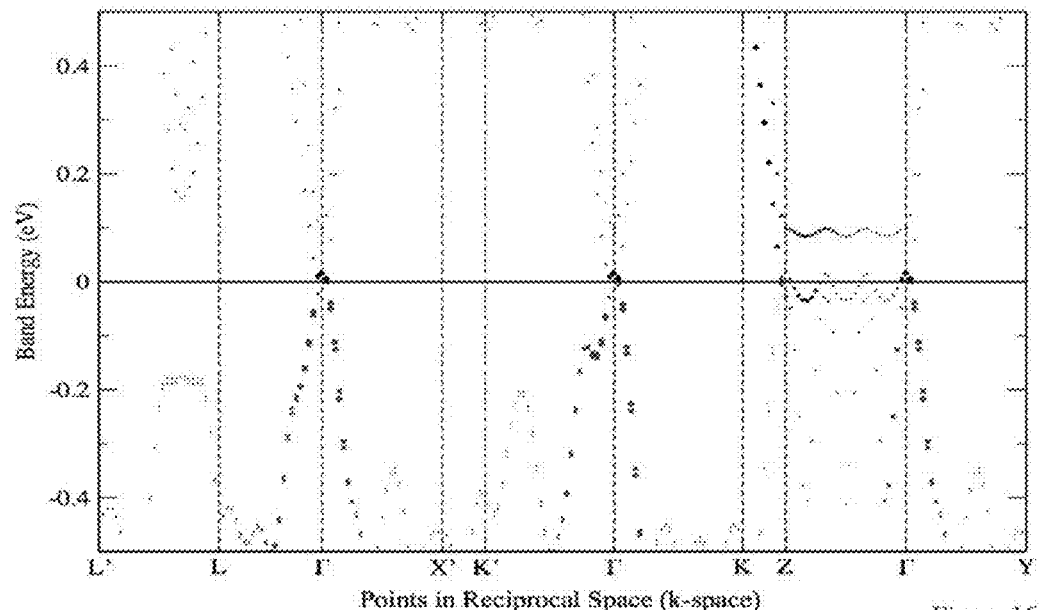
FIG. 16 is the simulated band structure for the superlattice cell represented by $(Si_4C)_5$—$(Si_5)_2$—$(Ge_5)_1$—$(Si_5)_1$—$(Ge_5)_1$—$(Si_5)_2$ grown on the (100) face of silicon.
Figure 17:
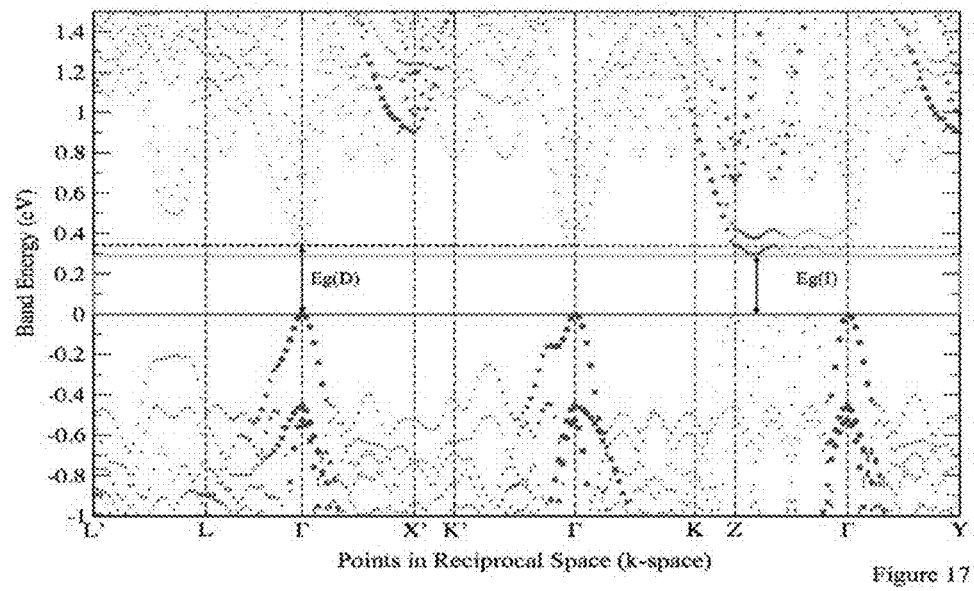
FIG. 17 is the simulated band structure for the superlattice cell represented by $(Si_4C)_5$—$(Si_5)_2$—$(Ge_5)_1$—$(Si_5)_2$—$(Ge_5)_1$—$(Si_5)_1$ grown on the (100) face of silicon.

The band structure for the superlattice cell represented by $(Si_4C)_5$—$(Si_5)_1$—$(Ge_5)_1$—$(Si_5)_3$—$(Ge_5)_1$—$(Si_5)_1$ grown on the (100) face of silicon was simulated and the resulting band structure presented in FIG. 15. The band structure for the superlattice cell represented by $(Si_4C)_5$—$(Si_5)_2$—$(Ge_5)_1$—$(Si_5)_1$—$(Ge_5)_1$—$(Si_5)_2$ grown on the (100) face of silicon was simulated and the resulting band structure presented in FIG. 16. The band structure for the superlattice cell represented by $(Si_4C)_5$—$(Si_5)_2$—$(Ge_5)_1$—$(Si_5)_2$—$(Ge_5)_1$—$(Si_5)_1$ grown on the (100) face of silicon was simulated and the resulting band structure presented in FIG. 17. These superlattices were grown on the same substrate surface, had the same total number of atomic planes, and the same number of each type of atomic plane. However, the atomic planes were re-arranged in different sequences. However, as is most evident from a comparison of FIG. 16 and FIG. 17, the re-ordering of the atomic planes produces a shift in the bandgaps. These results imply that the order of atomic planes can be changed in order to tune the bandgap.

Example 3

The band structure for the superlattice cell represented by $(Ge_4C)_3$—$(Ge_5)_2$ grown on the (111) face of silicon was simulated and the resulting band structure presented in FIG. 18. The band structure for the superlattice cell represented by $(Ge_4C)_3$—$(Ge_5)_4$ grown on the (111) face of silicon was simulated and the resulting band structure presented in FIG. 19. The band structure for the superlattice cell represented by $(Ge_4C)_3$—$(Ge_5)_5$ grown on the (111) face of silicon was simulated and the resulting band structure presented in FIG. 20. These superlattices were grown on the same substrate surface and each had three $(Ge_4C)$ atomic planes. However, the number of $Ge_5$ atomic planes was increased. A comparison of FIG. 18 with FIG. 19 shows that increasing the number of $Ge_5$ atomic planes from two to four increases the bandgap. However, a comparison of FIG. 19 with FIG. 20 shows that increasing the number of $Ge_5$ atomic planes from four to five has a reduced effect on the bandgap. Additionally, increasing the number $Ge_5$ atomic planes in going from $(Ge_4C)_3$—$(Ge_5)_5$ to $(Ge_4C)_3$—$(Ge_5)_7$ causes the bandgaps to become indirect and increase by 0.216 eV. These results indicate that in at least some superlattices, increasing the number of atomic planes in a superlattice cell that are of a particular chemical composition can be used to achieve a particular bandgap level but that the effects of increasing the number of those atomic planes may result in a shift of the trend with respect to the magnitude of the bandgap.

Example 4

The band structure for the superlattice cell represented by $(Ge_4C)_2$—$(Ge_5)_3$ grown on the (111) face of silicon was simulated and the resulting band structure presented in FIG. 21. The band structure for the superlattice cell represented by $(Ge_4C)_4$—$(Ge_5)_3$ grown on the (111) face of silicon was simulated and the resulting band structure presented in FIG. 22. These superlattices were grown on the same substrate surface and each had three $(Ge_5)$ atomic planes. However, the number of $(Ge_4C)$ atomic planes was increased. A comparison of FIG. 21 with 14 shows that increasing the number of $(Ge_4C)$ atomic planes from two to four decreases the bandgap. These results imply that the bandgap could be further decreased by increasing the number of $(Ge_4C)$ atomic planes. Accordingly, these results also indicate that increasing the number of atomic planes in a superlattice cell that are of a particular chemical composition can be used to achieve a particular bandgap level. Further, comparing these results with the results of Example 3 show that the resulting band structure is not only a function of the number of (GO atomic planes but is also a function of the number of $(Ge_4C)$ atomic planes. Accordingly, the number of atomic planes of each of the different chemical compositions can be selected so as to achieve a particular bandgap.

Example 5

Figure 23:
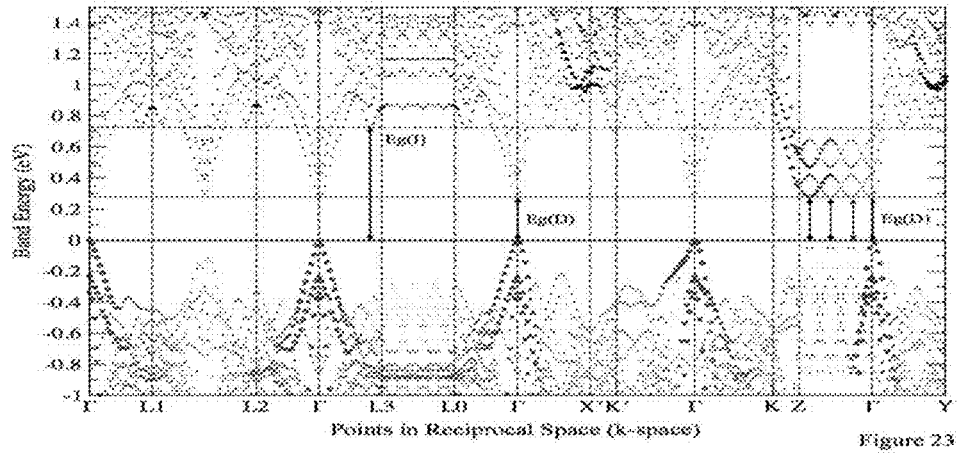
FIG. 23 is the simulated band structure for the superlattice cell represented by $(Si_4C)_4$—$(Ge_5)_3$ grown on the (100) face of silicon.
Figure 24:
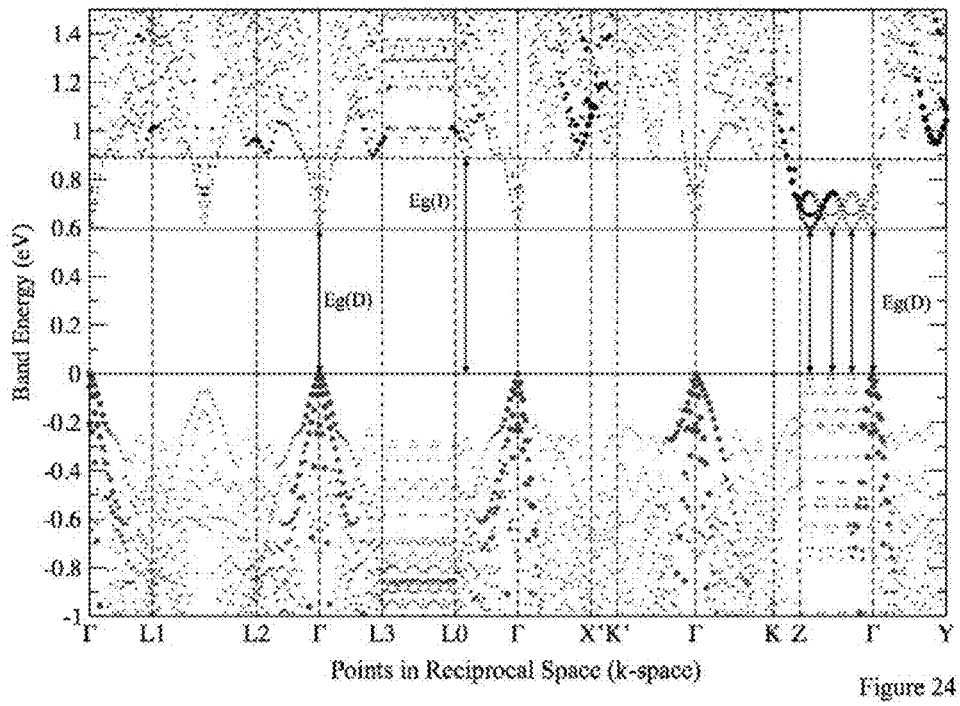
FIG. 24 is the simulated band structure for the superlattice cell represented by $(Si_4C)_3$—$(Ge_5)_4$ grown on the (100) face of silicon.

The band structure for the superlattice cell represented by $(Si_4C)_4$—$(Ge_5)_3$ grown on the (100) face of silicon was simulated and the resulting band structure presented in FIG. 23. The band structure for the superlattice cell represented by $(Si_4C)_3$—$(Ge_5)_4$ grown on the (100) face of silicon was simulated and the resulting band structure presented in FIG. 24. A comparison of these Figures shows that a fairly small change in composition can dramatically change the band structure and the resulting bandgaps. These figures also show that that the bandgap can change from direct to indirect with small composition changes.

Example 6

The band structures for a variety of superlattices were simulated. The following Table 2 lists the different superlattices for which band structures were generated and the Figure where the band structure can be found.

TABLE 2

| Superlattice Cell | FIG. |
| --- | --- |
| $(Ge_4C)_5$—$(Ge_5)_5$ on the (100) surface of silicon | 13 |
| $(Ge_4C)_5$—$(Ge_5)_5$ on the (111) surface of silicon | 14 |
| $(Si_4C)_5$—$(Si_5)_1$—$(Ge_5)_1$—$(Si_5)_3$—$(Ge_5)_1$—$(Si_5)_1$ on the (100) surface of silicon | 15 |
| $(Si_4C)_5$—$(Si_5)_2$—$(Ge_5)_1$—$(Si_5)_1$—$(Ge_5)_1$—$(Si_5)_2$ on the (100) surface of silicon | 16 |
| $(Si_4C)_5$—$(Si_5)_2$—$(Ge_5)_1$—$(Si_5)_2$—$(Ge_5)_1$—$(Si_5)_1$ on the (100) surface of silicon | 17 |
| $(Ge_4C)_3$—$(Ge_5)_2$ on the (111) surface of silicon | 18 |
| $(Ge_4C)_3$—$(Ge_5)_4$ on the (111) surface of silicon | 19 |
| $(Ge_4C)_3$—$(Ge_5)_5$ on the (111) surface of silicon | 20 |
| $(Ge_4C)_2$—$(Ge_5)_3$ on the (111) surface of silicon | 21 |
| $(Ge_4C)_4$—$(Ge_5)_3$ on the (111) surface of silicon | 22 |
| $(Si_4C)_4$—$(Ge_5)_3$ on the (100) surface of silicon | 23 |
| $(Si_4C)_3$—$(Ge_5)_4$ on the (100) surface of silicon | 24 |
| $(Si_4C)_2$—$(Ge_5)_2$ on the (100) surface of silicon | 25 |
| $(Ge_4C)_3$—$(Si_5)_5$ on the (111) surface of silicon | 26 |
| $(Ge_4C)_4$—$(Si_5)_2$ on the (100) surface of silicon | 27 |
| $(Ge_4C)_4$—$(Si_5)_3$ on the (100) surface of silicon | 28 |
| $(Ge_4C)_4$—$(Ge_5)_2$ on the (111) surface of silicon | 29 |
| $(Ge_4C)_5$—$(Ge_5)_2$ on the (111) surface of silicon | 30 |
| $(Ge_4C)_5$—$(Ge_5)_3$ on the (111) surface of silicon | 31 |
| $(Ge_4C)_6$—$(Ge_5)_2$ on the (111) surface of silicon | 32 |
| $(Ge_4C)_6$—$(Ge_5)_4$ on the (111) surface of silicon | 33 |
| $(Ge_4C)_7$—$(Ge_5)_3$ on the (111) surface of silicon | 34 |
| $(Ge_4C)_8$—$(Ge_5)_2$ on the (111) surface of silicon | 35 |
| $(Si_4C)_2$—$(Ge_5)_3$ on the (111) surface of silicon | 36 |
| $(Si_4C)_3$—$(Ge_5)_2$ on the (111) surface of silicon | 37 |
| $(Si_4C)_3$—$(Ge_5)_3$ on the (111) surface of silicon | 38 |
| $(Si_4C)_5$—$(Ge_5)_1$—$(Si_5)_5$—$(Ge_5)_1$ on the (100) surface of silicon | 39 |
| $(Si_4C)_5$—$(Si_5)_5$—$(Ge_5)_2$ on the (100) surface of silicon | 40 |

TABLE 2-continued

| Superlattice Cell | FIG. |
|---|---|
| $(Ge_4C)_3$—$(Ge_5)_3$ on the (111) surface of silicon | 41 |
| $(Ge_4C)_3$—$(Ge_5)_7$ on the (111) surface of silicon | 42 |
| $Si_2Sn_2C$ isotropically relaxed to its natural crystalline lattice parameters | 43A |
| $Si_2Sn_2C$ on the (100) surface of silicon | 43B |
| $Si_2Sn_2C$ on the (111) surface of silicon | 43C |
| $Si_2Sn_2C$ on the (110) surface of silicon | 43D |
| $(Si_4C)_4$—$(Si_5)_4$ on the (110) surface of silicon | 44 |

Example 7

Figure 43A:
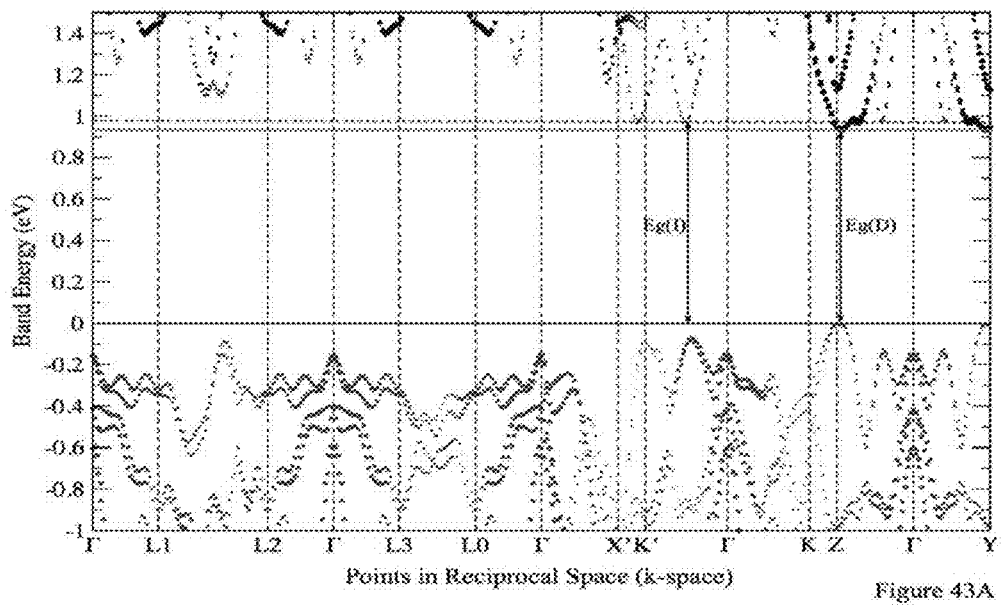
FIG. 43A is the simulated band structure for the superlattice cell represented by $Si_2Sn_2C$ isotropically relaxed to its natural crystalline lattice parameters.
Figure 43B:
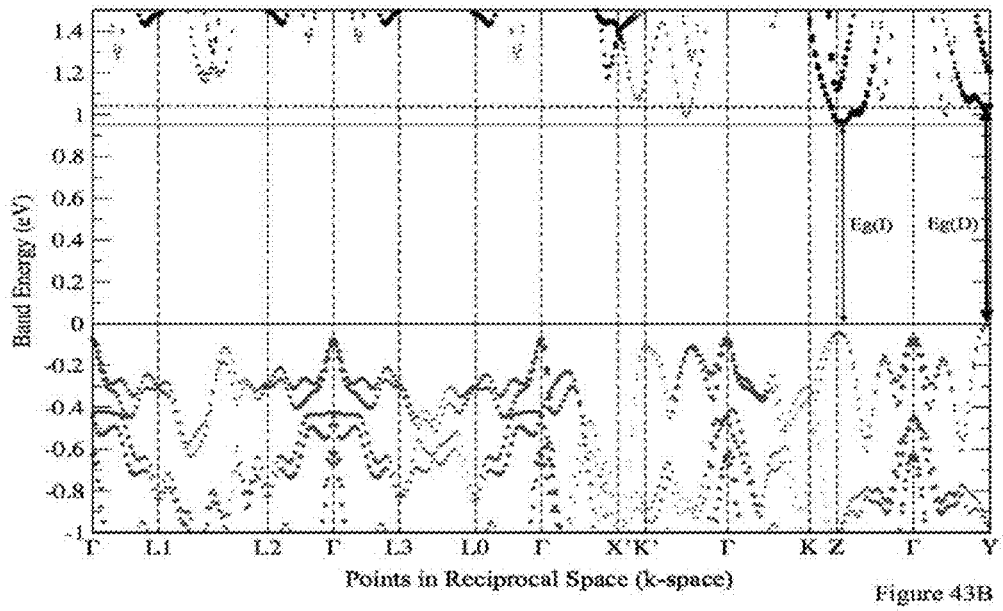
FIG. 43B is the simulated band structure for the superlattice cell represented by $Si_2Sn_2C$ grown on the (100) face of silicon.
Figure 43C:
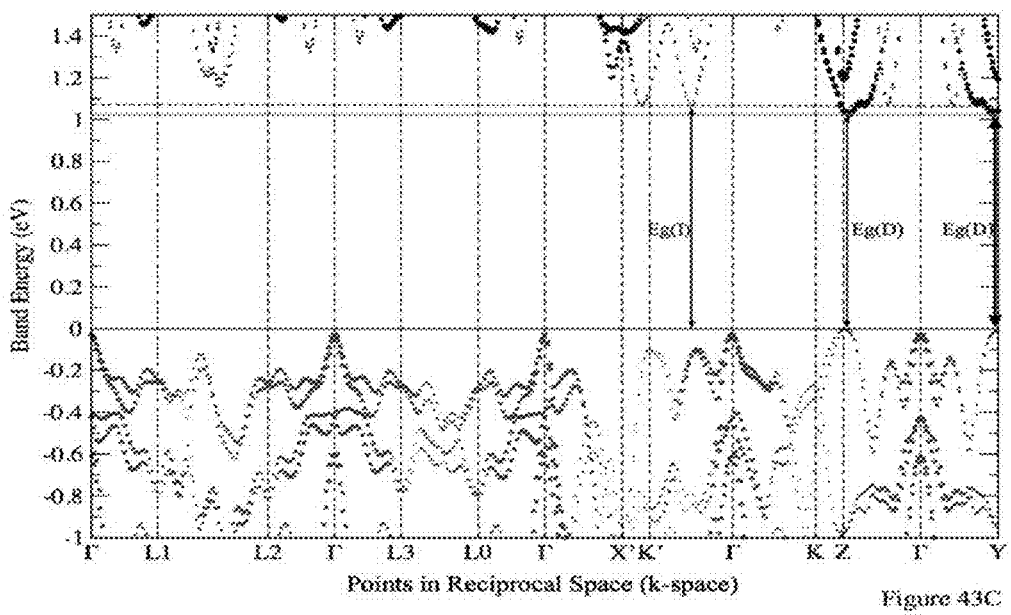
FIG. 43C is the simulated band structure for the superlattice cell represented by $Si_2Sn_2C$ grown on the (111) face of silicon.
Figure 43D:
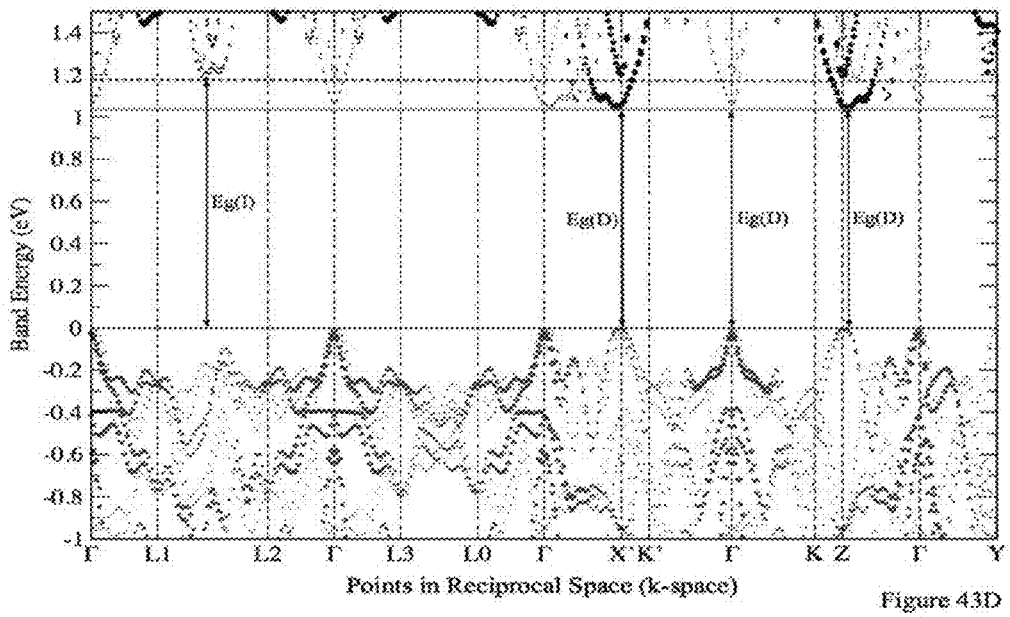
FIG. 43D is the simulated band structure for the superlattice cell represented by $Si_2Sn_2C$ grown on the (110) face of silicon.

The band structures for bulk $Si_2Sn_2C$ was simulated under a variety of different conditions. For instance, FIG. 43A illustrates the results for $Si_2Sn_2C$ in the relaxed state (not strained to any surface), FIG. 43B illustrates the results for $Si_2Sn_2C$ strained to Si(100), FIG. 43C illustrates the results for $Si_2Sn_2C$ strained to Si(111), and FIG. 43D illustrates the results for $Si_2Sn_2C$ strained to Si(110). These images surprisingly and unexpectedly show that the valence band maximum is at the Z point (and/or its equivalent Y) of the Brillouin Zone. Accordingly, this state can be achieved both when $Si_2Sn_2C$ is relaxed or strained. These images also show that the conduction band minimum is at the Z point (and/or its equivalent Y) and that $Si_2Sn_2C$ is therefore a direct band gap material. Since there are materials available with a conduction band minimum at the Z point (and/or its equivalent Y), the presence of the valence band maximum at this location shows that heterojunctions with vertical transitions in k-space can be achieved at the Z-point (or Y point) rather than being limited to the Γ point. This feature would be useful in forming heterojunctions with Si, Ge, or several superlattices of the present invention, which have the conduction band minimum at the same point in the Brillouin Zone. As a result, in some instances, $Si_2Sn_2C$ represents the chemical composition of one or more planes in the disclosed superlattices.

Example 8

Figure 44:
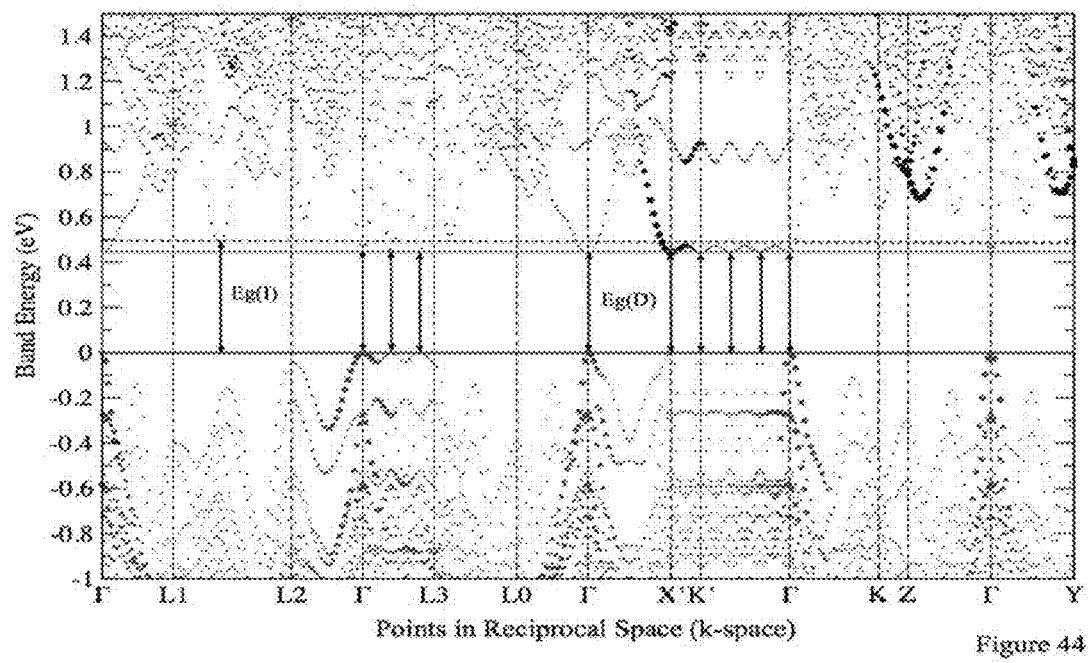
FIG. 44 is the simulated band structure for the superlattice cell represented by $(Si_4C)_4$—$(Si_5)_4$ grown on the (110) face of silicon.

The authors have also found that superlattices such as $(Si_4C)_4$—$(Si_5)_4$ strained to Si(110), can have direct bandgaps at k-points of the Brillouin Zone in which no bulk materials have neither conduction band minimum nor the valence band maximum as shown in FIG. 44. FIG. 44 shows the band structure calculated for a cell with the double of the number of atoms —$(Si_8C_2)_4$—$(Si_{10})_4$— of the minimum size cell $(Si_4C)_4$—$(Si_5)_4$, in order to reduce the spatial asymmetry of the minimum size cell. The conduction band minimum is degenerate in Γ, X, and K, and the valence band maximum is also degenerate in Γ, X, and K. It should be noted that in the unfolded band structure shown in FIG. 44, the spectral weight of the points in Γ and K, are about 100× weaker than in X. This superlattice illustrates that the disclosed superlattices have a variety of k-points at which the conduction band minimum and valence band maximum can occur, as well as variety of band-gap values and of band offsets. Since there are materials available with a conduction band minimum at the K point (and/or its equivalent K'), the presence of the valence band maximum at this location shows that heterojunctions with vertical transitions in k-space can be achieved at the K-point (or K' point) rather than being limited to the Γ point. This feature would be useful in forming heterojunctions with Si, Ge, or several superlattices of the present invention, which have the conduction band minimum at the same point in the Brillouin Zone. As a result, in some instances, $(Si_4C)_4$—$(Si_5)_4$ represents one or more of the disclosed superlattices.

Each of the band structures shown in FIG. 14-25 has direct bandgaps. The surprisingly variety of band structures shown in FIG. 14-25 are achieved using atomic planes having only four different chemical compositions: $Si_4C$, $Ge_4C$, $Ge_5$, and $Si_5$. Further, only one of the band structures is for a superlattice that includes an atomic plane with $Si_5$. As a result, this broad range of results is achieved with essentially three different compositions of the atomic planes. The ability to achieve such a broad range of band structures with a limited number of variables indicates the ability to use the disclosed materials to design superlattices for particular applications.

The above results shows that it is possible to use the disclosed materials to design superlattices for particular applications. In designing superlattices, the desired band structure will be dependent on the band alignments between the constituents of the superlattice. There are three fundamental types of band alignments: type I, or nested gaps, type-II or staggered gaps, and type-III or broken gaps. For type-I alignments, the bandgap of the superlattice is in the range bracketed by the smallest and the largest of the gaps of its constituents. For type-II, the bandgap of the superlattice can be influenced by the band offsets between the constituents, and can be smaller, and can also be larger, than the gaps of its constituents. Superlattices in which the constituents have staggered (also known as type-II) band alignments, can have negative bandgaps, i.e., can be semimetals. A superlattice can have a negative bandgap and one of its constituents has also a negative bandgap. Accordingly, the band structures of the constituents can be used to select the materials for achieving a superlattice band structure with particular features.

Many of the devices disclosed above are disclosed as being constructed on platforms such as Thick-Film Silicon-on-Insulator (SOI), Thin-Film SOI, UltraThinFilm (UTF)-SOI, Thin-Film Germanium on Insulator (GOI), and Ultra-ThinFilm (UTF)-GOI, Thin-Film Silicon-Germanium on Insulator, and UltraThinFilm (UTF)-Silicon-Germanium on Insulator. In these platforms, the thickness refers to the thickness of the top semiconductor layer rather than the supporting layers. For instance, in a Thin-Film SOI, the phrase "Thin Film" refers to the thickness of the upper layer of silicon rather than to the substrate or buried oxide. The thickness of the top semiconductor layer in normal Silicon-on-Insulator (SOI) or Germanium on Insulator (GOI) is greater than 10 nm, 100 nm, or 1 μm and/or less than 10 μm, or 100 μm. In these platforms, "Thick-Films" have a thickness greater than 0.5 μm, or 1 μm, and/or less than 10 μm, or 100 μm. In these platforms, Thin-Films have a thickness greater than 10 nm, 100 nm, and/or less than 0.5 μm, or 1 μm. In these platforms, UltraThinFilms have a thickness greater than 1 nm, or 10 nm and/or less than 20 nm, or 50 nm.

In some instances, the features that are described above as undoped can be doping compensated in that the feature includes equal amounts or concentrations of electrically activated p-type and n-type dopants. Further, the term bulk semiconductor does not refer to the size or amount of the semiconductor but instead refers to semiconductors having the properties of semiconductors that are commonly referred to as bulk semiconductors. For instance, bulk semiconductor can refers to a semiconductor having the optoelectronic properties of what is commonly known as the bulk form that semiconductor.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A superlattice system, comprising:
 a superlattice includes multiple superlattice cells, each superlattice cell having multiple atomic planes that are parallel to one another,
  at least two of the atomic planes in each of the superlattice cells have different chemical compositions, one or more of the atomic planes in each of the superlattice cells includes carbon, and
  the atomic planes being ordered in that corresponding lattice points in each of the different superlattice cells are occupied by an atom of the same element.

2. The system of claim 1, wherein one or more of the one or more atomic planes that include carbon each also includes one or more elements selected from a group consisting of silicon, germanium, lead, and tin.

3. The system of claim 1, wherein the superlattice cells each have a total number of atomic planes that is less than or equal to 40.

4. The system of claim 1, wherein the superlattice cells are each represented by a formula selected from a group consisting of $(Si_4C)_2$—$(Ge_5)_2$, $(Si_4C)_4$—$(Ge_5)_3$, $(Ge_4C)_5$—$(Ge_5)_5$, $(Ge_4C)_4$—$(Si_5)_2$, $(Ge_4C)_2$—$(Ge_5)_3$, $(Ge_4C)_3$—$(Ge_5)_2$, $(Ge_4C)_3$—$(Ge_5)_4$, $(Ge_4C)_3$—$(Ge_5)_5$, $(Ge_4C)_4$—$(Ge_5)_3$, $(Ge_4C)_4$—$(Ge_5)_2$, $(Ge_4C)_5$—$(Ge_5)_2$, $(Ge_4C)_5$—$(Ge_5)_3$, $(Ge_4C)_6$—$(Ge_5)_2$, $(Ge_4C)_6$—$(Ge_5)_4$, $(Ge_4C)_7$—$(Ge_5)_3$, $(Ge_4C)_8$—$(Ge_5)_2$, $(Si_4C)_2$—$(Ge_5)_3$, $(Si_4C)_3$—$(Ge_5)_2$, $(Si_4C)_3$—$(Ge_5)_3$, and $(Si_5)_4$—$(Si_4C)_4$.

5. The system of claim 1, further comprising:
 a substrate having a surface covalently bonded to the superlattice.

6. The system of claim 5, wherein the surface is selected from a group consisting of the (100) surface of silicon, the (110) surface of silicon, the (111) surface of silicon, the (113) surface of silicon, the (115) surface of silicon, (100) surface of germanium, the (110) surface of germanium, the (111) surface of germanium, the (113) surface of germanium, the (115) surface of germanium.

7. The system of claim 1, wherein the superlattice cells are laterally adjacent to one another on a surface of a substrate.

8. The system of claim 1, wherein the superlattice has a conduction band minimum at the K or K' point of the Brillouin Zone.

9. The system of claim 1, wherein a transistor includes a source, a drain, and a channel, and
 the superlattice is included in one or more regions selected from the group consisting of the source, the drain, and the channel.

10. The system of claim 9, wherein the transistor is a Complementary Unipolar Tunnel MOSFET (CUTMOS) that can be operated either as an n-type tunneling transistor or as a p-type tunneling transistor.

11. A superlattice system, comprising:
 a superlattice cell repeated multiple times so as to form a superlattice, each superlattice cell having multiple atomic planes that are parallel to one another,
  at least two of the atomic planes in the superlattice cell have different chemical compositions and one or more of the atomic planes in the superlattice cell include carbon,
  the superlattice cell including a total number of atomic planes that is less than or equal to 40, and
 one or more of the one or more atomic planes that include carbon each also includes one or more elements selected from a group consisting of silicon, germanium, lead, and tin.

12. The system of claim 11, wherein the superlattice cells are laterally adjacent to one another on a surface of a substrate.

13. The system of claim 11, wherein the superlattice has a conduction band minimum at the K or K' point of the Brillouin Zone.

14. The system of claim 11, wherein the superlattice cells are each represented by a formula selected from a group consisting of $(Si_4C)_2$—$(Ge_5)_2$, $(Si_4C)_4$—$(Ge_5)_3$, $(Ge_4C)_5$—$(Ge_5)_5$, $(Ge_4C)_4$—$(Si_5)_2$, $(Ge_4C)_2$—$(Ge_5)_3$, $(Ge_4C)_3$—$(Ge_5)_2$, $(Ge_4C)_3$—$(Ge_5)_4$, $(Ge_4C)_3$—$(Ge_5)_5$, $(Ge_4C)_4$—$(Ge_5)_3$, $(Ge_4C)_4$—$(Ge_5)_2$, $(Ge_4C)_5$—$(Ge_5)_2$, $(Ge_4C)_5$—$(Ge_5)_3$, $(Ge_4C)_6$—$(Ge_5)_2$, $(Ge_4C)_6$—$(Ge_5)_4$, $(Ge_4C)_7$—$(Ge_5)_3$, $(Ge_4C)_8$—$(Ge_5)_2$, $(Si_4C)_2$—$(Ge_5)_3$, $(Si_4C)_3$—$(Ge_5)_2$, $(Si_4C)_3$—$(Ge_5)_3$, and $(Si_5)_4$—$(Si_4C)_4$.

15. The system of claim 11, wherein a transistor includes a source, a drain, and a channel, and
 the superlattice is included in one or more regions selected from the group consisting of the source, the drain, and the channel.

16. The system of claim 15, wherein the transistor is a Complementary Unipolar Tunnel MOSFET (CUTMOS) that can be operated either as an n-type tunneling transistor or as a p-type tunneling transistor.

17. A superlattice system, comprising:
 a superlattice cell repeated multiple times so as to form a superlattice, each superlattice cell having multiple atomic planes that are parallel to one another,
  at least two of the atomic planes in the superlattice cell have different chemical compositions and one or more of the atomic planes in the superlattice cell include carbon,
  the superlattice cell including a total number of atomic planes that is less than or equal to 40, and
  one or more of the one or more atomic planes that include carbon each has a chemical composition selected from a group consisting of $Si_4C$, $Ge_4C$, $Sn_4C$, $Si_6C_2$, $Ge_6C_2$, $Sn_6C_2$, $Si_2Sn_2C$, $Si_3SnC$, $Ge_2Sn_2C$, and $Ge_3SnC$.

18. The system of claim 17, wherein the superlattice cells are laterally adjacent to one another on a surface of a substrate.

19. The system of claim 17, wherein the superlattice has a conduction band minimum at the K or K' point of the Brillouin Zone.

20. The system of claim 17, wherein a transistor includes a source, a drain, and a channel, and
 the superlattice is included in one or more regions selected from the group consisting of the source, the drain, and the channel.

* * * * *

UNITED STATES PATENT AND TRADEMARK OFFICE
CERTIFICATE OF CORRECTION

PATENT NO. : 9,917,155 B2
APPLICATION NO. : 15/472229
DATED : March 13, 2018
INVENTOR(S) : Carlos Jorge R. P. Augusto Page 1 of 1

It is certified that error appears in the above-identified patent and that said Letters Patent is hereby corrected as shown below:

On the Title Page

(73) Assignee, please revise "Quantum Semiconductors LLC" to "Quantum Semiconductor LLC".

Signed and Sealed this
Fourteenth Day of August, 2018

Andrei Iancu
*Director of the United States Patent and Trademark Office*